US012635183B2

(12) United States Patent
Chung et al.

(10) Patent No.: US 12,635,183 B2
(45) Date of Patent: May 19, 2026

(54) SEMICONDUCTOR STRUCTURE INCLUDING DIFFERENT DEVICES AND METHODS FOR MANUFACTURING THE SAME

(71) Applicant: TAIWAN SEMICONDUCTOR MANUFACTURING COMPANY, LTD., Hsinchu (TW)

(72) Inventors: Cheng-Ting Chung, Hsinchu (TW); Yi-Bo Liao, Hsinchu (TW); Jin Cai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 399 days.

(21) Appl. No.: 18/339,076

(22) Filed: Jun. 21, 2023

(65) Prior Publication Data

US 2024/0429299 A1     Dec. 26, 2024

(51) Int. Cl.
| | |
|---|---|
| *H10D 30/67* | (2025.01) |
| *B82Y 10/00* | (2011.01) |
| *H10D 30/00* | (2025.01) |
| *H10D 30/01* | (2025.01) |
| *H10D 30/43* | (2025.01) |
| *H10D 62/10* | (2025.01) |
| *H10D 62/13* | (2025.01) |
| *H10D 64/01* | (2025.01) |
| *H10D 84/01* | (2026.01) |

(Continued)

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01); *H10D 62/151* (2025.01); *H10D 64/017* (2025.01); *H10D 84/0167* (2025.01); *H10D 84/017* (2025.01); *H10D 84/0188* (2025.01); *H10D 84/038* (2025.01); *H10D 84/85* (2025.01)

(58) Field of Classification Search
CPC .... H10D 30/6735; H10D 84/85; H10D 88/00; H10D 30/014; H10D 30/43; H10D 30/6757; H10D 62/151; H10D 30/019; H10D 30/501; H10D 84/8311; H10D 84/851; H10D 84/0188; H10D 84/017; H10D 84/856
See application file for complete search history.

(56) References Cited

U.S. PATENT DOCUMENTS

2024/0395814 A1* 11/2024 Sung .................... H10D 84/856

* cited by examiner

*Primary Examiner* — Sonya McCall-Shepard

(74) *Attorney, Agent, or Firm* — Birch, Stewart, Kolasch & Birch, LLP

(57)     ABSTRACT

A semiconductor structure includes a substrate, a first device unit and a second device unit. The substrate includes a first region and a second region. The first device unit is disposed on the first region, and includes a plurality of first channel portions and two first source/drain portions. The second device unit is disposed on the second region, and includes a lower device and an upper device. The lower device is disposed on the second region, and includes at least one lower channel portion and two lower source/drain portions. The upper device is disposed above and spaced apart from the lower device, and includes at least one upper channel portion and two upper source/drain portions. A number of the first channel portions is greater than a number of the at least one lower channel portion and greater than a number of the at least one upper channel portion.

20 Claims, 35 Drawing Sheets

(51) Int. Cl.
|  |  |
|---|---|
| *H10D 84/03* | (2025.01) |
| *H10D 84/83* | (2025.01) |
| *H10D 84/85* | (2025.01) |
| *H10D 88/00* | (2026.01) |

10

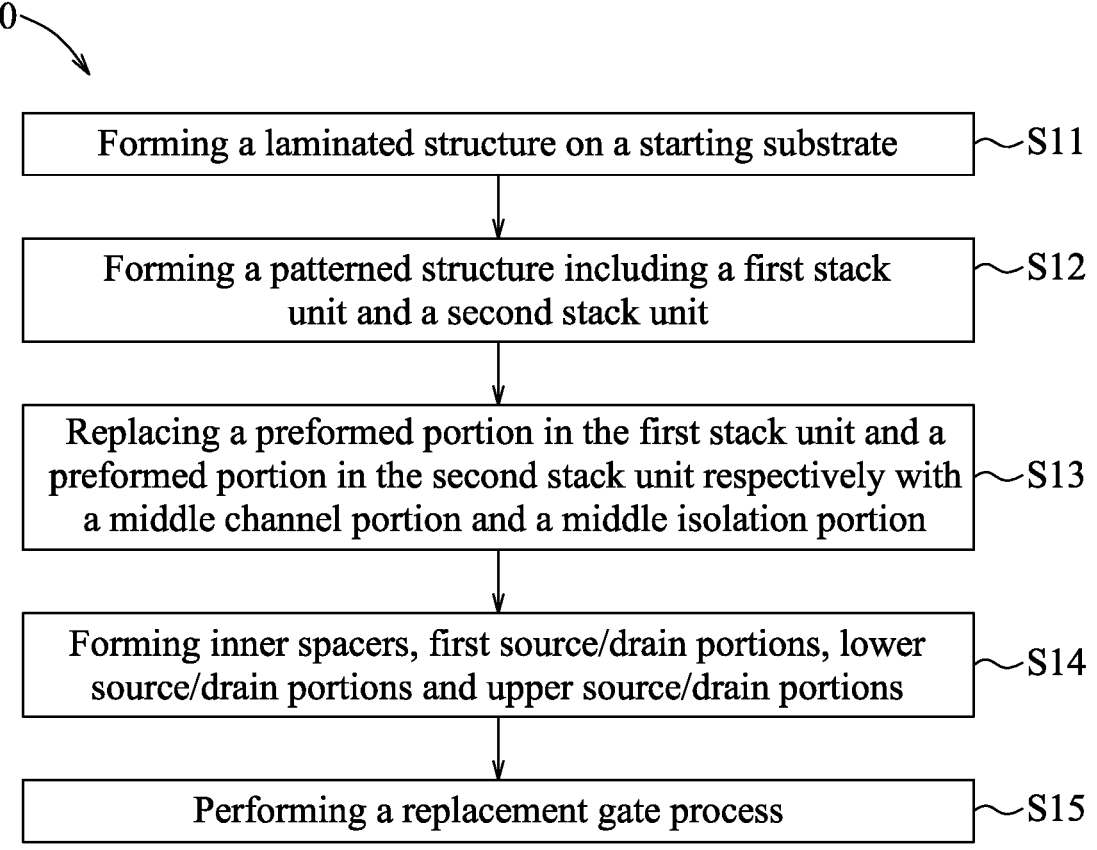

| Forming a laminated structure on a starting substrate | S11 |

↓

| Forming a patterned structure including a first stack unit and a second stack unit | S12 |

↓

| Replacing a preformed portion in the first stack unit and a preformed portion in the second stack unit respectively with a middle channel portion and a middle isolation portion | S13 |

↓

| Forming inner spacers, first source/drain portions, lower source/drain portions and upper source/drain portions | S14 |

↓

| Performing a replacement gate process | S15 |

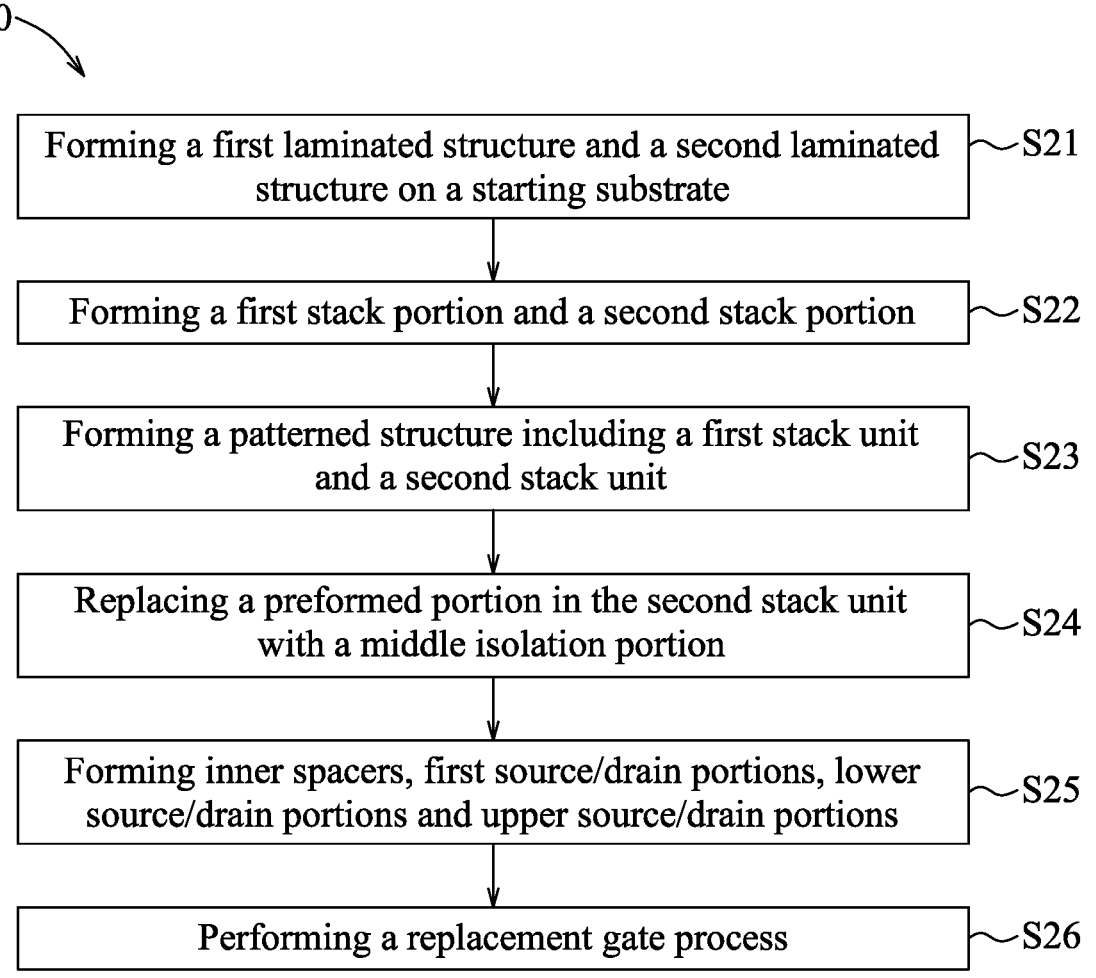

20

| Forming a first laminated structure and a second laminated structure on a starting substrate | ～S21 |

| Forming a first stack portion and a second stack portion | ～S22 |

| Forming a patterned structure including a first stack unit and a second stack unit | ～S23 |

| Replacing a preformed portion in the second stack unit with a middle isolation portion | ～S24 |

| Forming inner spacers, first source/drain portions, lower source/drain portions and upper source/drain portions | ～S25 |

| Performing a replacement gate process | ～S26 |

SEMICONDUCTOR STRUCTURE INCLUDING DIFFERENT DEVICES AND METHODS FOR MANUFACTURING THE SAME

BACKGROUND

Complementary field-effect transistors (CFETs) can be formed by stacking the transistors in a top and bottom manner, so as to achieve a relatively higher transistor density. As such, CFETs are promising candidates in the manufacture of semiconductor devices with improved performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow diagram illustrating a method for manufacturing a semiconductor structure in accordance with some embodiments.

FIG. 27 is a flow diagram illustrating another method for manufacturing a semiconductor structure in accordance with some embodiments.

DETAILED DESCRIPTION

Figures 2, 3:
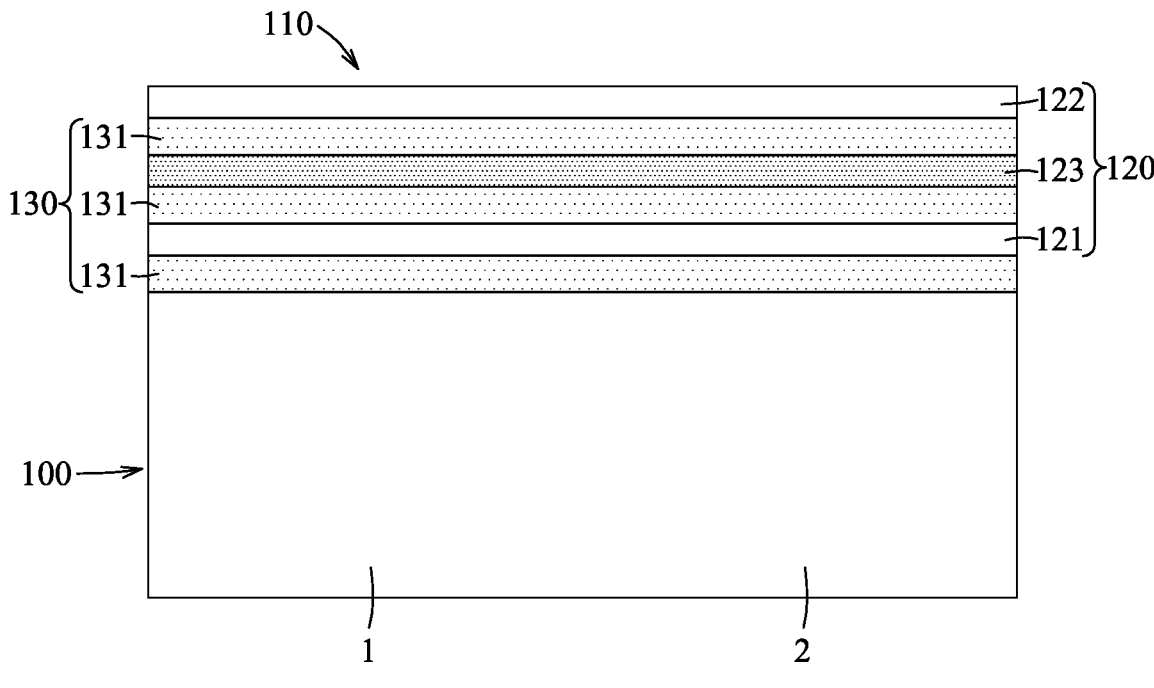
FIGS. 2 to 26 illustrate schematic views of intermediate stages of the method depicted in FIG. 1 in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

The term "source/drain portion(s)" may refer to a source or a drain, individually or collectively dependent upon the context.

Critical dimension (CD) of transistors continues to shrink and various three-dimensional (3D) transistor structures (e.g., a gate-all-around field-effect transistor (GAAFET) structure, a forksheet field-effect transistor structure, a complementary field-effect transistor (CFET) structure including stacked transistors, etc.) are developed for manufacturing integrated circuit (IC) with a high integration density, and the CFET structure is a promising candidate in advanced logic IC technology among the 3D transistor structures as mentioned above. This is because, for some logic cells which are designed to have a plurality of devices with different conductivity types, a high integration density can be achieved by stacking an array of top devices on an array of bottom devices which have conductivity type different from that of the top devices. In practice, for some peripheral logic cells (for example, but not limited to, power switch, header switch, footer switch, etc.) which are designed to have a plurality of devices (or unipolar devices) with a single conductivity type, the CFET structure may be less attractive for such peripheral logic cells, because one or more additional photolithography processes may be required to be performed such that the top and bottom devices have the same conductivity type.

Therefore, the present disclosure is directed to a semiconductor structure including a CFET region for forming stacked devices thereon and a unipolar region for forming non-stacked devices (or unipolar devices) thereon, and streamlined approaches for manufacturing the same. The semiconductor structure may be applied to fin-type FETs (FinFETs), multi-gate FETs (e.g., GAAFETs), multi-bridge channel FETs (MBCFETs), fork-sheet FETs, etc.), memory cells, inverters, or other suitable devices or applications. In some embodiments, the semiconductor structure may be exemplified as a semiconductor structure 70 (see FIG. 24) which includes a first device unit 71 formed on a first region (e.g., a unipolar region) 1, and a second device unit 72 formed on a second region (e.g., a CFET region) 2. The first and second device units 71, 72 formed on the same substrate (e.g., the same wafer) and have different configurations. In some embodiments, the first device unit 71 has a GAAFET structure and the second device unit 72 is a CFET structure.

The first device unit 71 includes two first source/drain portions 310 and first channel portions 122B, 124, 121B at the unipolar region 1. The second device unit 72 includes a lower device 721 and an upper device 722 which is separated from the lower device 721 through isolation features 410 and a middle isolation portion 125. The lower device 721 includes two lower source/drain portions 321 and a lower channel portion 121B at the CFET region 2. The upper device 722 includes two upper source/drain portions 322 and an upper channel portion 122B at the CFET region 2.

FIG. 1 is a flow diagram illustrating a method 10 for manufacturing the semiconductor structure (for example, the semiconductor structure 70 shown in FIG. 24) in accordance with some embodiments. FIGS. 2 to 26 illustrate schematic views of intermediate stages of the method 10 in accordance with some embodiments. Some repeating structures are omitted in FIGS. 2 to 26 for the sake of brevity.

Referring to FIG. 1 and the example illustrated in FIG. 2, the method 10 begins at step S11, where a laminated structure 110 is formed on a starting substrate 100.

Figure 4:
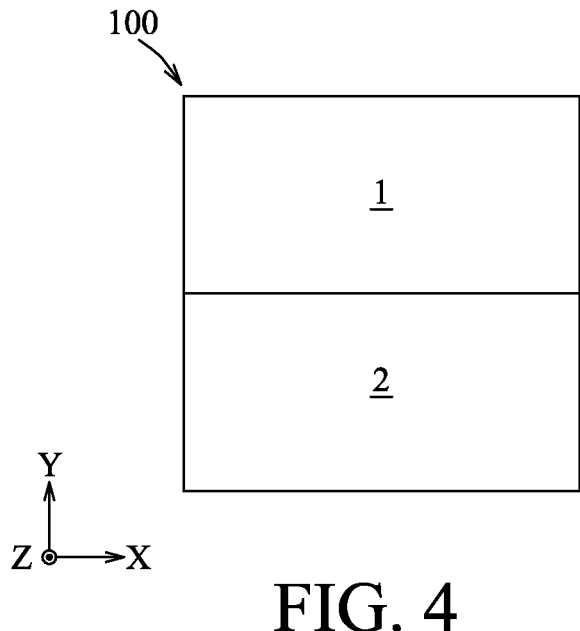
Figure 5:
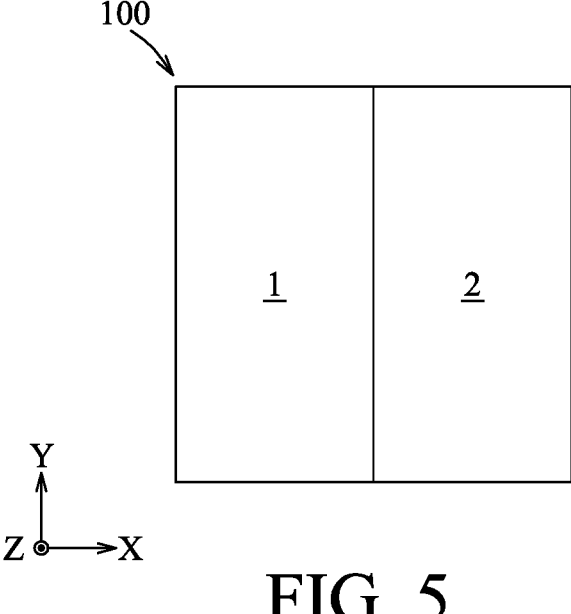

In some embodiments, the starting substrate 100 may be made of elemental semiconductor materials, such as crystalline silicon, diamond, or germanium; compound semiconductor materials, such as silicon carbide, gallium arsenide, indium arsenide, or indium phosphide; or alloy semiconductor materials, such as silicon germanium, silicon germanium carbide, gallium arsenide phosphide, or gallium indium phosphide. In addition, the starting substrate 100 may be a bulk silicon substrate, a silicon-on-insulator (SOI) substrate, or a germanium-on-insulator (GOI) substrate. Other suitable materials for the starting substrate 100 are within the contemplated scope of the present disclosure. In some embodiments, the starting substrate 100 includes a first region (e.g., a unipolar region) 1 and a second region (e.g., a CFET region) 2 which is displaced from the unipolar region 1. FIGS. 3 to 5 are each a schematic top view of the structure shown in FIG. 2 in accordance with different embodiments, in which the unipolar and CFET regions 1, 2 of the starting substrate 100 are shown and other elements are omitted. In some embodiments, the unipolar and CFET regions 1, 2 are displaced from each other in an X direction and/or a Y direction which is transverse to the X direction. In the following embodiments exemplified by FIGS. 6 to 26, the first device unit 71 at the unipolar region 1 and the second device unit 72 at the CFET region 2 are formed on a single fin structure using the method 10, whilst in some other embodiments not shown, the first device unit 71 at the unipolar region 1 and the second device unit 72 at the CFET region 2 may be formed on different fin structures using the method 10.

In some embodiments, the laminated structure 110 is formed to cover the unipolar and CFET regions 1, 2 of the starting substrate 100. The laminated structure 110 includes a first set of layers 120 and a second set of layers 130. The first set of layers 120 include at least one lower channel layer 121, at least one upper channel layer 122, and a preformed layer 123 which is disposed between and spaced apart from the at least one lower channel layer 121 and the at least one upper channel layer 122. The second set of layers 130 include at least three sacrificial layers 131, and are disposed to alternate with the first set of layers 120 (i.e., the layers 121, 122, 123) in a Z direction which is transverse to both the X and Y directions. A bottommost one of the at least three sacrificial layers 131 is disposed on the starting substrate 100. In some embodiments, the X, Y and Z directions are perpendicular to one another. As shown in FIG. 2, each of a number (N1) of the at least one lower channel layer 121 and a number (N2) of the at least one upper channel layer 122 is one, and a number (N3) of the at least three sacrificial layers 131 is three. The number (N3) may vary according to the numbers (N2, N3) (i.e., a sum number (N1+N2+1) of the layers 121, 122, 123 in the first set of layers 120 is equal to the number (N3) of the layers 131 in the second set of layers 130). It is noted that each of the numbers (N1. N2, N3) is not limited to the number shown in the drawings, and may vary according to practical applications. For example, in some not shown embodiments, each of the numbers (N1, N2) may be designed to be two, three or four, independently.

In some embodiments, the laminated structure 110 is a stack of semiconductor materials. Semiconductor materials suitable for forming the layers 121, 122, 123, 131 are similar to those for the starting substrate 100, and thus details thereof are omitted for the sake of brevity. In some embodiments, the laminated structure 110 may be formed on the starting substrate 100 by chemical vapor deposition (CVD), atomic layer deposition (ALD), an epitaxial growth process (such as molecular-beam epitaxy (MBE), selective area epitaxy (SEG), etc.), or other suitable deposition techniques.

In some embodiments, the lower and upper channel layers 121, 122 are made of a first semiconductor material, the sacrificial layers 131 are made of a second semiconductor material, and the preformed layer 123 is made of a third semiconductor material. It is noted that the first, second and third semiconductor materials have different chemical compositions from one another, and thus the first, second and third semiconductor materials have different etching selectivity ratios from one another. Thus, by selecting a suitable etchant, any one of the third semiconductor material of the preformed layer 123 and the second semiconductor material of the sacrificial layers 131 can be selectively removed with respect to the semiconductor materials of the other layers in subsequent processes. In some embodiments, the lower channel layer 121 may be made of a semiconductor material the same as or different from that of the upper channel layer 122, and hence the transport behavior of major carriers (i.e., holes or electrons) therein may be further adjusted. In some embodiments, each of the semiconductor materials of the lower and upper channel layers 121, 122 may be the same as or different from that of the starting substrate 100.

In certain embodiments, each of the starting substrate 100 and the lower and upper channel layers 121, 122 is made of silicon. Each of the preformed layer 123 and the sacrificial layers 131 is made of silicon germanium, while the preformed layer 123 has an atomic percentage of germanium different from (e.g., greater than) an atomic percentage of germanium in each of the sacrificial layers 131. In some embodiments, the atomic percentage of germanium in each of the sacrificial layers 131 ranges from about 10% to about 30%. In some embodiments, the atomic percentage of germanium in the preformed layer 123 ranges from about 20% to about 60%. Other materials and combinations thereof suitable for the laminated structure 110 are within the contemplated scope of the present disclosure.

In some embodiments, the lower and upper channel layers 121, 122 may have the same or different thicknesses in the Z direction. In some embodiments, the sacrificial layers 131 may have the same as or different thicknesses in the Z direction. In some embodiments, as shown in FIG. 2, a thickness of the preformed layer 123 is substantially equal to that of at least one of the lower and upper channel layers 121, 122. In some embodiments, the thickness of each of the lower and upper channel layers 121, 122 may range from about 3 nm to about 8 nm. In some embodiments, the thickness of each of the sacrificial layers 131 may range from about 5 nm to about 23 nm. In some embodiments, the thickness of the preformed layer 123 may range from about 3 nm to about 8 nm. It is noted that, in some other embodiments, the thickness of the preformed layer 123 may be greater than that of each of the lower and upper channel layers 121, 122, and will be detailed described in FIGS. 27 to 46.

Figure 8:
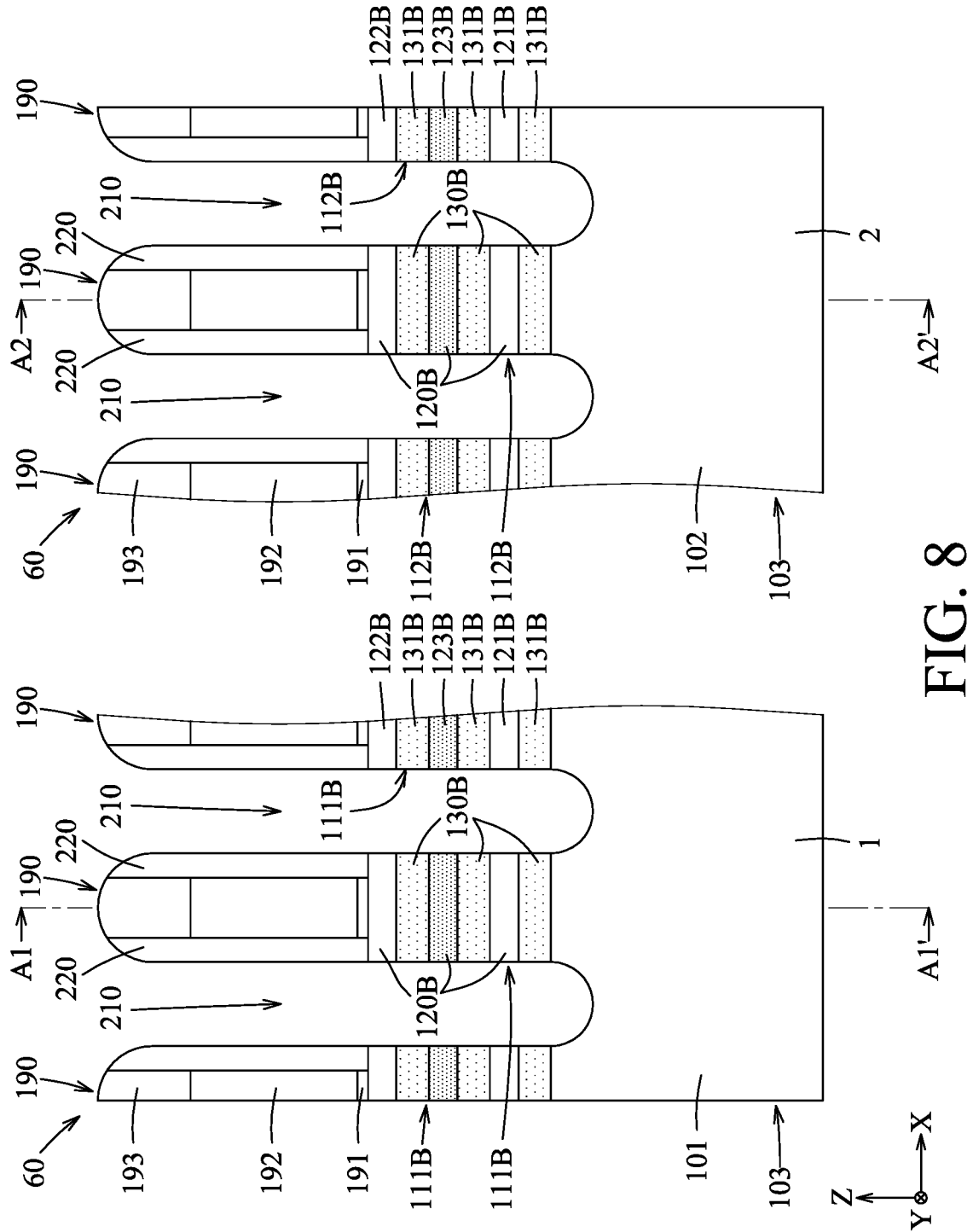
Figure 9:
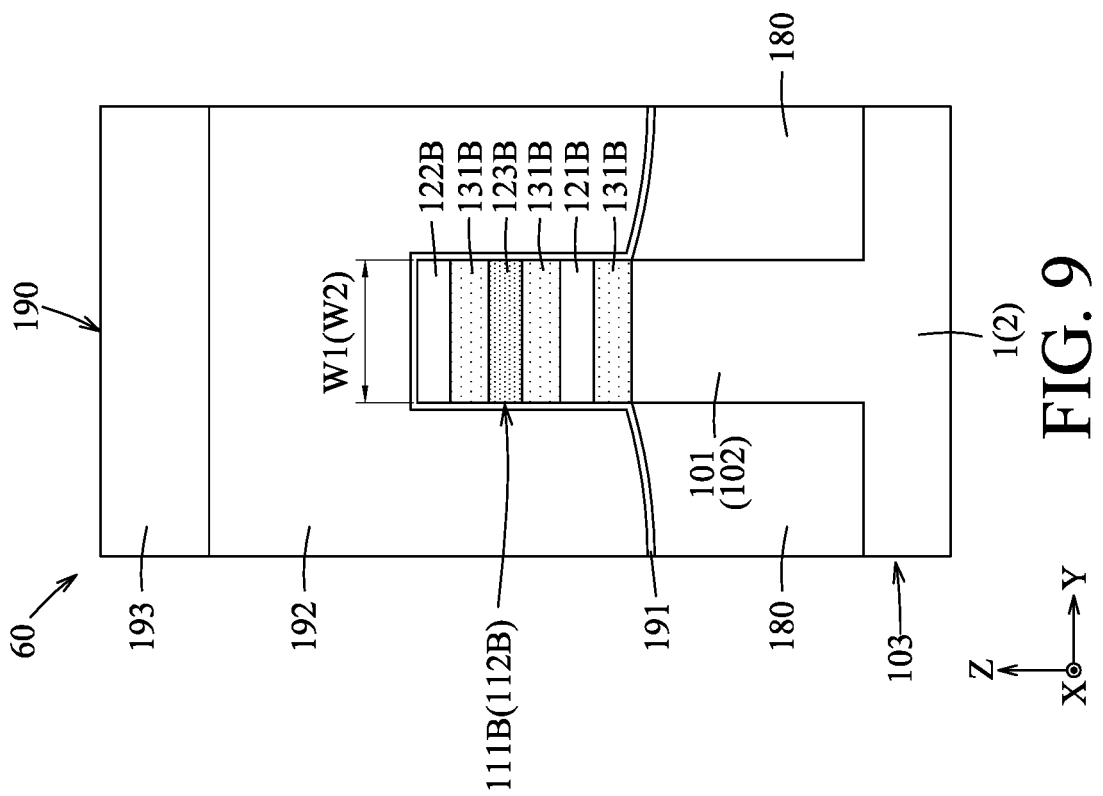

Referring to FIG. 1 and the examples illustrated in FIGS. 8 and 9, the method 10 proceeds to step S12, where a patterned structure 60 is formed from the structure shown in FIG. 2. FIG. 8 is a schematic cross-sectional view of the patterned structure 60 taken in the X direction in accordance with some embodiments. FIG. 9 is a schematic cross-sectional view of the patterned structure 60 taken along line A1-A1' or line A2-A2' of FIG. 8 in accordance with some embodiments. It is noted that, in some embodiments, FIG. 9 may present the patterned structure 60 at the unipolar region 1 or the CFET region 2 since the patterned structure 60 at the unipolar and CFET regions 1, 2 may have substantially the same cross-section in the Y direction.

The patterned structure 60 is formed from patterning the laminated structure 110 and the starting substrate 100 shown in FIG. 2, and includes a semiconductor substrate 103, at least one first fin portion 101, at least one second fin portion 102, at least one first stack unit 111B, and at least one second stack unit 112B.

After step S12, the stating substrate 100 is patterned into the semiconductor substrate 103 and the first and second fin portions 101, 102. The semiconductor substrate 103 includes a unipolar region 1 and a CFET region 2 which are respectively corresponding to the unipolar region 1 and the CFET region 2 of the starting substrate 100, and which are thus respectively denoted by the same numerals for the sake of brevity. The first and second fin portions 101, 102 are respectively formed on the unipolar region 1 and the CFET region 2. In some embodiments, as exemplified by FIG. 8, the first and second fin portions 101, 102 may be formed on a single fin structure and are displaced from each other in the X direction (i.e., the unipolar region 1 and the CFET region 2 are displaced from each other in the X direction, see also FIG. 3 or 5). In some other embodiments not shown, the first and second fin portions 101, 102 are formed at two different fin structures and are spaced apart from each other in the Y direction (i.e., the unipolar and CFET regions 1, 2 are displaced from each other in the Y direction, see FIG. 4), In this case, the first fin portion 101 in one of the fin structures may be formed over the unipolar region 1, and the second fin portion 102 in the other one of the fin structures may be formed over the CFET region 2.

After step S12, the laminated structure 110 is patterned into the at least one first stack unit 111B and the at least one second stack unit 112B are respectively disposed on the first and second fin portions 101, 102. In some embodiments, as shown in FIGS. 8 and 9, three of the first stack units 111B are displaced from each other in the X direction and disposed on the first fin portion 101 at the unipolar region 1, and three of the second stack units 112B are displaced from each other in the X direction and disposed on the second fin portion 102 at the CFET region 2. It is noted that the number of each of the elements 101, 102, 111B, 112B is not limited to the number shown in the drawings, and may vary according to practical applications. In the following, for the sake of brevity, each of the elements 101, 102, 111B, 112B is described in a singular form, the first stack unit 111B refers to a middle one of those shown in FIG. 8, and the second stack unit 112B refers to a middle one of those shown in FIG. 8.

Each of the first and second stack units 111B, 112B includes a first set of portions 120B and a second set of portions 130B. The first set of portions 120B include a lower channel portion 121B, an upper channel portion 122B and a preformed portion 123B which are respectively patterned from the lower channel layer 121, the upper channel layer 122 and the preformed layer 123. The preformed portion 123B is disposed between and spaced apart from the lower and upper channel portions 121B, 122B. The second set of portions 130B include three of sacrificial portions 131B which are respectively patterned from the sacrificial layers 131. The sacrificial portions 131B are disposed to alternative with the first set of portions 120B (i.e., the portions 121B, 122B, 123B). A bottommost one of the sacrificial portions 131B is disposed on a corresponding one of the first and second fin portions 101, 102. In some embodiments, as shown in FIG. 9, the lower and upper channel portions 121B, 122B in the first stack unit 111B has a first width (W1) in the Y direction, and the lower and upper channel portions 121B, 122B in the second stack unit 111B has a second width (W2) in the Y direction. The first width (W1) may be the same as or different from the second width (W2). In some embodiments, each of the first width (W1) and the second width (W2) may independently range from about 5 nm to about 80 nm.

In some embodiments, the patterned structure 60 further includes multiple pairs of isolation regions 180 (a pair of the isolation regions 180 are shown in FIG. 9), a plurality of dummy gate portions 190, multiple pairs of dummy gate spacers 220, and multiple pairs of source/drain recesses 210. In the following, for sake of brevity, the dummy gate portions 190 refer to a middle one of the dummy gate portions 190 at the unipolar region 1 and a middle one of the dummy gate portions 190 at the CFET region 2 (see FIG. 8), and the multiple pairs of the dummy gate spacers 220 refer to a middle pair of the dummy gate spacers 220 at the unipolar region 1 and a middle pair of the dummy gate spacers 220 at the CFET region 2.

The isolation regions 180 are disposed at two opposite sides of a corresponding one of the first and second fin portions 101, 102 (see FIG. 9). In some embodiments, the isolation regions 180 are provided for isolating the first fin portion 101 or the second fin portion 102 from the structure adjacent thereto. The isolation regions 180 may each be a portion of a shallow trench isolation (STI), a deep trench isolation (DTI), or other suitable structures, and may be made of a dielectric material, such as an oxide material (for example, silicon oxide), a nitride material (for example, silicon nitride), or a combination thereof. Other suitable materials and/or configurations for the isolation regions 180 are within the contemplated scope of the present disclosure.

In some embodiments, the dummy gate portions 190 are each elongated in the Y direction, and disposed over the first and second stack unit 111B, 112B, respectively. In some embodiments, each of the dummy gate portions 190 may include a dummy gate dielectric layer 191, a dummy gate electrode layer 192 and a hard mask layer 193 sequentially formed over a corresponding one of the first and second stack units 111B, 112B in such order. In some embodiments, the hard mask layer 193 may include silicon nitride, silicon oxide, silicon oxynitride, other suitable dielectric materials, or combinations thereof, the dummy gate electrode layer 192 may include polycrystalline silicon, single crystalline silicon, amorphous silicon, or combinations thereof, and the dummy gate dielectric layer 191 may include silicon oxide, silicon nitride, silicon oxynitride, high dielectric constant (k) materials, other suitable dielectric materials, or combinations thereof. Other suitable materials for the dummy gate portions 190 are within the contemplated scope of the present disclosure. In some embodiments, each of the dummy gate portions 190 is further formed over the corresponding isolation regions 180.

Each pair of the gate spacers 220 are respectively formed at two opposite sides of a corresponding one of the dummy gate portions 190 in the X direction. In some embodiments, the gate spacers 220 may be made of a dielectric material. The dielectric material for forming the gate spacers 220 may include a nitride-based material, such as silicon nitride, silicon oxynitride, silicon carbon nitride, silicon oxycarbonnitride, but is not limited thereto. Other materials suitable for forming the gate spacers 220 are within the contemplated scope of the present disclosure.

Each pair of the source/drain recesses 210 are disposed at two opposite sides of a corresponding one of the first and second stack units 111B, 112B (or a corresponding one of the dummy gate portions 190) in the X direction, such that two opposite end surfaces of the corresponding one of the first and second stack units 111B, 112B are exposed therefrom. In some embodiments, each of the source/drain recesses 210 may extend into an upper part of a corresponding one of the first and second fin portions 101, 102.

Figures 6, 7:
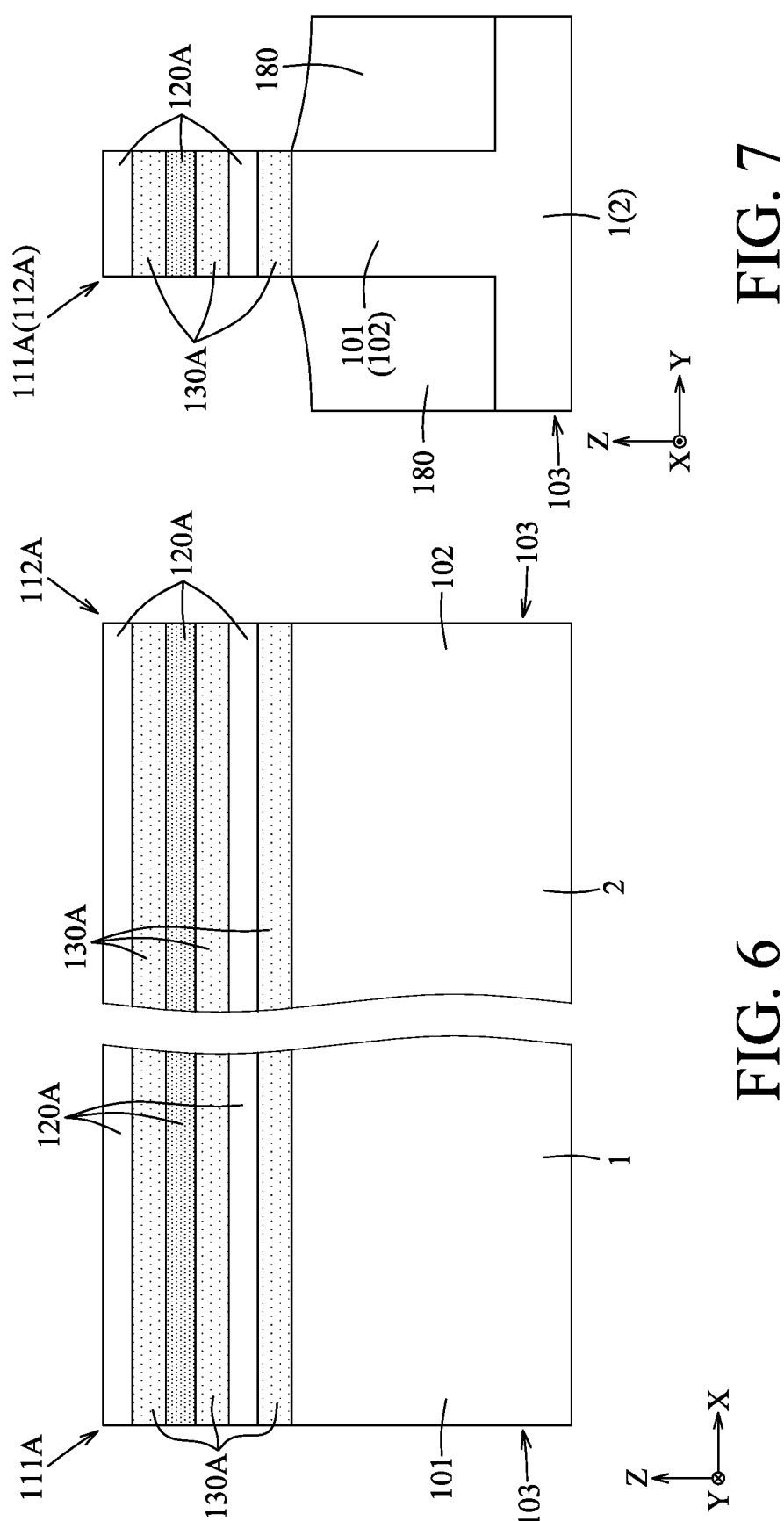

FIGS. 6 and 7 are views respectively similar to those of FIGS. 8 and 9, but illustrating the structures in an intermediate stage of step S12. In some embodiments, step S12 for forming the patterned structure 60 shown in FIGS. 8 and 9 may be formed by following sub-steps (i) to (v). In sub-step (i) of step S12, the starting substrate 100 is patterned into the semiconductor substrate 103 and the first and second fin portions 101, 102, and the laminated structure 110 is patterned into a first stack portion 111A and a second stack portion 112A (see FIGS. 6 and 7) respectively disposed on the first and second fin portions 101, 102, Each of the first and second stack portions 111A, 112A includes a first set of films 120A which are patterned from the first set of layers 120 and a second set of films 130A which are patterned from the second set of layers 130, and which are disposed to alternate with the first set of films 120A. In sub-step (ii) of step S12, the isolation regions 180 are formed respectively at the two opposite sides of the corresponding one of the first and second fin portions 101, 102 (see FIG. 7). In sub-step (iii) of step S12, the dummy gate portions 190 are respectively over the first and second stack portions 111A, 112A (see FIG. 6). In sub-step (iv) of step S12, each pair of the dummy gate spacers 220 are respectively formed at the two opposite sides of the corresponding one of the dummy gate portions 190 (see FIG. 8). In sub-step (v) of step S12, the first and second stack portions 111A, 112A are patterned to form the source/drain recesses 210 (see FIG. 8) such that the first and second stack portions 111A, 112A (see FIG. 6) are respectively formed into the first and second stack units 111B. 112B and such that each pair of the source/drain recesses 210 are respectively disposed at the two opposite sides of the corresponding one of the first and second stack units 111B, 112B. That is, the first and second stack units 111B, 112B may be patterned from the laminated structure 110 through two of the patterning processes (i.e., sub-steps (i) and (v) of step S12) in accordance with some embodiments as described above, but is not limited thereto. Other suitable process flows for forming the patterned structure 60 are within the contemplated scope of the present disclosure.

Figure 18:
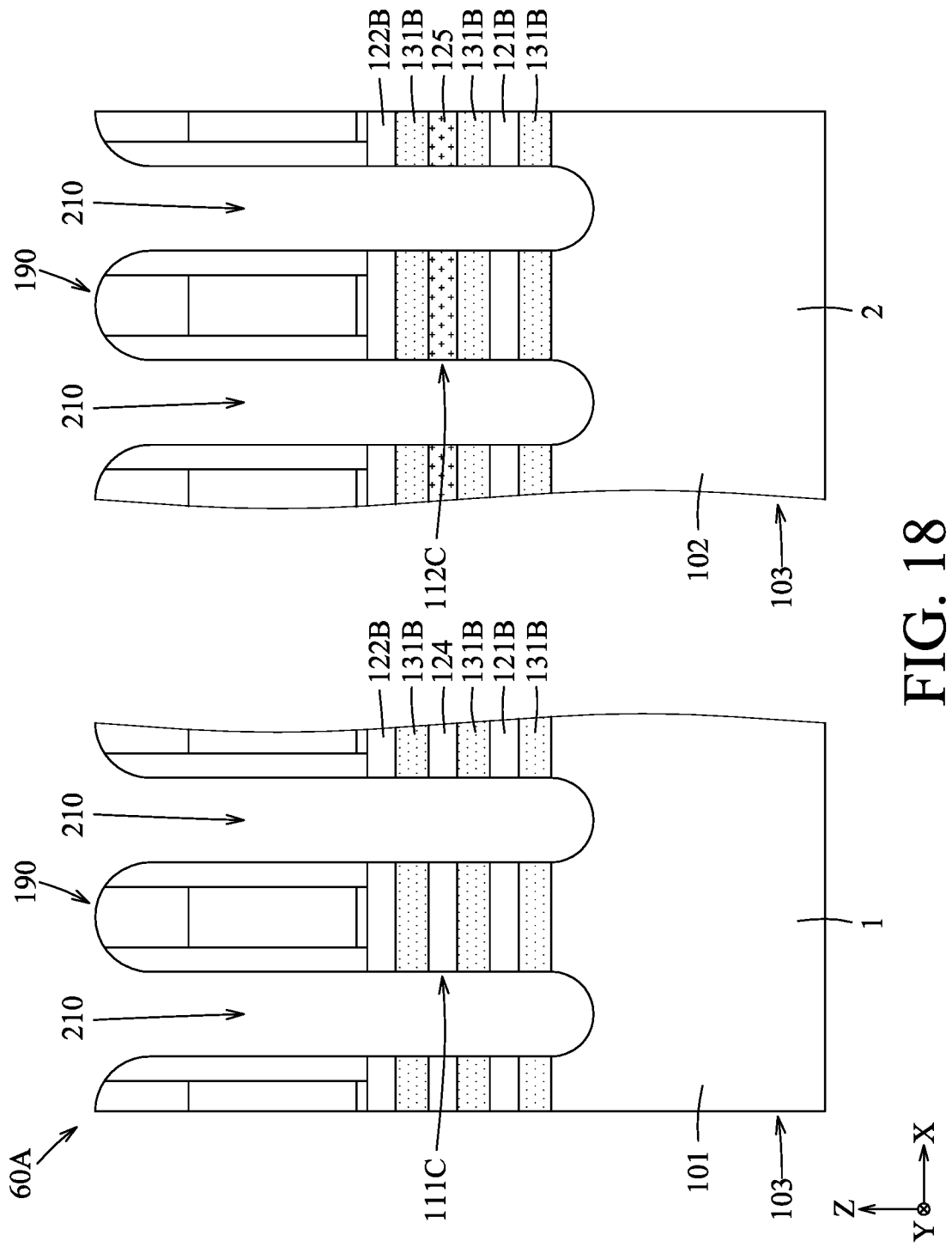

Referring to FIG. 1 and the examples illustrated in FIG. 18, the method 10 proceeds to step S13, where the preformed portions 123B in the first and second stack units 111B, 112B (see FIG. 8) are respectively replaced with a middle channel portion 124 and a middle isolation portion 125. FIG. 18 is a view subsequent to FIG. 8 for illustrating the structure after step S13.

In some embodiments, step S13 may include sub-steps (i) to (iv), where the replacement process of the preformed portion 123B in the first stack unit 111B is performed after the replacement process of the preformed portion 123B in the second stack unit 112B. In some alternative embodiments, the replacement process of the preformed portion 123B in the first stack unit 111B may be performed before the replacement process of the preformed portion 123B in the second stack unit 112B.

Figure 10:
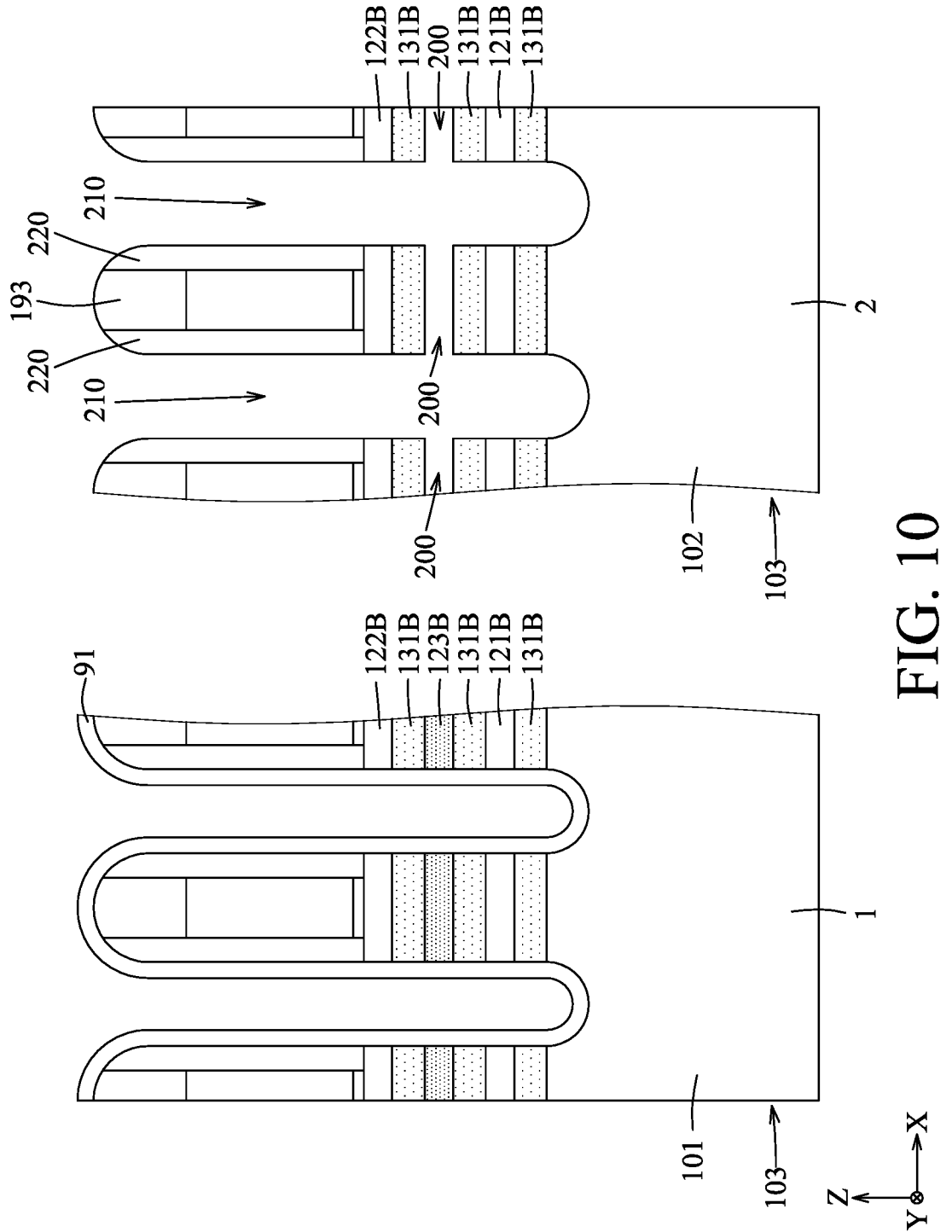
Figure 12:
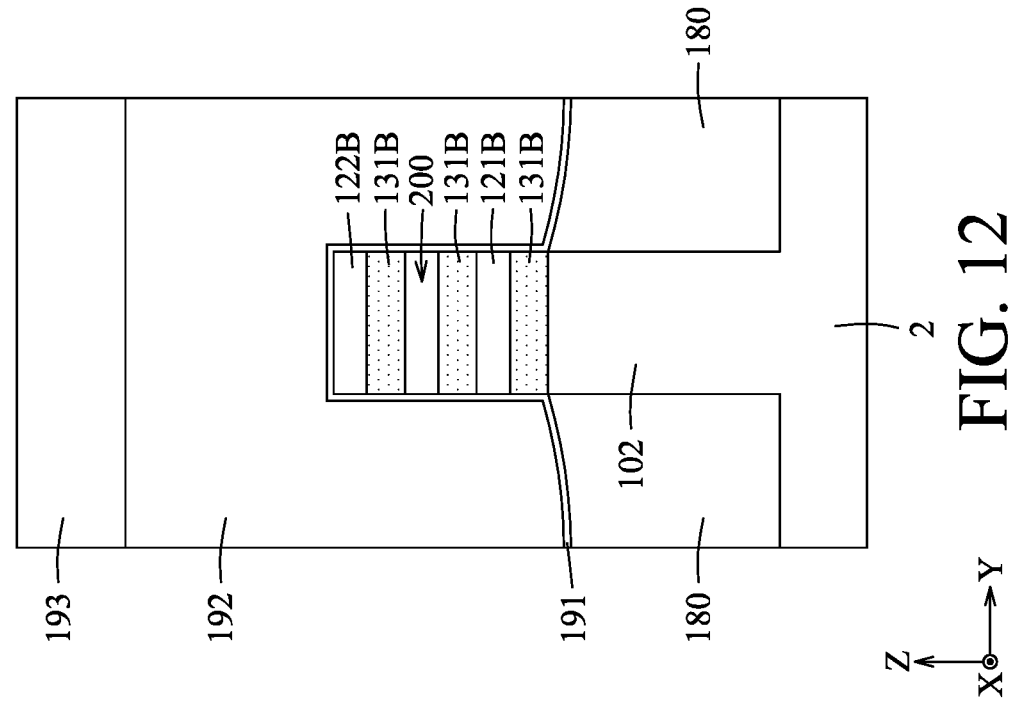
Figure 11:
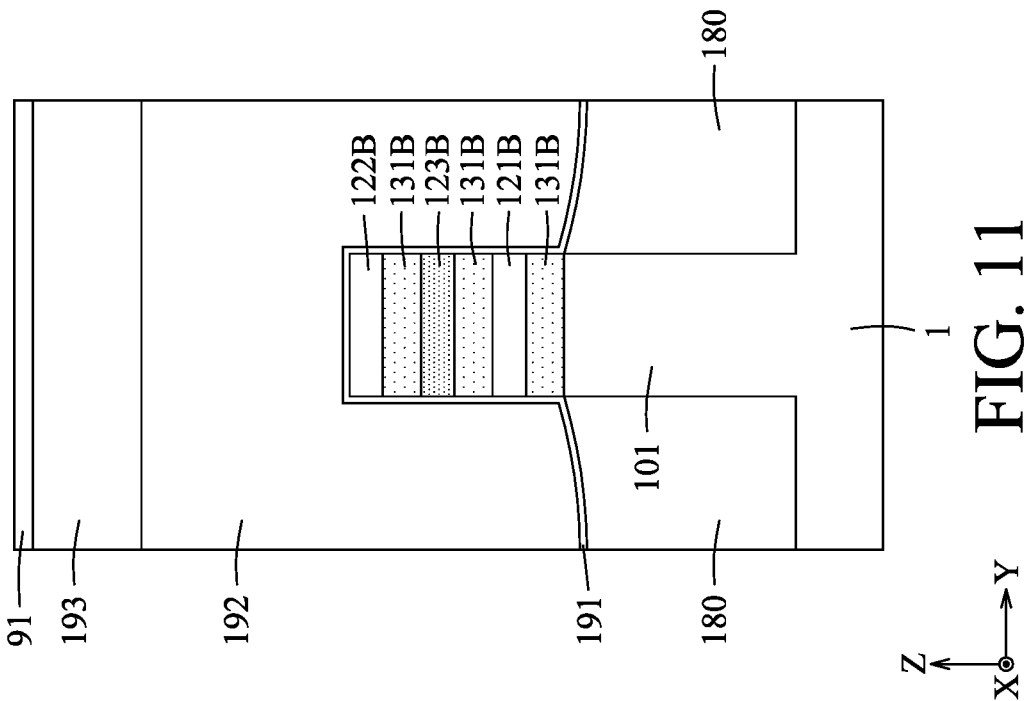

FIG. 10 is a view subsequent to FIG. 8 for illustrating the structure after sub-step (i) of S13. FIGS. 11 and 12 are views subsequent to FIG. 9 and respectively illustrate the structures at the unipolar region 1 and the CFET region 2 after sub-step (i) of S13. In sub-step (i) of step S13, a patterned mask 91 (see FIGS. 10 and 11) is formed to cover the structure at the unipolar region 1 obtained after step S12 using CVD, ALD, or other suitable deposition techniques, followed by a photolithography process, and then the preformed portion 123B in the second stack unit 112B (see FIGS. 8 and 9) is removed to form a first gap 200 (see FIGS. 10 and 12) by a selective etching process with the use of etchant(s) having high etching selectivity to the preformed portion 123B and thus the other layers 121B, 122B, 131B in the second stack unit 112B are substantially intact. In some embodiments, the selective etching process may include dry etching, wet etching, other suitable etching techniques, or combinations thereof. In some embodiments, the etchant(s) may be gas-phase, liquid-phase, or other suitable states.

In some embodiments, the patterned mask 91 may include an oxide, a nitride, a carbide, an oxynitride, an oxycarbide, a carbonitride, an oxycarbonitride, or combinations thereof. In some embodiments, the patterned mask 91 may be made of silicon oxide, silicon nitride, aluminum oxide, aluminum nitride, titanium nitride, but is not limited thereto. Other dielectric materials suitable for forming the patterned mask 91 are within the contemplated scope of the present disclosure. In some embodiments, the dielectric material(s) of the patterned mask 91 may be different from the dielectric material(s) of the elements 193, 220, and may be different from dielectric material(s) of the middle isolation portion 125 to be formed subsequently.

Figure 13:
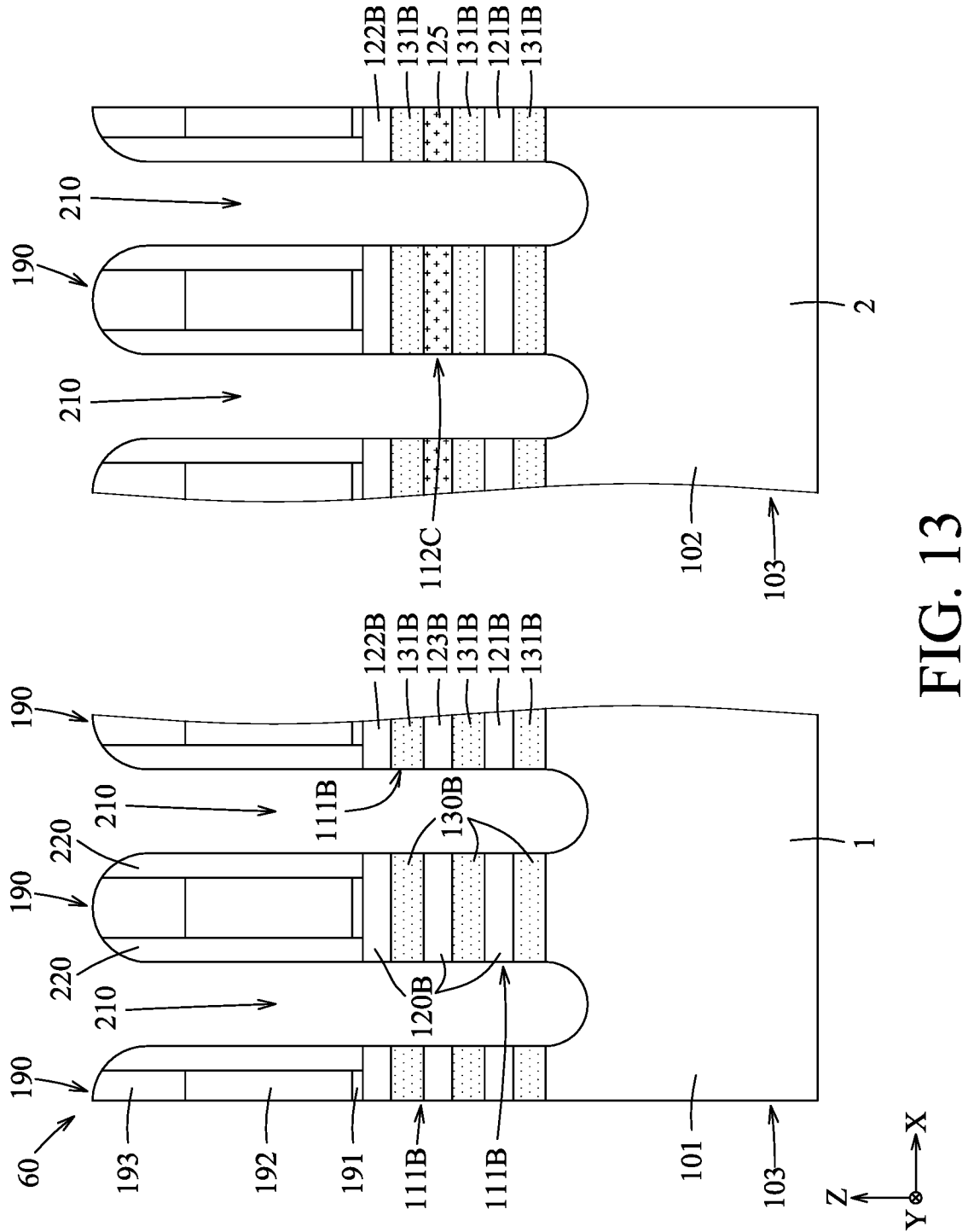
Figure 14:
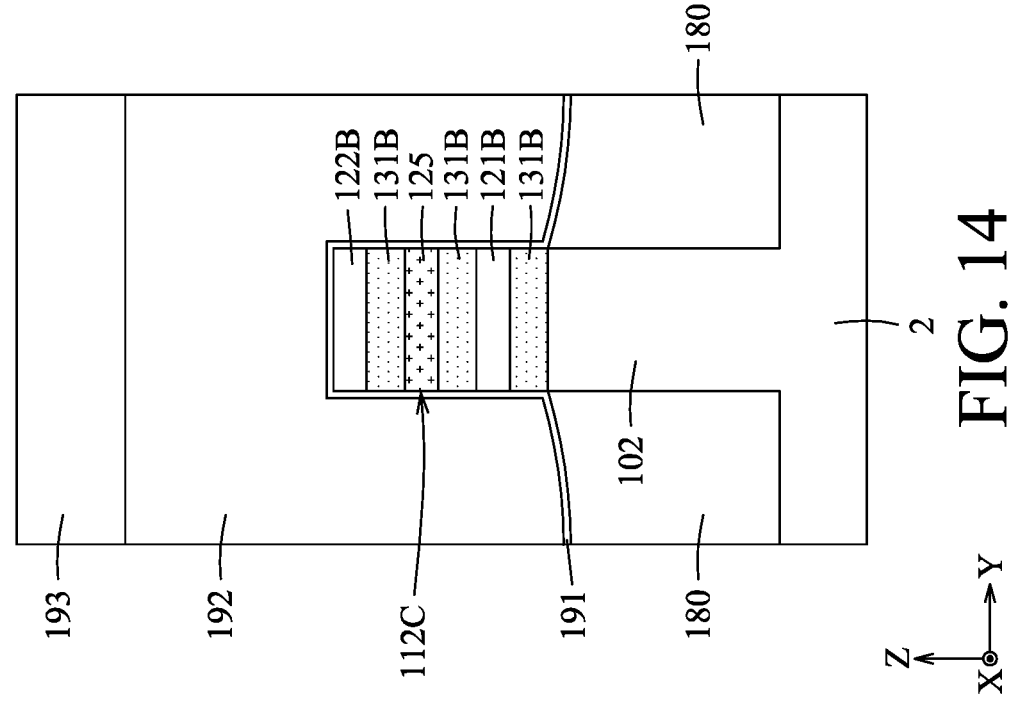

FIGS. 13 and 14 are views respectively subsequent to FIGS. 10 and 12 for illustrating the structure after sub-step (ii) of S13. In sub-step (ii) of step S13, the middle isolation portion 125 is formed in the first gap 200 (see FIGS. 10 and 12), and then the patterned mask 91 (see FIGS. 10 and 11) is removed.

In some embodiments, the middle isolation portion 125 may include dielectric material(s), such as silicon oxide, silicon nitride, silicon oxynitride, silicon carbon nitride, silicon oxycarbonitride, silicon oxycarbide, silicon carbide, aluminum oxide, hafnium oxide, zirconium oxide, or combinations thereof. In some embodiments, the middle isolation portion 125 may be formed as a single layer structure, a bi-layered structure or a multi-layered structure. Other dielectric materials and configurations suitable for the middle isolation portion 125 are within the contemplated scope of the present disclosure. In some embodiments, sub-step (ii) of S13 may include (a) depositing the dielectric material(s) (not shown) for forming the middle isolation portion 125 on the structures obtained after sub-step (i) of S13 (see FIGS. 10 to 12) to fill the first gap 200 by CVD, ALD, or other suitable deposition techniques, (b) removing excess portions of the dielectric material(s) for forming the middle isolation portion 125 by a suitable etching process, so as to form the middle isolation portion 125 in the first gap 200 (see FIGS. 13 and 14), and (c) removing the patterned mask 91 (see FIGS. 10 and 11) by a suitable etching process.

Figure 15:
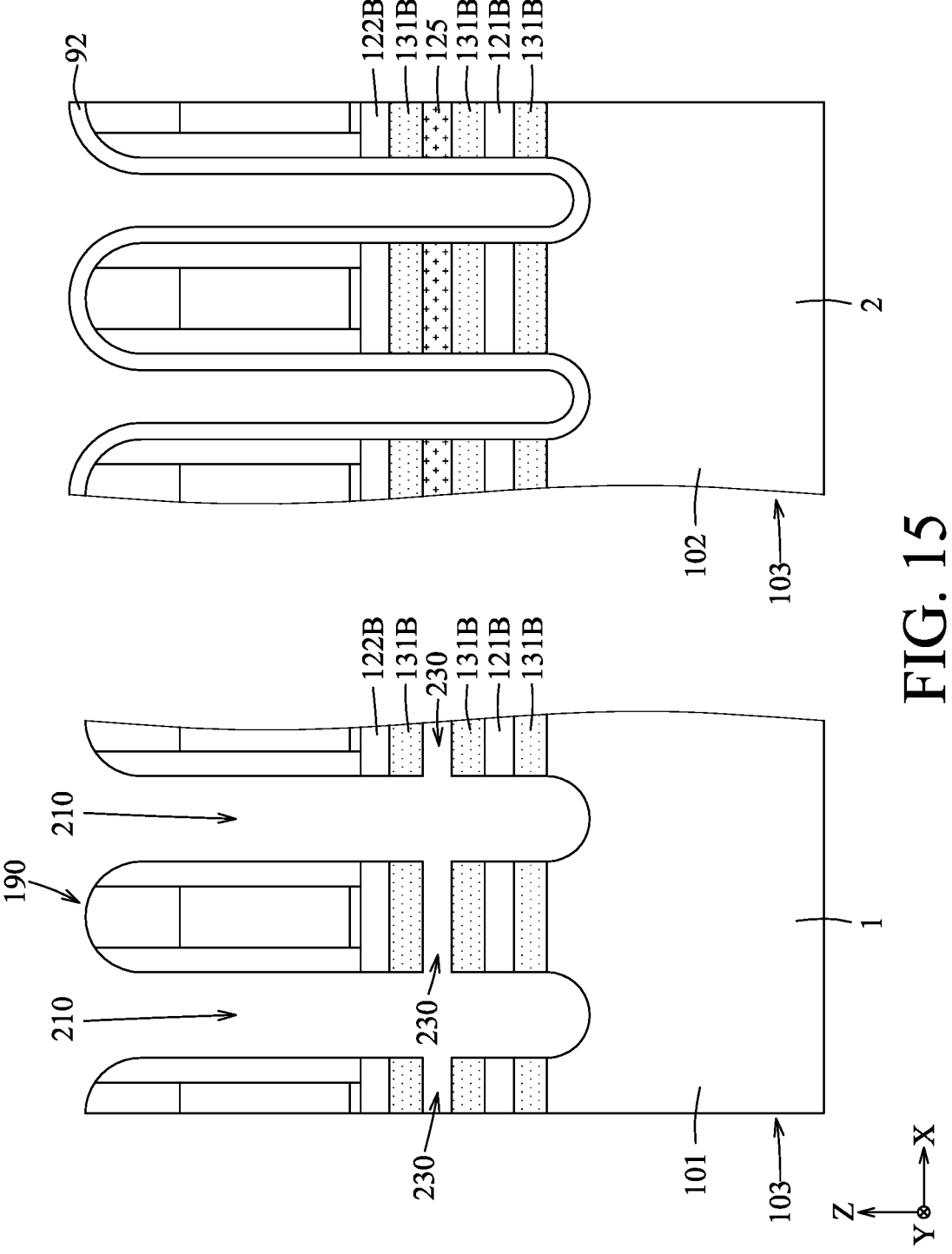
Figure 17:
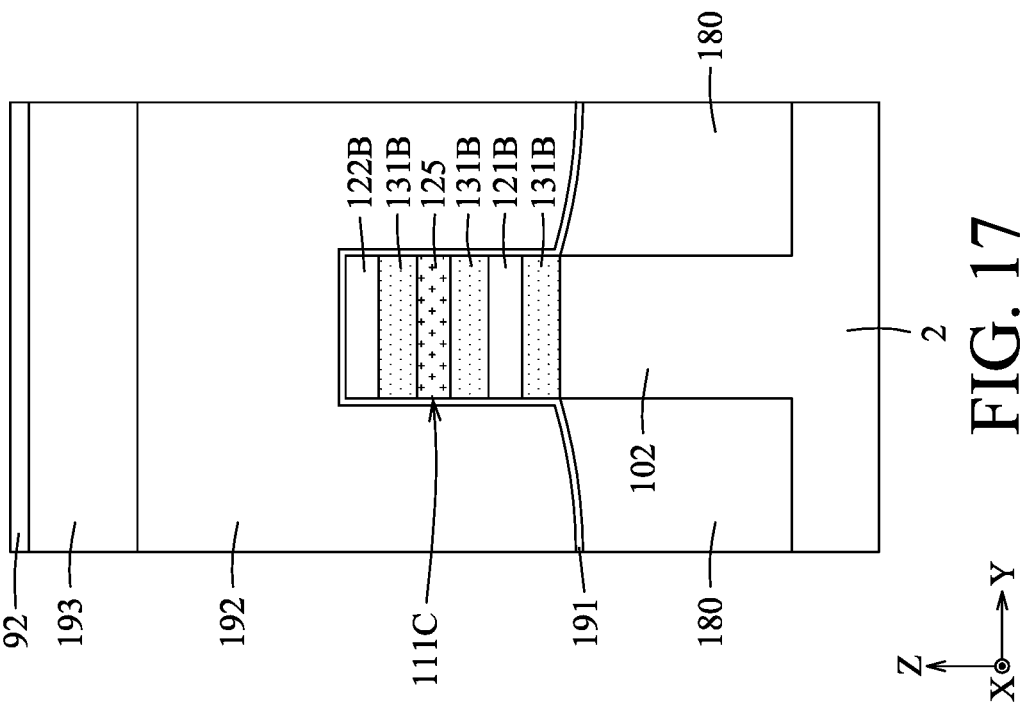
Figure 16:
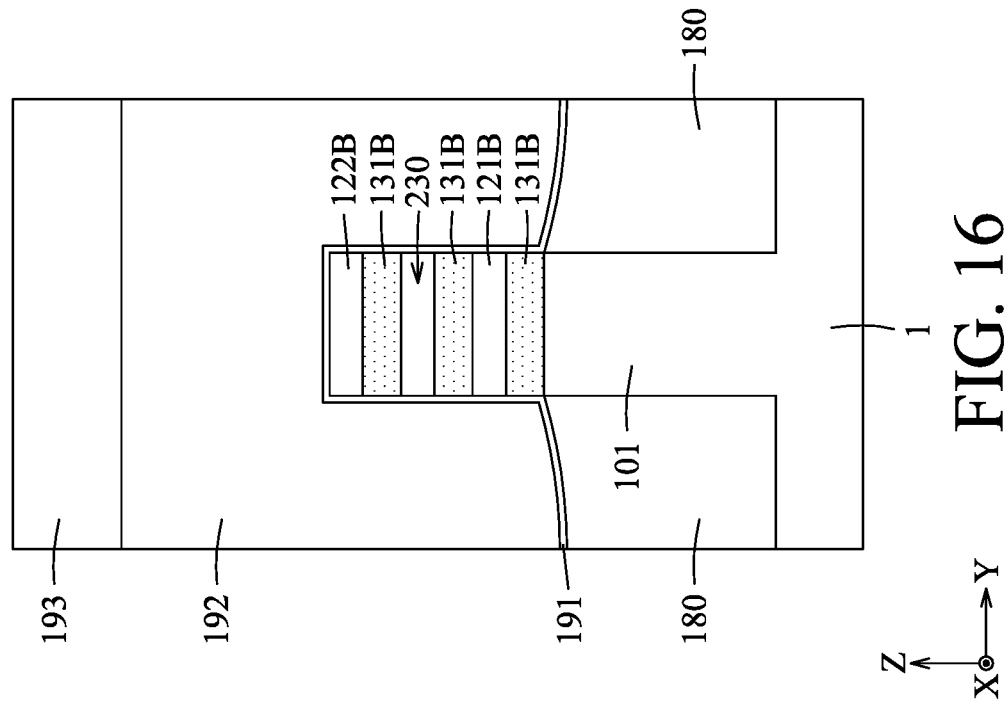

FIGS. 15, 16 and 17 are views respectively subsequent to FIGS. 13, 11 and 14 for illustrating the structures after sub-step (iii) of step S13. In sub-step (iii) of step S13, as shown in FIGS. 15 and 17, a patterned mask 92 is formed to cover the previous obtained structure at the CFET region 2 (see FIGS. 15 and 17), and then the preformed portion 123B in the first stack unit 111B (see FIG. 13) is removed to form a second gap 230 (see FIGS. 15 and 16).

In some embodiments, the suitable materials and processes for forming the patterned mask 92 are similar to those for the patterned mask 91, and thus details thereof are omitted for the sake of brevity. In addition, since processes for forming the second gap 230 are similar to those for forming the first gap 200, details thereof are omitted for the sake of brevity.

Figure 19:
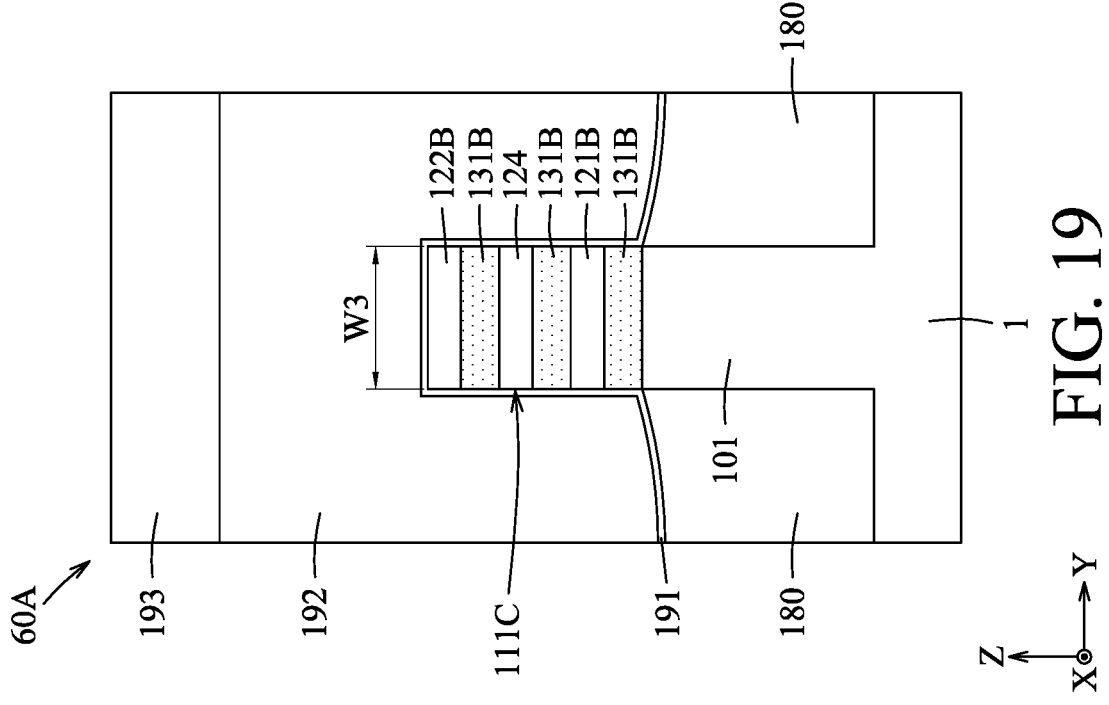

FIGS. 18 and 19 are views respectively subsequent to FIGS. 15 and 16 for illustrating the structures after sub-step (iv) of step S13. In sub-step (iv) of step S13, the middle channel portion 124 (see FIGS. 18 and 19) is formed in the second gap 230 (see FIGS. 15 and 16), and then the patterned mask 92 (see FIGS. 15 and 17) is removed.

In some embodiments, the middle channel portion 124 (see FIGS. 18 and 19) may be made of a semiconductor material the same as that of each of the lower and upper channel portions 121B, 122B in the first stack unit 111B (see FIG. 13). In some embodiments, sub-step (iv) of step S13 may include (a) epitaxial growing the semiconductor material for forming the middle channel portion 124 on the structure obtained after sub-step (iii) of step S13 (see FIGS. 15 to 17) to fill the second gap 230 by an epitaxial growth process including CVD, MBE, an epitaxial deposition/partial etch process, such as a cyclic deposition-etch (CDE) process and/or a SEG process, or other suitable deposition techniques, (b) removing excess portions of the semiconductor material for forming the middle channel portion 124 in the source/drain recesses 210 by a suitable etching process so as to form the middle channel portion 124 in the second gap 230, and (c) removing the patterned mask 92 (see FIGS. 15 and 17) by a suitable etching process. In some embodiments, as shown in FIG. 19, the middle channel portion 124 has a third width (W3) in the Y direction which may be the same as or slightly different from the first width (W1, see FIG. 9). In some embodiments, the third width (W3) may range from about 5 nm to about 80 nm. In some embodiments, a thickness of the middle channel portion 124 in the Z direction is mainly affected by a gap size of the second gap 230 (see FIGS. 15 and 16) in the Z direction, so the thickness of the middle channel portion 124 may the same as or slightly different from the thickness of the preformed layer 123 (see FIG. 2). In some embodiments, the thickness of the middle channel portion 124 may the same as or different from the thickness of each of the lower and upper channel layers 121, 122 (see FIG. 2).

After step S13, the preformed portion 123B of the first stack unit 111B (see FIGS. 8 and 9) is replaced with the middle channel portion 124 to obtain a first stack unit 111C (see FIGS. 18 and 19), and the preformed portion 123B of the second stack unit 112B (see FIGS. 8 and 9) is replaced with the middle isolation portion 125 to obtain a second stack unit 112C (see FIGS. 14 and 18). After step S13, the structures taken in the Y direction at the unipolar region 1 and the CFET region 2 may be presented by FIGS. 19 and 14, respectively.

Figure 23:
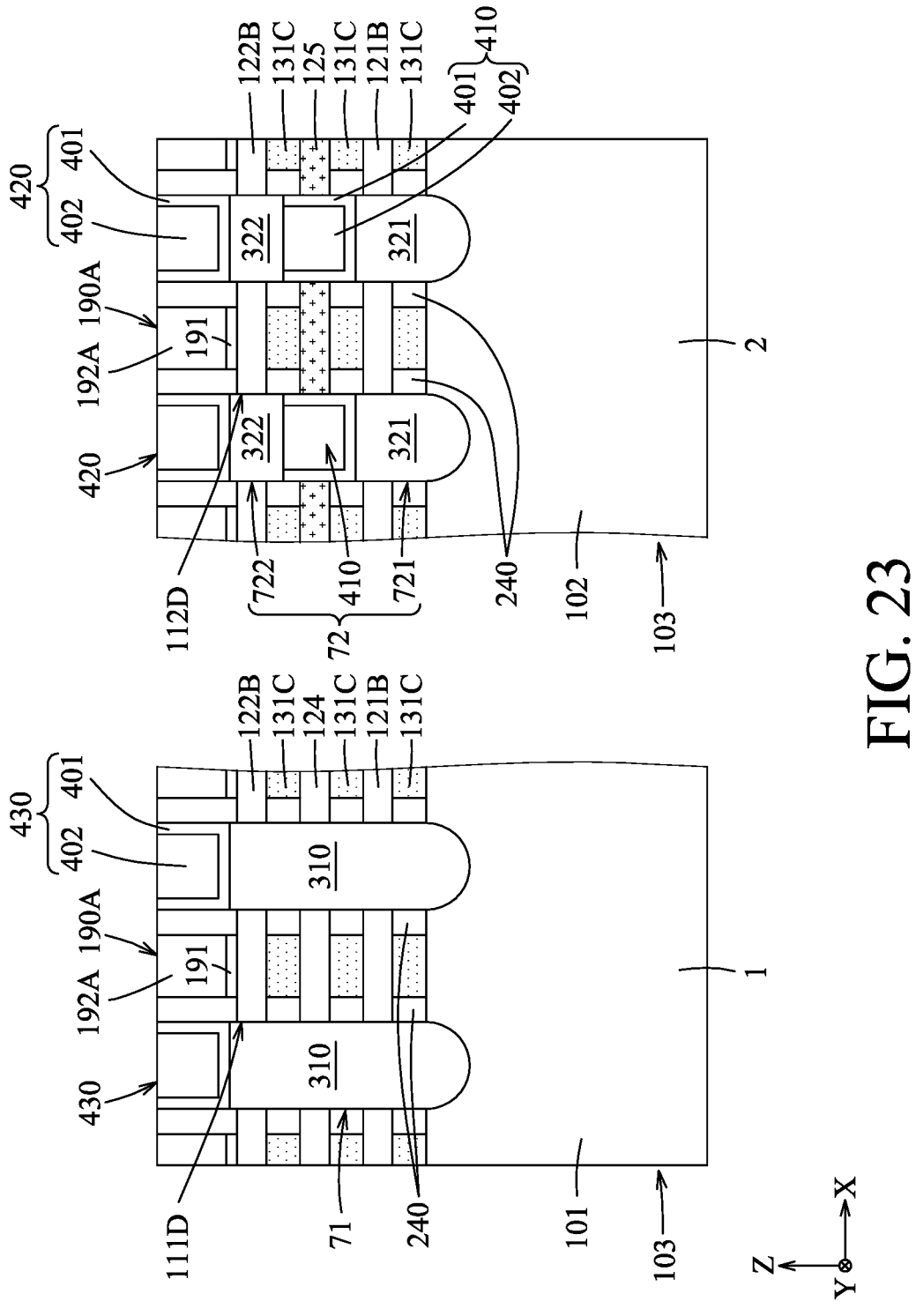

Referring to FIG. 1 and the example illustrated in FIG. 23, the method 10 proceeds to step S14, where a plurality pairs of inner spacers 240, two first source/drain portions 310, two lower source/drain portions 321 and two upper source/drain portions 322 are formed. After step S14, the first device unit 71 and the second device unit 72 are obtained. FIG. 23 is a view subsequent to FIG. 18 for illustrating the structure after step S14. In some embodiments, step S14 include sub-steps (i) to (vi).

In sub-step (i) of step S14, the pairs of the inner spacers 240 are formed by (a) recessing two opposite ends of the sacrificial portions 131B in the first and second stack unit 111C, 112C (see FIG. 18) through the source/drain recesses 210 to form lateral recesses (not shown) by a suitable etching process (e.g., an isotropic etching process), and (b) forming the inner spacers 240 (see FIG. 20) respectively in the lateral recesses in a manner similar to that for forming the middle isolation portion 125 as describe in sub-step (ii) of step S13. In some embodiments, the inner spacers 240 may include a low-k dielectric material, such as silicon oxide, silicon nitride, silicon oxynitride, silicon carbonitride, silicon oxycarbide, silicon oxycarbonitride, silicon carbide, and so on. Other low-k dielectric materials suitable for the inner spacers 240 are within the contemplated scope of the present disclosure.

Figure 20:
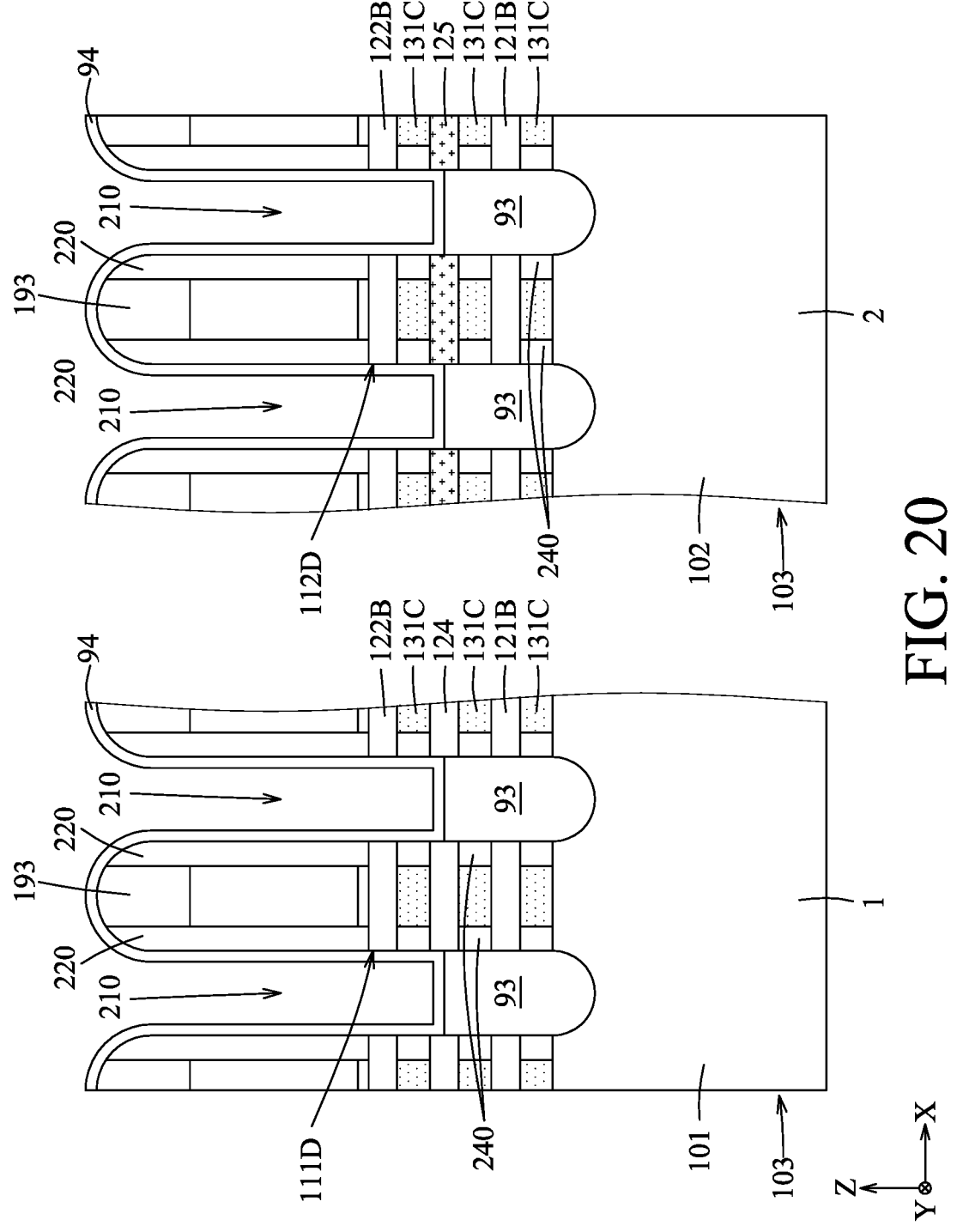

After sub-step (i) of step S14, the first and second stack units 111C and 112C shown in FIG. 18 are respectively formed into first and second stack units 111D and 112D (see FIG. 20). In addition, the recessed sacrificial portions in each of the first and second stack units 111D, 112D are denoted by 131C.

Figure 21:
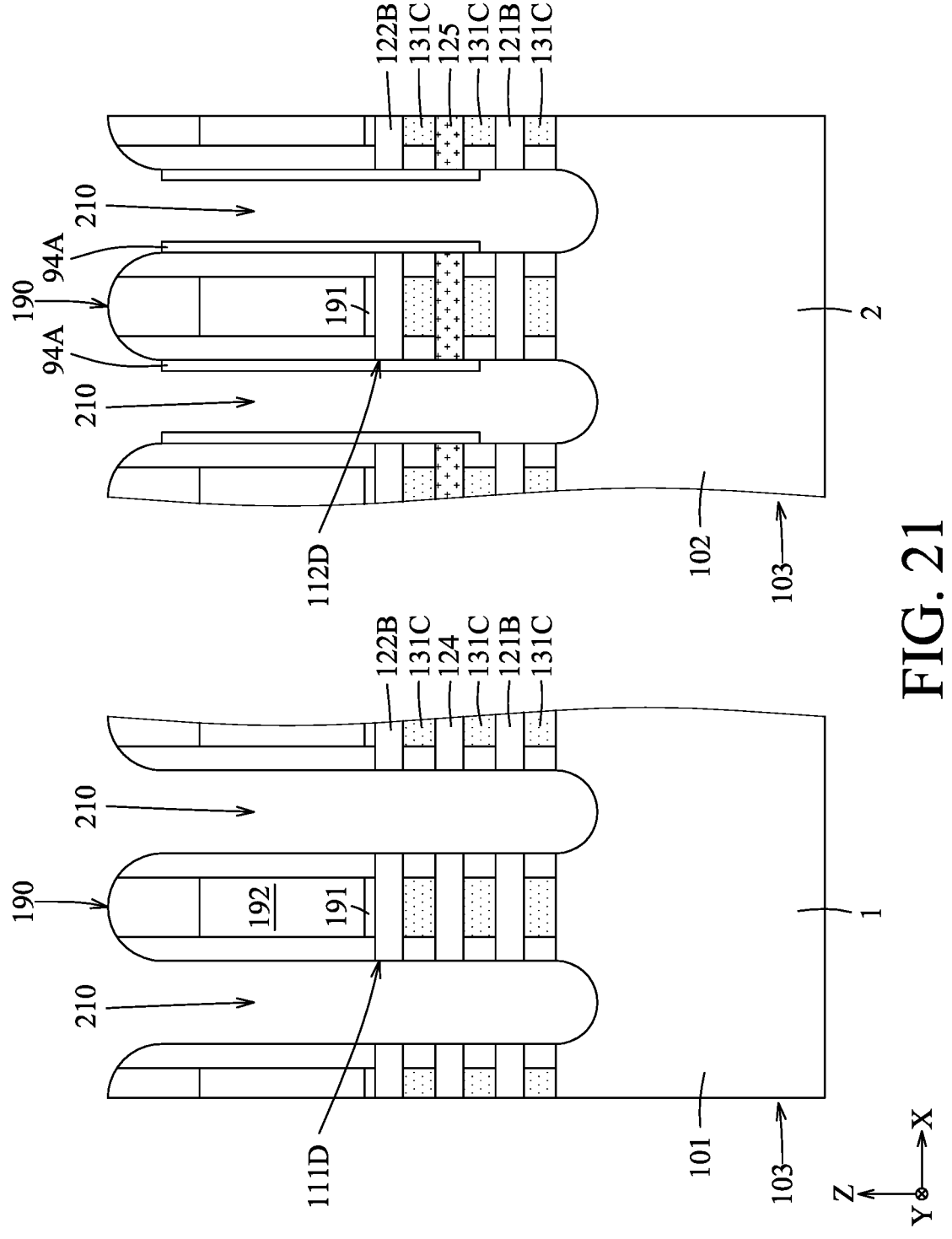

FIG. 21 is a view subsequent to FIG. 18 for illustrating the structure after sub-step (ii) of step S14. In sub-step (ii) of step S14, blocking films 94A are formed to at least cover the end surfaces of the upper channel portions 122B in the second stack unit 112D, while the end surfaces of the lower channel portion 121B in the second stack unit 112D and the end surfaces of the lower, middle and upper channel portions 121B, 124, 122B in the first stack unit 111D are accessible through the source/drain recesses 210.

In some embodiments, the blocking films 94A may be formed by (a) forming a plurality of dielectric portions 93 respectively in the source/drain recesses 210 at the unipolar and CFET regions 1, 2 (see FIG. 20) using CVD, ALD or other suitable processes, followed by a suitable etching back process, such that the dielectric portions 93 cover the end surfaces of the lower channel portions 121B in the first and second stack units 111D, 112D. (b) conformally forming a blocking layer 94 (see FIG. 20) using CVD, ALD or other suitable processes, (c) performing an anisotropic etching process to form the blocking layer 94 into the blocking films 94A (see FIG. 21) which are respectively and partially formed on inner surfaces of the source/drain recesses 210 at the CFET region 2 and additional blocking films (not shown) which are respectively and partially formed on inner surfaces of the source/drain recesses 210 at the unipolar region 1, (d) removing the dielectric portions 93 (see FIG. 20) by a suitable etching process, (e) covering the blocking layer 94 at the CFET region 2 using a protective mask (not shown, which may be a patterned photoresist or other suitable masks), (f) removing the additional blocking films using a suitable etching process through the protective mask, and (g) removing the protective mask.

In some embodiments, the dielectric portions 93 may be made of a dielectric material, such as the examples of the inner spacers 240 as described in sub-step (i) of step S14. In some embodiments, the blocking films 94A may be made of a dielectric material, such as the examples for the patterned mask 91 as described with reference to FIGS. 10 and 11. In some embodiments, the dielectric portions 93 are made of a dielectric material which is different from those of the elements 94A, 193, 220, 240, so that the dielectric portions 93 may be selectively removed relative to the elements 94A, 193, 220, 240. Other dielectric materials suitable for the dielectric portions 93 and the blocking films 94A are within the contemplated scope of the present disclosure In sub-step (iii) of step S14, the first source/drain portions 310 and the lower source/drain portions 321 (see FIG. 22) are formed by an epitaxial growth process (such as the examples described in the preceding paragraph) and then the blocking films 94A shown in FIG. 21 are removed. The first source/drain portions 310 are respectively formed in the source/drain recesses 210 at the unipolar region 1 (see FIGS. 21 and 22) and spaced apart from each other such that each of the lower, middle and upper channel portions 121B, 124, 122B in the first stack unit 111D extends between the first source/drain portions 310. The lower source/drain portions 321 are respectively formed in the source/drain recesses 210 at the CFET region 2 (see FIGS. 21 and 22) and spaced apart from each other such that the lower channel portion 121B in the second stack unit 112D extends between the lower source/drain portions 321. The lower source/drain portions 321 have a conductivity type the same as that of the first source/drain portions 310. In some embodiments, each of the first source/drain portions 310 may be doped with n-type impurities or p-type impurities, and may be formed as a single layer structure or a multi-layered structure having several sub-layers with different doping concentration. In some embodiments, the first source/drain portions 310 have a p-type conductivity, and include single crystalline or polycrystalline silicon, single crystalline or polycrystalline silicon germanium, or other suitable materials doped with p-type impurities so as to function as a source/drain of a p-FET. The p-type impurities may be, for example, but not limited to, boron (B), aluminum (Al), gallium (Ga), indium (In), other suitable materials, or combinations thereof. In some embodiments, the first source/drain portions 310 have an n-type conductivity, and include single crystalline silicon, polycrystalline silicon or other suitable materials doped with n-type impurities so as to function as a source/drain of an n-FET. The n-type impurities may be, for example, but not limited to, nitrogen (N), phosphorous (P), arsenic (As), antimony (Sb), other suitable materials, or combinations thereof. In some embodiments, carbon (C) may be selected to be doped in the first source/drain portions 310. The impurities in the first source/drain portions 310 and the lower source/drain portions 321 may be in-situ doped during the epitaxial growth process for forming the same, or post doped after the epitaxial growth process for forming the same.

Figure 22:
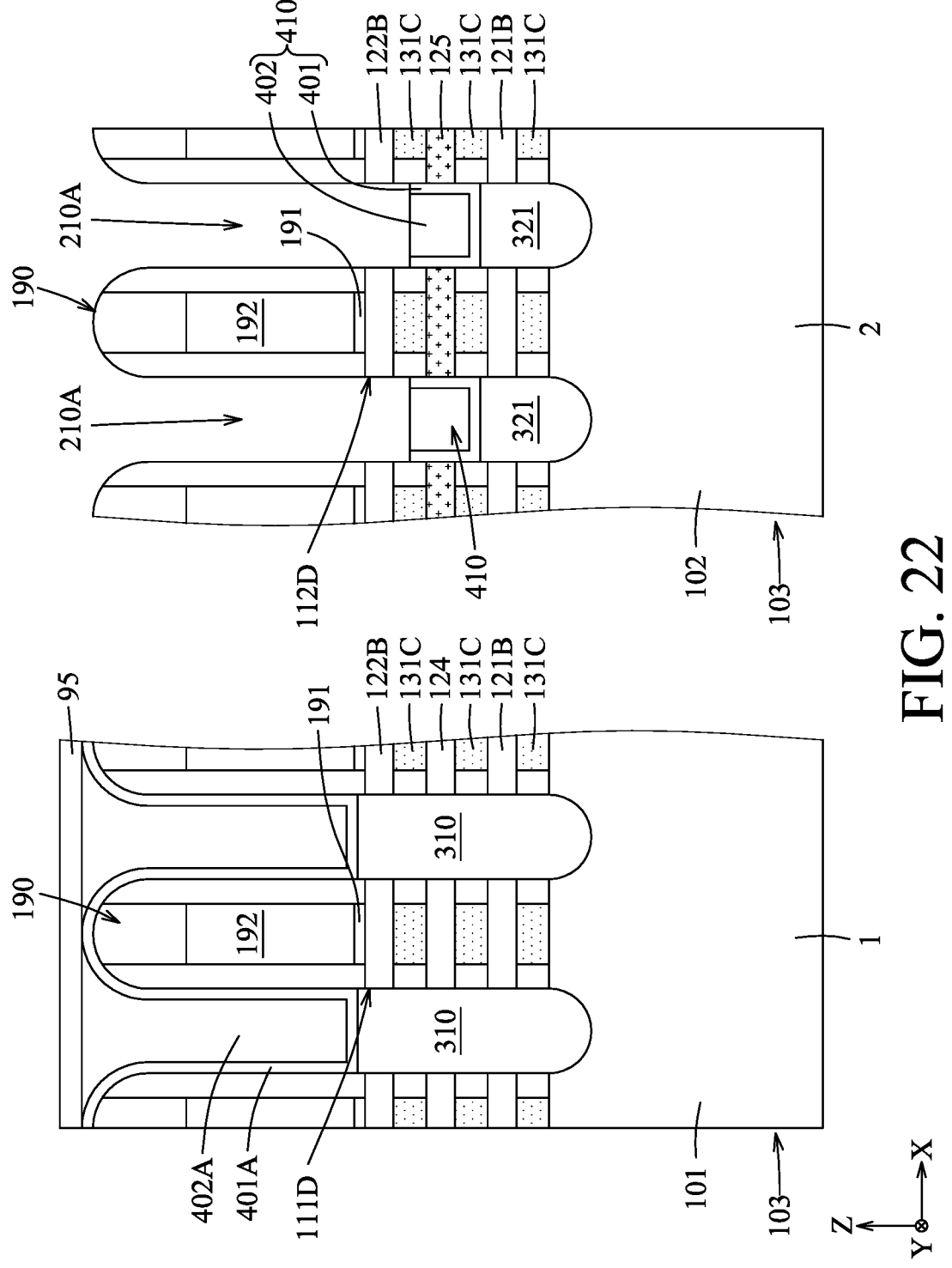

In sub-step (iv) of step S14, first isolation features 410 are formed to respectively cover the lower source/drain portions 321 (see FIG. 22). In some embodiments, the first isolation features 410 is configured as a bi-layered structure, and includes a first dielectric layer 401 and a second dielectric layer 402 formed on the first dielectric layer 401. In some embodiments, sub-step (iv) of step S14 includes (a) sequentially depositing first material layers 401A, 402A respectively for forming the first and second dielectric layers 401, 402 on the previously obtained structure to fill the remaining source/drain recesses 210 using CVD, ALD or other suitable processes, (b) performing a planarization process, for example, but not limited to, chemical mechanical polishing (CMP) to partially expose the first material layer 402A, and (c) forming a patterned mask (which may be a patterned photoresist and/or a patterned hard mask) 95 which covers a first part of the first material layers 401A, 402A at the unipolar region 1, (d) etching back a second part of the first material layers 401A, 402A at the CFET region 2 through the patterned mask 95 using a suitable etching process so as to form the second part of the first material layers 401A, 402A at the CFET region 2 into the first isolation features 410 respectively on the lower source/drain portions 321. After sub-step (iv) of step S14, the first part of the first material layers 401A, 402A remains at the unipolar region 1. As shown in FIG. 22, the end surfaces of the upper channel portions 122B in the second stack unit 112D are exposed from the first isolation features 410. In some embodiments, the first dielectric layer 401 may include silicon nitride, carbon-doped silicon nitride, other suitable materials, or combinations thereof. In some embodiments, the second dielectric layer 402 may include a low-k dielectric material (such as the examples described in the preceding paragraph) which is different from that of the first dielectric layer 401. Other suitable materials and/or configurations for the first isolation features 410 are within the contemplated scope of the present disclosure.

After sub-step (iv) of step 14, the patterned mask 95 may be removed, and the remaining source/drain recesses at the CFET region 2 are denoted by 210A.

In sub-step (v) of step S14, the upper source/drain portions 322 (see FIG. 23) are respectively formed in the source/drain recesses 210A (see FIG. 22) by an epitaxial growth process (such as the examples described in the preceding paragraph). Since suitable materials for the upper source/drain portions 322 are similar to those for the first source/drain portions 310, details thereof are omitted for the sake of brevity. As shown in FIG. 23, the upper source/drain portions 322 are respectively formed above and spaced apart from the lower source/drain portions 321 by the first isolation features 410, and the upper channel portion 122B in the second stack unit 112D extends between the upper source/drain portions 322. The upper source/drain portions 322 may have a conductivity type which is the same as or different from that of the lower source/drain portions 321. In the case that the second device unit 72 has a CFET structure, the upper source/drain portions 322 have a conductivity type opposite to that of the lower source/drain portions 321. For example, the lower source/drain portions 321 have a p-type conductivity, while the upper source/drain portions 322 have an n-type conductivity, and vice versa. The impurities in the upper source/drain portions 322 may be in-situ doped during the epitaxial growth process for forming the same, or post doped after the epitaxial growth process for forming the same. As shown in FIG. 23, each of the first isolation features 410 is formed to separate one of the lower source/drain portions 321 from a corresponding one of the upper source/drain portions 322.

In sub-step (vi) of step S14, as shown in FIG. 23, second isolation features 420 are formed to respectively cover the upper source/drain portions 322, and third isolation features 430 are formed to respectively cover the first source/drain portions 310. Each of the second and third isolation features 420, 430 includes a first dielectric layer 401 and a second dielectric layer 402 which may be made of materials substantially the same as those of the first isolation features 410. In some embodiments, sub-step (vi) of step S14 includes (a) sequentially depositing second material layers (not shown) respectively for forming the first and second dielectric layers 401, 402 of the second isolation features 420 on the previously obtained structure to fill the remaining source/drain recesses (not shown) at the CFET region 2 using CVD, ALD or other suitable processes, and (b) performing a planarization process, for example, but not limited to, CMP, to expose the dummy gate electrode layers 192 of the dummy gate portions 190 on the first and second stack units 111D, 112D (see FIG. 22). As such, the first part of the first material layers 401A, 402A at the unipolar region 1 (see FIG. 22) is formed into the third isolation features 430 (see FIG. 23) and the second material layers are formed into the second isolation features 420. At this stage, the first device unit 71 is formed at the unipolar region 1, and the second device unit 72 is formed at the CFET region 2 and includes the lower device 721 and the upper device 722.

After sub-step (vi) of step S14, each of the remaining dummy gate portions on the first and second stack units 111D, 112D is denoted by 190A, and includes the remaining dummy gate electrode layer 192A and the dummy gate dielectric layer 191. As such, compared to the structure shown in FIGS. 19 and 14 (obtained in step S13), after step 14, the structure may have a reduced height in the Z direction (i.e., the hard mask layer 193 and a portion of the dummy gate electrode layer 192 shown in FIGS. 19 and 14 are removed in step S14).

The first device unit 71 includes the lower, middle and upper channel portions 121B, 124, 122B of the first stack unit 111D (hereinafter referred to as first channel portions) which are spaced apart from each other in the Z direction, and the two first source/drain portions 310 which are spaced apart from each other in the X direction such that each of the first channel portions 121B, 124, 122B extends between the first source/drain portions 310.

The lower device 721 in the second device unit 72 is disposed at the CFET region 2, and includes the lower channel portion 121B of the second stack unit 112D and the two lower source/drain portions 321 which are spaced apart from each other in the X direction such that the lower channel portion 121B of the second stack unit 112D extends between the lower source/drain portions 321.

The upper device 722 is disposed above and spaced apart from the lower device 721, and includes the upper channel portion 122B of the second stack unit 112D and the two upper source/drain portions 322 which are spaced apart from each other in the X direction such that the upper channel portion 122B of the second stack unit 112D extends between the upper source/drain portions 322.

In some embodiments, as shown in FIG. 23, an uppermost one of the first channel portions 121B, 124, 122B in the first device unit 71 has an upper surface which is substantially flush with an upper surface of the upper channel portion 122B of the upper device 721.

In some embodiments, as shown in FIG. 23, the second device unit 72 further includes the middle isolation portion 125 which is disposed between and spaced apart from the lower and upper channel portions 121B, 122B of the second stack unit 112D. In some embodiments, the middle isolation portion 125 has a length in the X direction which is the same as that of each of the lower and upper channel portions 121B, 122B of the second stack unit 112D. In some embodiments, the middle isolation portion 125 has a thickness in the Z direction which is substantially the same as that of each of the first channel portions 121B, 124, 122B of the first device unit 71, and which is substantially the same as that of each of the lower and upper channel portions 121B, 122B of the second stack unit 112D.

In some embodiments, as shown in FIG. 23, the second device unit 72 further includes the first isolation features 410, each of which is disposed between one of the lower source/drain portions 321 and a corresponding one of the upper source/drain portions 322. In some embodiments, the middle isolation portion 125 extends between the two isolation features 410, such that the middle isolation portion 125 and the first isolation features 410 together isolate the lower and upper devices 721, 722.

It is worth noting that a number of the first channel portions 121B, 124, 122B in the first device unit 71 is greater than a number of the lower channel portion 121B in the lower device 721 and greater than a number of the upper channel portion 122B in the upper device 722. Therefore, the first device unit 71 may function to have a higher speed performance with respect to the lower and upper devices 721, 722. Relatively, the second device unit 72, which includes the lower and upper devices 721, 722 stacked on each other, may have a higher device density with respect to the first device unit 71. In some embodiments, since the second device unit 72 has a stack of the devices 721, 722 which have opposite types of conductivity, the second device unit 72 may be referred to as a CFET structure. In some embodiments, since the first device unit 71 has a single type of conductivity, the first device unit 71 may be referred to as a unipolar transistor. Notably, the CFET and the unipolar transistor can be formed on the same wafer by the method of this disclosure.

Figure 24:
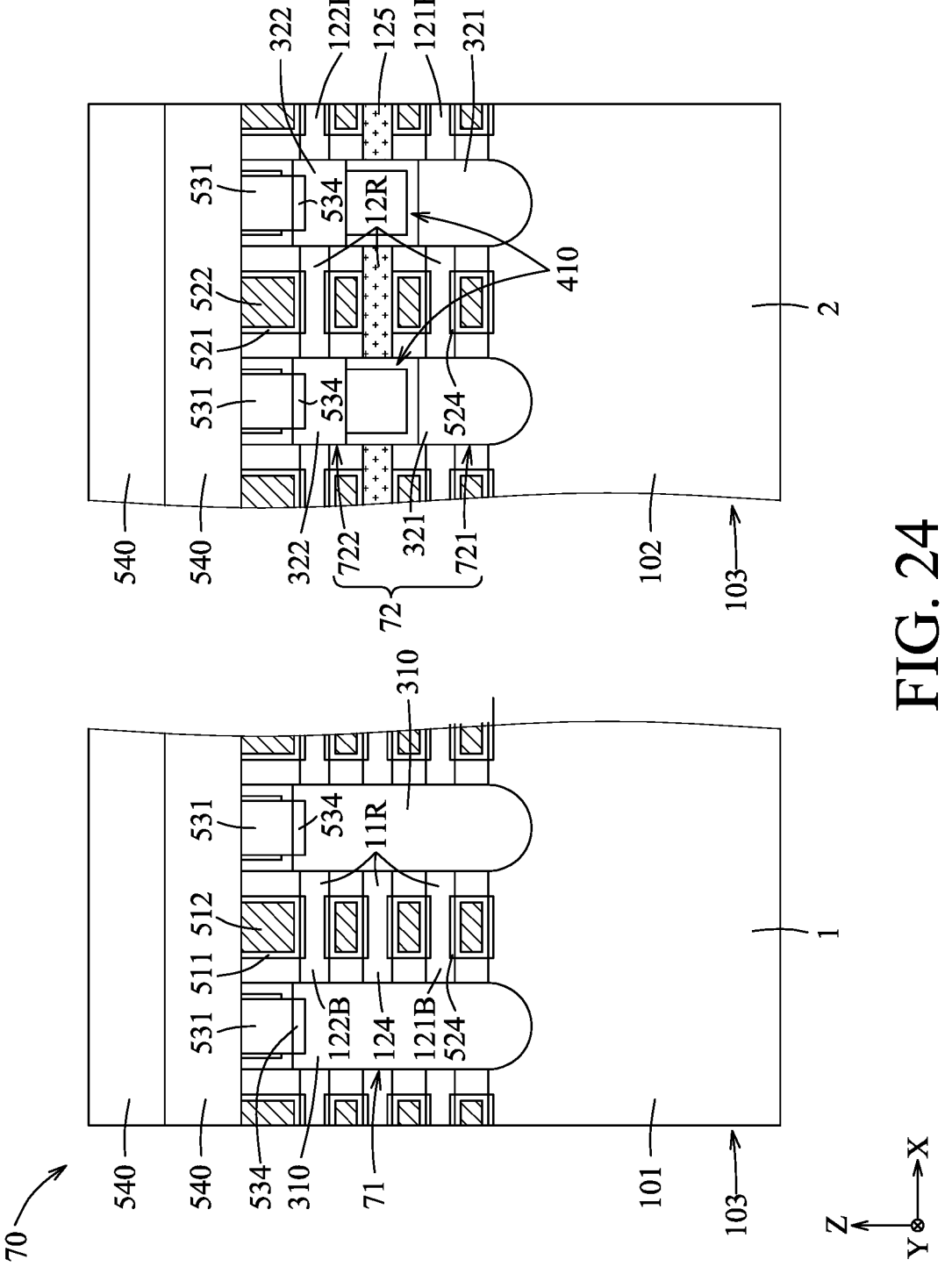
Figure 26:
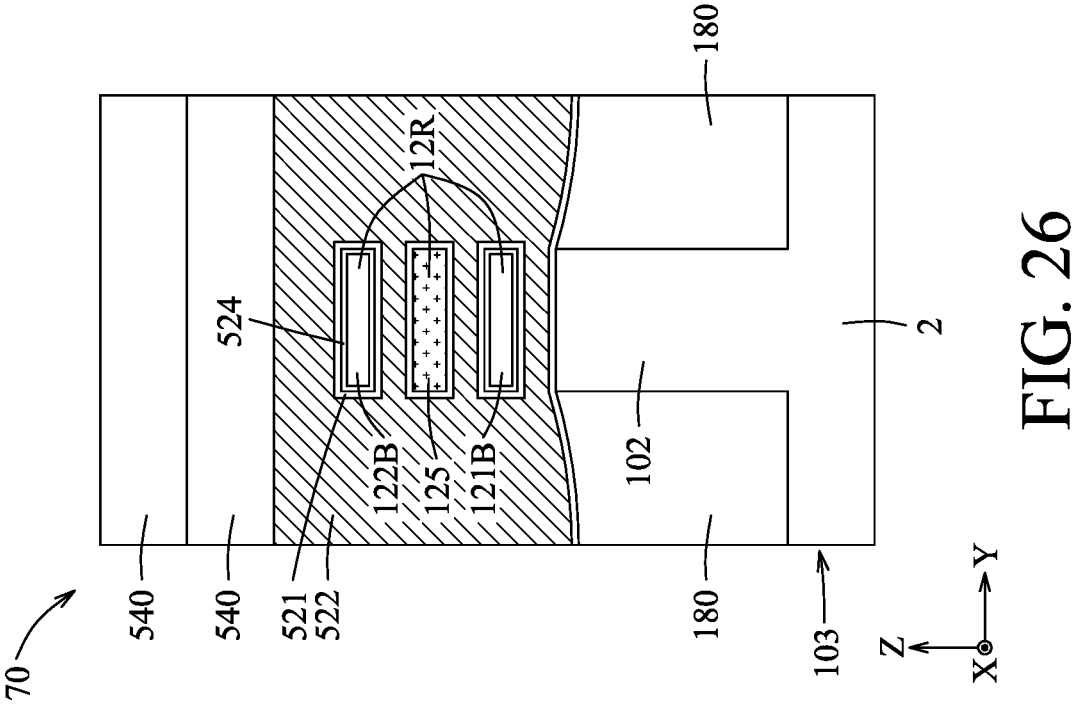
Figure 25:
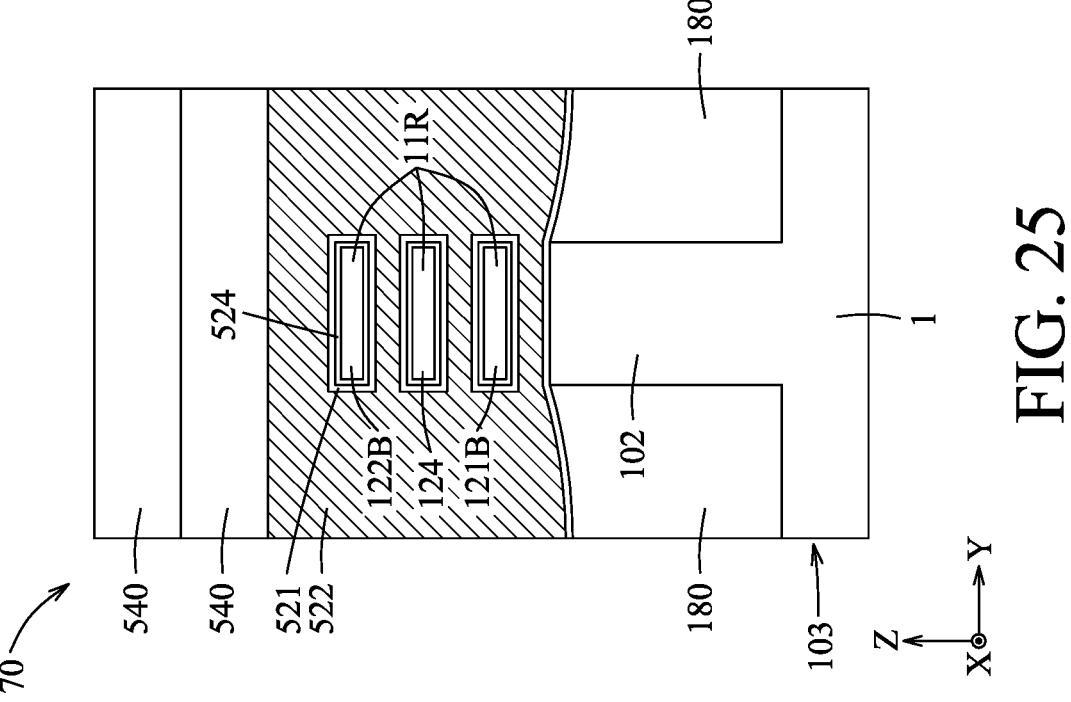

Referring to FIG. 1 and the examples illustrated in FIGS. 24 to 26, the method 10 proceeds to step S15, where a replacement gate process is performed, thereby obtaining the semiconductor structure 70. FIGS. 24 to 26 are views respectively subsequent to FIGS. 23, 19 and 14 for illustrating the structures after step S15.

In a first sub-step of step S15, the remaining dummy gate portions 190A and the sacrificial portions 131C (see FIG. 23) are removed using one or more suitable etching processes to form a first cavity (not shown) at the unipolar region 1 and a second cavity (not shown) at the CFET region 2. The first channel portions 121B, 124, 122B remaining in the first stack unit 111D and exposed from the first cavity are together referred to as a first stack 11R, and the lower and upper channel portions 121B. 122B, and the middle isolation portion 125 remaining in the second stack unit 112D and exposed from the second cavity are together referred to as a second stack 12R. Afterwards, as shown in FIG. 24, in a second sub-step of step S15, materials for forming a first gate dielectric 511 and a first gate electrode 512 are sequentially formed in the first cavity using one or more suitable deposition processes (such as CVD, ALD, etc.), and materials for forming a second gate dielectric 521 and a second gate electrode 522 are sequentially formed in the second cavity using one or more suitable deposition processes (such as CVD, ALD, etc.), followed by one or more planarization processes (such as, CMP, or other suitable processes) to remove an excess of the above materials, thereby obtain the first and second gate dielectrics 511, 521 and the first and second gate electrodes 512, 522.

In some embodiments, the first gate dielectric 511 is disposed around each of the first channel portions 121B, 124, 122B in the first stack 11R. The first gate electrode 512 is disposed on the first gate dielectric 511 such that each of the first channel portions 121B, 124, 122B is separated from the first gate electrode 512 by the first gate dielectric 511.

The second gate dielectric 521 is disposed around each of the lower and upper channel portions 121B, 122B and the middle isolation portion 125 in the second stack 12R. The second gate electrode 522 is disposed on the second gate dielectric 521 such that each of the lower and upper channel portions 121B, 122B and the middle isolation portion 125 in the second stack 12R is separated from the second gate electrode 522 by the second gate dielectric 521.

In some embodiments, each of the first and second gate dielectrics 511, 521 may independently include silicon oxide, silicon nitride, silicon oxynitride, a suitable high-k material (such as hafnium oxide, zirconium oxide, zirconium aluminum oxide, hafnium aluminum oxide, hafnium silicon oxide, aluminum oxide, and so on), other suitable materials, or combinations thereof. Other suitable materials for the first and second gate dielectrics 512, 522 are within the contemplated scope of the present disclosure. In some embodiments, any one of the first and second gate electrodes 512, 522 may be configured as a multi-layered structure including at least one work function metal which is provided for adjusting threshold voltage of an n-FET or an p-FET, an electrically conductive material having a low resistance which is provided for reducing electrical resistance of the one of the first and second gate electrodes 512, 522, other suitable materials, or combinations thereof. In some embodiments, the work function metal of one of the first and second gate electrodes 512, 522 for forming an n-FET may be different from that for forming a p-FET so as to permit the n-FET and the p-FET to have different threshold voltages. Other suitable methods for adjusting the threshold voltages are within the contemplated scope of the present disclosure. In some embodiments, each of the first and second gate electrodes 512, 522 may independently include a metal material (e.g., tungsten (W), titanium (Ti), tantalum (Ta), aluminum (Al), or ruthenium (Ru)), metal-containing nitrides (e.g., titanium nitride (TiN), or tantalum nitride (TaN)), metal-containing silicides (e.g., nickel silicide (NiSi)), metal-containing carbides (e.g., tantalum carbide (TaC)), or combinations thereof. Other suitable materials for the first and second gate electrodes 512, 522 are within the contemplated scope of the present disclosure.

In some embodiments, some steps in the method 10 may be modified, replaced, or eliminated without departure from the spirit and scope of the present disclosure. For example, in some embodiments exemplified by FIGS. 20 to 24, the first source/drain portions 71 are formed together with the lower source/drain portions 321 to have the same conductivity type as that of the lower source/drain portions 321. In other embodiments, the first source/drain portions 71 are formed together with the upper source/drain portions 322 to have the same conductivity type as that of the upper source/drain portions 322. Furthermore, the semiconductor structure 70 may further include additional features, and/or some features present in the semiconductor structure 70 may be modified, replaced, or eliminated without departure from the spirit and scope of the present disclosure.

In some embodiments, as shown in FIG. 24, the semiconductor structure 70 may further include a plurality of interfacial layers 524 each of which is interposed between one of the channel portions in the first and second stacks 11R. 12R and a corresponding one of the first and second gate dielectrics 511, 521.

In some embodiments, as shown in FIG. 24, in some embodiments, the semiconductor structure 70 may further include a plurality of front-side contact features 531 which are respective formed in the second and third isolation features 420, 430 such that each of the front-side contact features 531 is coupled to a corresponding one of the first source/drain portions 310 of the first device unit 71 and the upper source/drain portions 322 of the upper device 722. In some embodiments, the semiconductor structure 70 may further include a plurality of metal silicide features 534 each of which is disposed between one of the contact features 531 and a corresponding one of the source/drain portions 310, 322 for reducing a contact resistance (Rcsd) therebetween. In some embodiments, the semiconductor structure 70 may further include a plurality of front-side interconnect layers 540 each including a plurality of inter-metal dielectric (IMD) features (not shown) in which front-side electrically conductive elements (not shown, for example, metal contacts, metal lines and/or metal vias) are formed so as to permit the first device unit 71 and/or the upper device 722 to be electrically connected to external circuits through the front-side electrically conductive elements. In some embodiments, each of the interconnect layers 540 may be formed by a dual damascene process, a single damascene process, or other suitable back-end-of-line (BEOL) techniques.

Figure 46:
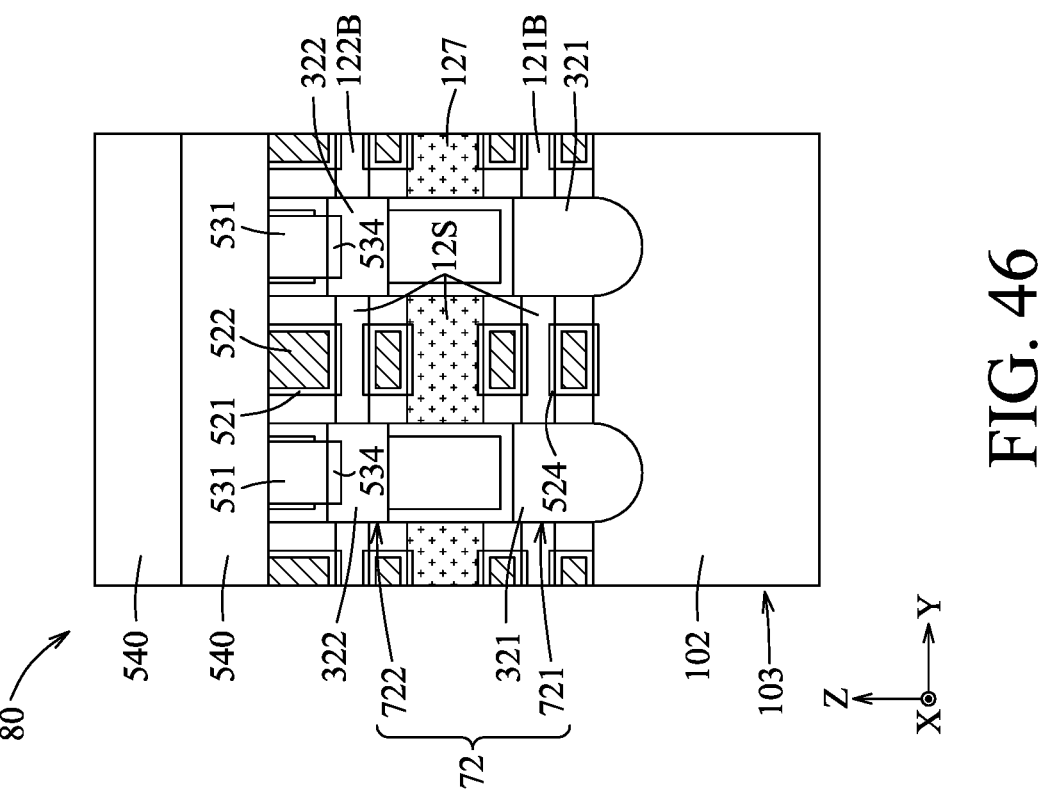
Figure 45:
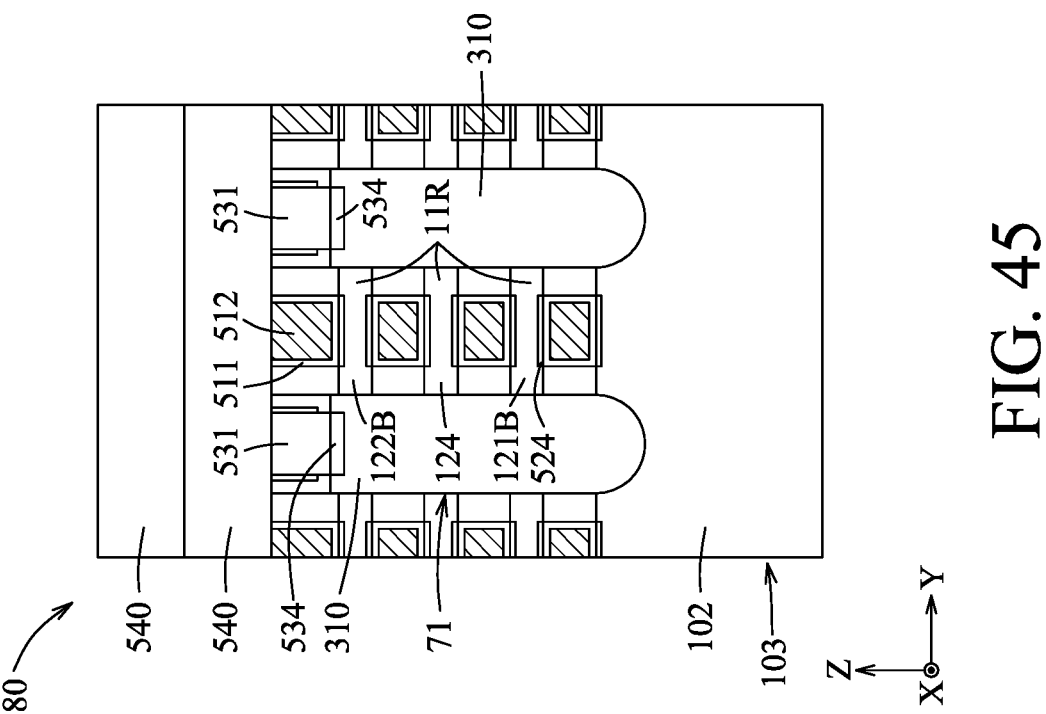

In the method 10, since the middle channel portion 124 and the middle isolation portion 125 (see FIG. 24) are respectively formed by replacing the preformed portion 123B in the first stack unit 111B and the preformed portion 123B in the second stack unit 112B (see FIG. 10), the middle isolation portion 125 has a thickness substantially the same as that of the middle channel portion 124. In the following, another semiconductor structure 80 shown in FIGS. 45 and 46 are formed in accordance with some other embodiments. It is noted that similar numerals from the above-mentioned embodiments are used where appropriate, with some construction differences being indicated with different numerals.

The semiconductor structure 80 shown in FIGS. 45 and 46 has a structure similar to the semiconductor structure 70 shown in FIG. 24, but include a middle isolation portion 127 which has a thickness greater than that of each of the middle channel portion 124 and the middle isolation portion 125 shown in FIG. 24. The semiconductor structure 80 is advantageous for the case that the second gate electrode 522 have two gate parts 5221, 5222 (see FIG. 44) stacked on and spaced apart from each other, because the middle isolation portion 127 may cooperate with other dielectric portions 440 to together provide good isolation between the two gate parts 5221, 5222, and provide a wider process window (or a higher process tolerance) for a process of forming the isolation between the two gate parts 5221, 5222.

FIG. 27 is a flow diagram illustrating a method 20 for manufacturing a semiconductor structure (for example, the semiconductor structure 80 shown in FIGS. 44 to 46) in accordance with some embodiments. FIGS. 28 to 46 illustrate schematic views of intermediate stages of the method 20 in accordance with some embodiments. Some repeating structures are omitted in FIGS. 28 to 46 for the sake of brevity.

Figure 31:
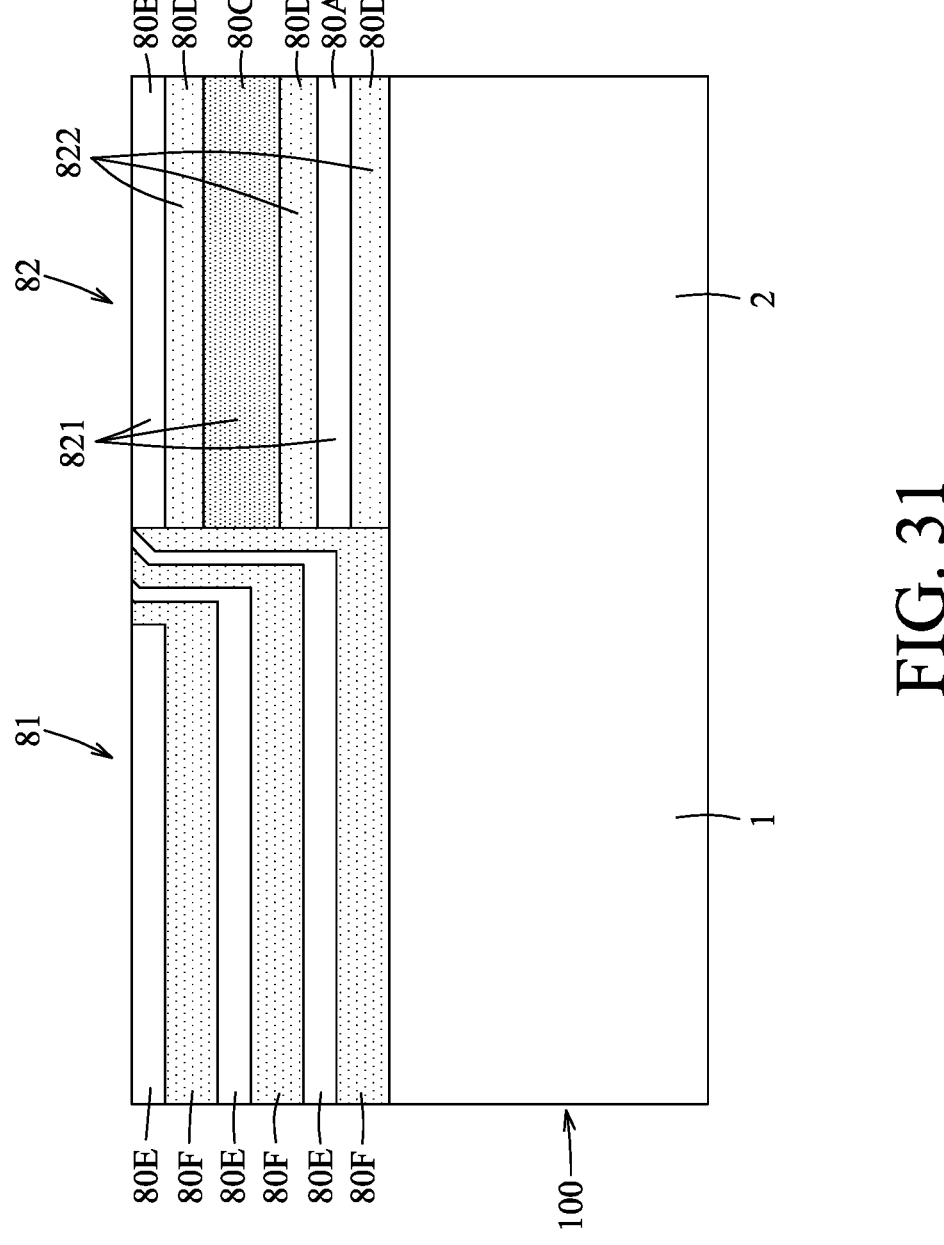

Referring to FIG. 27 and the example illustrated in FIG. 31, the method 20 begins at step S21, where a first laminated structure 81 and a second laminated structure 82 are respectively formed on the unipolar region 1 and the CFET region 2 of the starting substrate 100. The first laminated structure 81 has an upper surface substantially flush with an upper surface of the second laminated structure 82.

The first laminated structure 81 includes a plurality of first channel layers 80E and a plurality of first sacrificial layers 80F disposed to alternate with the first channel layers 80E. A bottommost one of the first sacrificial layers 80F is disposed on the unipolar region 1 of the starting substrate 100. In some embodiments, as shown in FIG. 31, an uppermost one of the first channel layers 80E has the upper surface of the first laminated structure 81. In some other not shown embodiments, an uppermost one of the first sacrificial layers 80F may have the upper surface of the first laminated structure 81. In some embodiments, the first laminated structure 81 is a stack of semiconductor materials. Semiconductor materials suitable for forming the layers 80E, 80F are similar to those for the starting substrate 100 as described above with reference to FIG. 2, and thus details thereof are omitted for the sake of brevity. It is noted that the first channel layers 80E are made of a semiconductor material different from that of the first sacrificial layers 80F, so that the first sacrificial layers 80E can be selectively removed with respect to the first channel layers 80E in subsequent processes due to different etching selectivity ratios.

The second laminated structure 82 includes a first set of layers 821 and a second set of layers 822. The first set of layers 821 include at least one lower channel layer 80A, at least one upper channel layer 80B and a preformed layer 80C which is disposed between and spaced apart from the at least one lower channel layer 80A and the at least one upper channel layer 80B in the Z direction. The second set of layers 822 include at least three second sacrificial layers 80D, and are disposed to alternate with the layers 80A, 80B, 80C of the first set of layers 821. A bottommost one of the at least three second sacrificial layers 80D is disposed on the CFET region 2 of the starting substrate 100. In some embodiments, as shown in FIG. 31, an uppermost one of the at least one upper channel layers 80B has the upper surface of the second laminated structure 82. In some other not shown embodiments, an uppermost one of the second sacrificial layers 80D may have the upper surface of the second laminated structure 82.

In some embodiments, the second laminated structure 82 has a configuration similar to that the laminated structure 110 shown in FIG. 2, but the preformed layer 80C in the second laminated structure 82 has a thickness greater than that of each of the lower and upper channel layers 80A, 80B. In some embodiments, the preformed layer 80C has a thickness greater than that of each of the first channel layers 80E. The thickness ranges for the lower and upper channel layers 80A, 80B and the second sacrificial layers 80D are respectively similar to those for the lower and upper channel layers 121, 122 and the sacrificial layers 131 as described above with reference to FIG. 2. In some embodiments, the preformed layer 80C may have a thickness ranging from about 5 nm to about 30 nm. The materials for the lower and upper channel layers 80A, 80B, the preformed layer 80C and the second sacrificial layers 80D are respectively similar to those of the lower and upper channel layers 121, 122, the preformed layer 123 and the sacrificial layers 131 as described above reference to FIG. 2, and thus details thereof are omitted for the sake of brevity.

Figure 44:
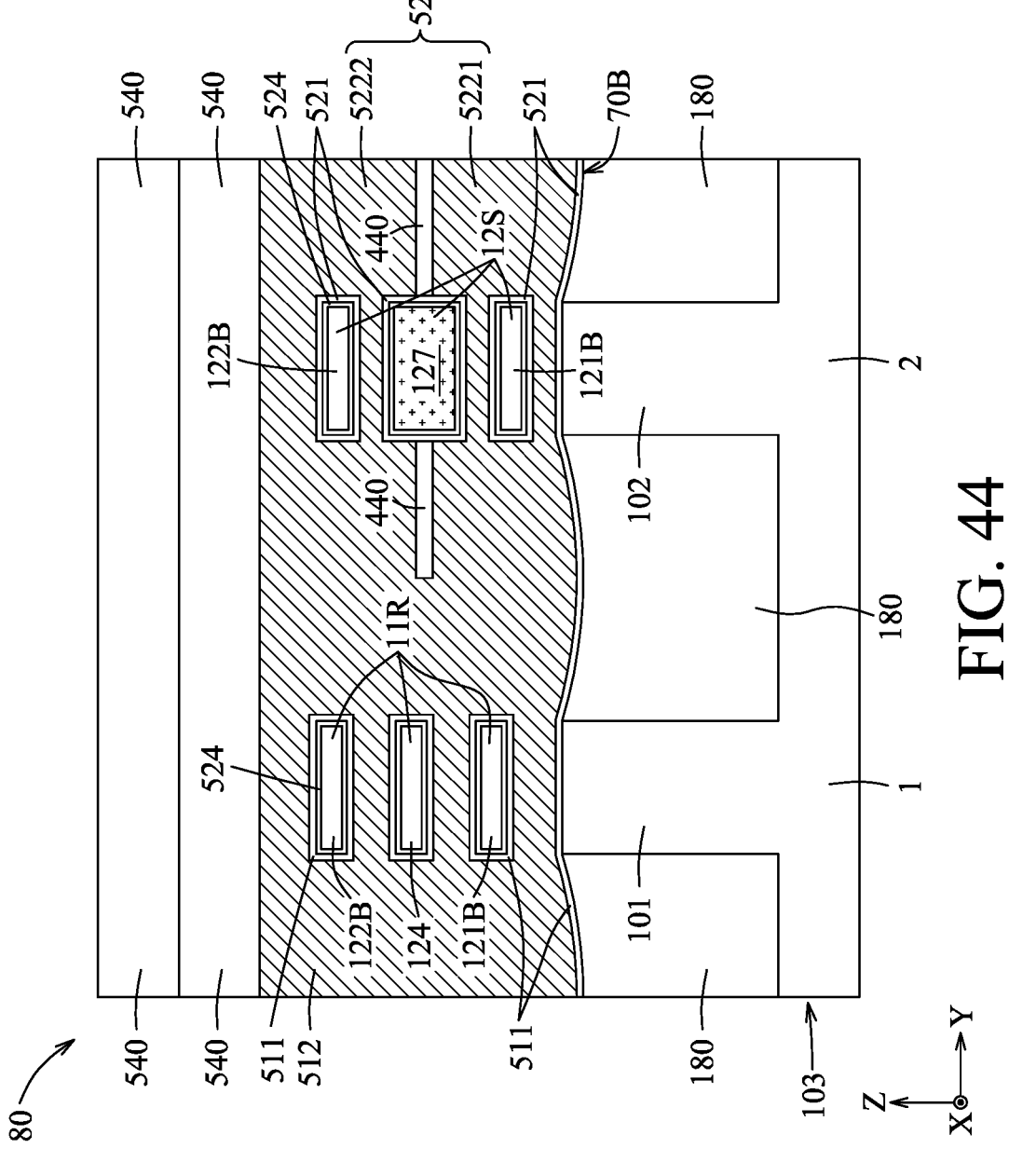

It is noted that a number of the first channel layers 80E is designed to be greater than a number of the at least one lower channel layer 80A, and greater than a number of the at least one upper channel layer 80B. In some embodiments, as shown in FIG. 44, a number of the first channel layers 80E is three, but is not limited thereto, and may vary according to practical applications. In some other not shown embodiments, the number of the first channel layers 80E may be two to four.

Since the first and second laminated structures 81, 82 are formed on the unipolar region 1 and the CFET region 2, respectively using two different deposition processes, a total number of the layers 80E, 80F in the first laminated structure 81 may be the same as or different from a total number of the layers 80A, 80B, 80C, 80D in the second laminated structure 82. Furthermore, each of the first channel layers 80E may have a thickness which is the same as or different from that of each of the lower and upper channel layers 80A, 80B, and each of the first sacrificial layers 80F may have a thickness which is the same as or different from that of each of the second sacrificial layers 80D.

In some embodiments, step S21 may include sub-steps illustrated in FIGS. 28 to 31 in accordance with some embodiments, where the first laminated structure 81 is formed after formation of the second laminated structure 82. In some not shown embodiments, the first laminated structure 81 may be formed before formation of the second laminated structure 82.

Figure 28:
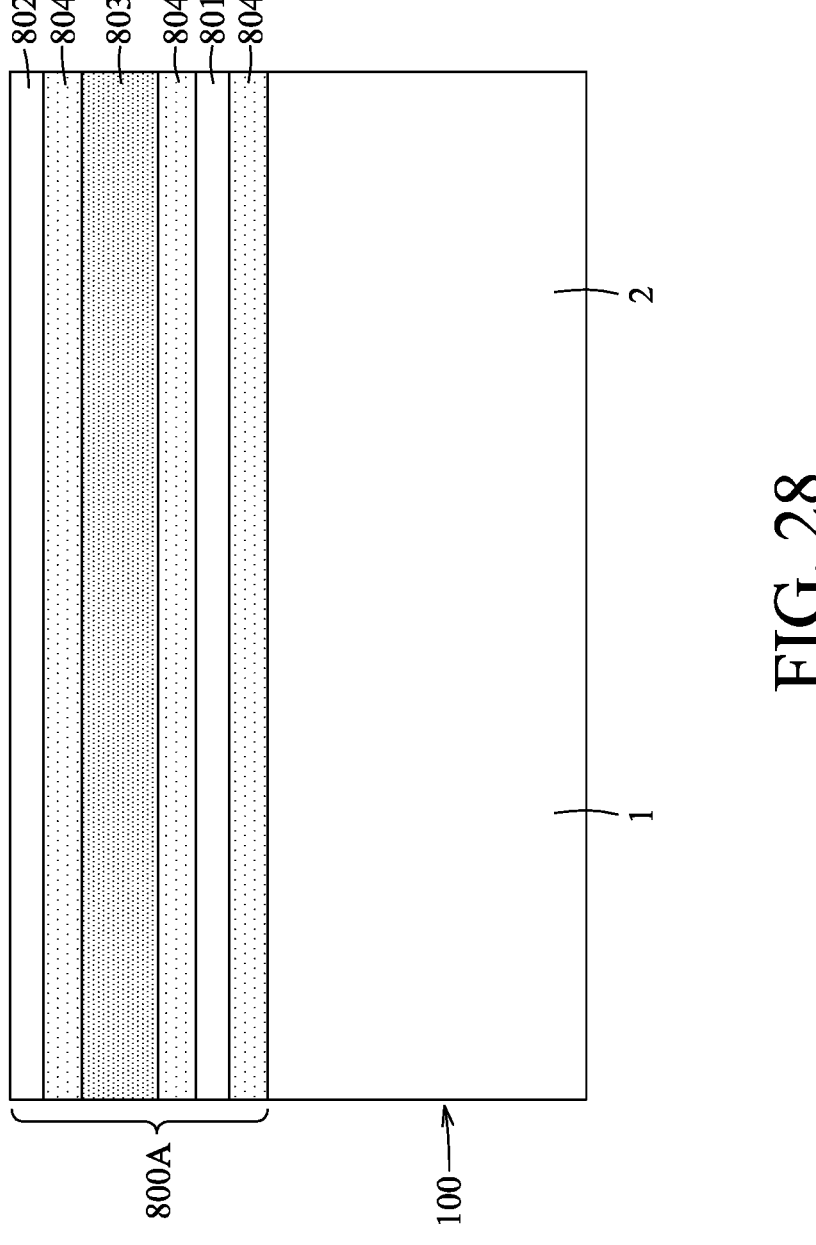
FIGS. 28 to 46 illustrate schematic views of intermediate stages of the method depicted in FIG. 40 in accordance with some embodiments.

Referring to FIG. 28, a first stack structure 800A is formed to cover the unipolar region 1 and the CFET region 2 of the starting substrate 100, and includes a stack of semiconductor material layers 801, 802, 803, 804 respectively for forming the layers 80A, 80B. 80C, 80D, using a manner similar to that for forming the laminated structure 110 as described above with reference to FIG. 2.

Figure 29:
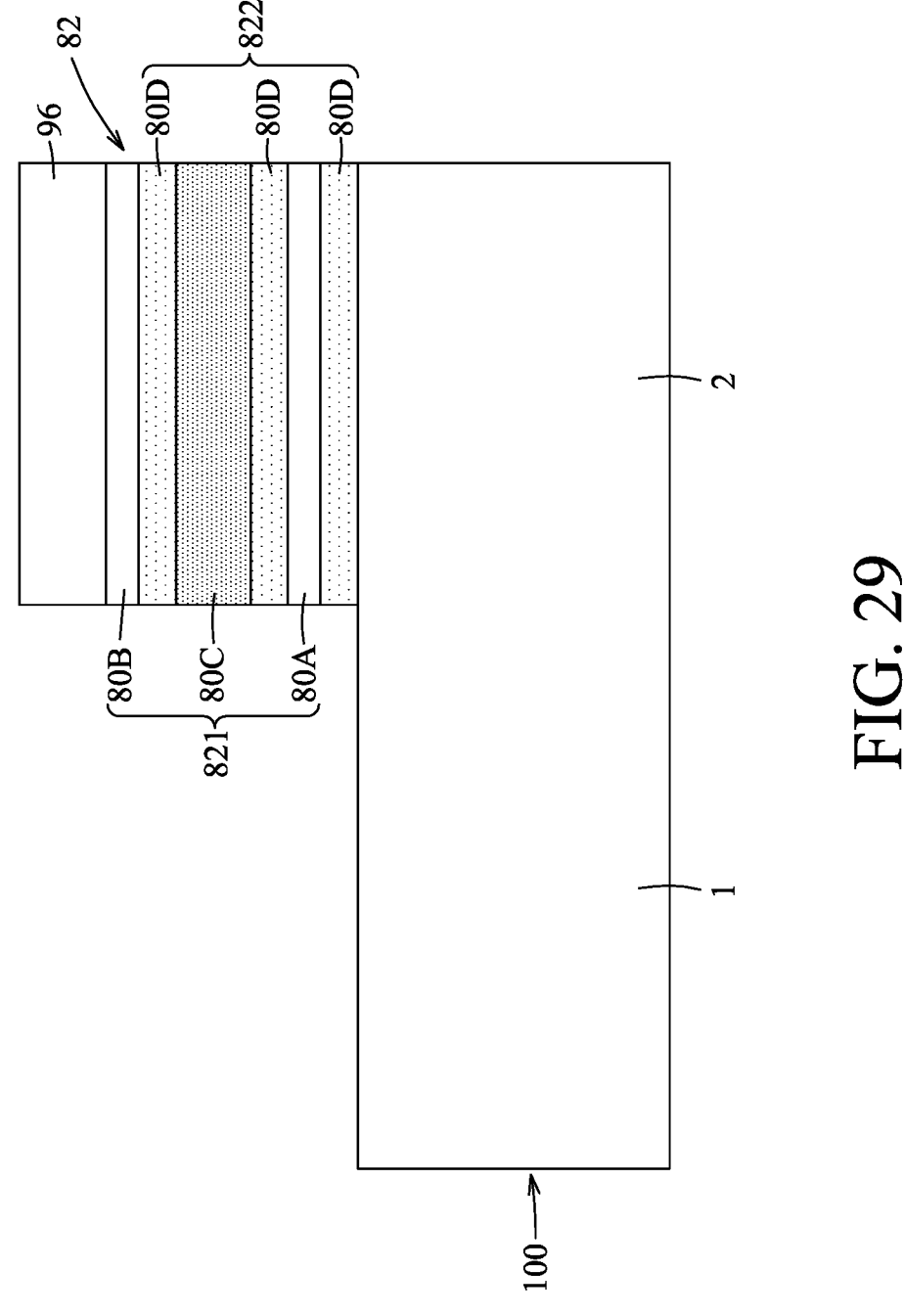

Referring to FIG. 29, a patterned mask 96 is formed to cover the first stack structure 800A (see FIG. 28) at the CFET region 2, followed by removing a portion of the first stack structure 800A at the unipolar region 1 exposed from the patterned mask 96. As such, a remaining portion of the first stack structure 800A serves as the second laminated structure 82.

Figure 30:
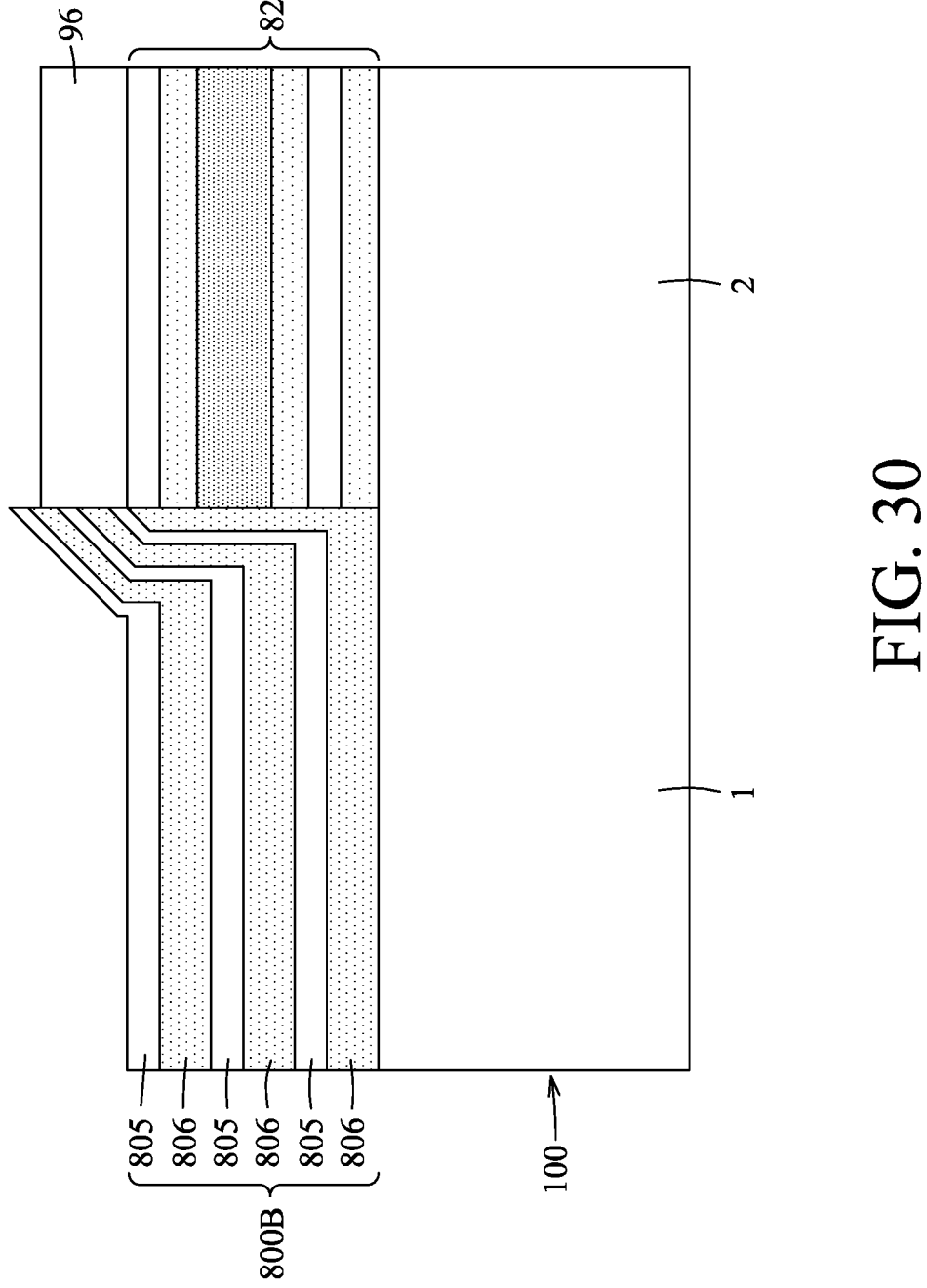

Referring to FIG. 30, a second stack structure 800B, which includes a stack of semiconductor material layers 805, 806 respectively for forming the layers 80E, 80F, is formed on the unipolar region 1 of the starting substrate 100 using a manner similar to that for forming the laminated structure 110 as described above with reference to FIG. 2.

Referring to FIG. 31, a planarization process, for example, but not limited to, CMP, is performed to remove the patterned mask 96 and to expose the second laminated structure 82, thereby obtaining the first laminated structure 81.

Figure 32:
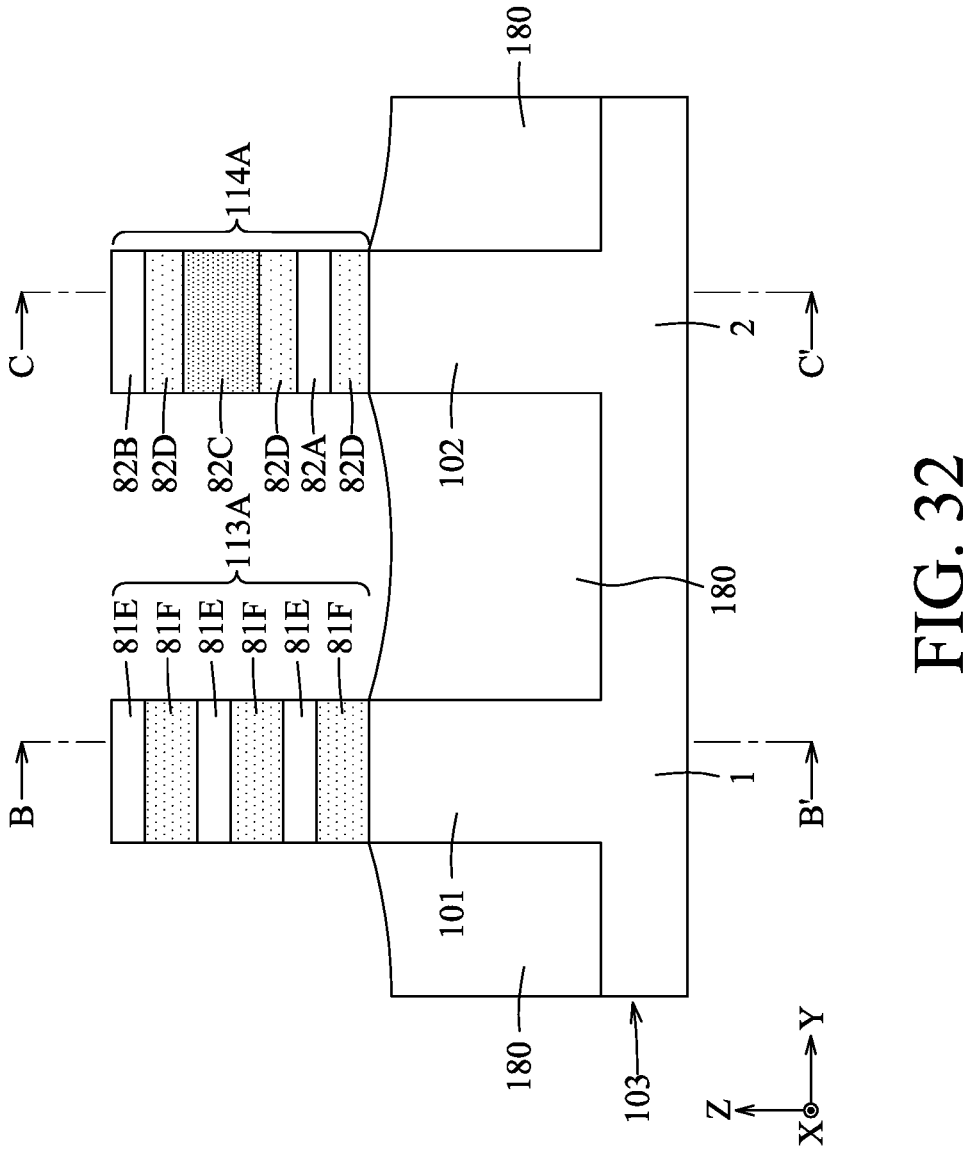
Figure 34:
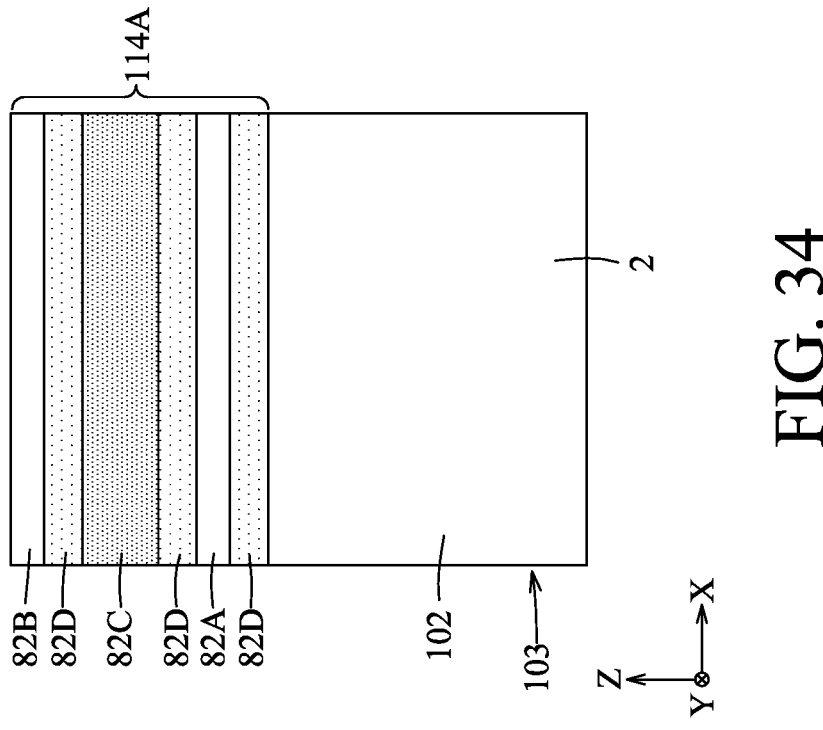
Figure 33:
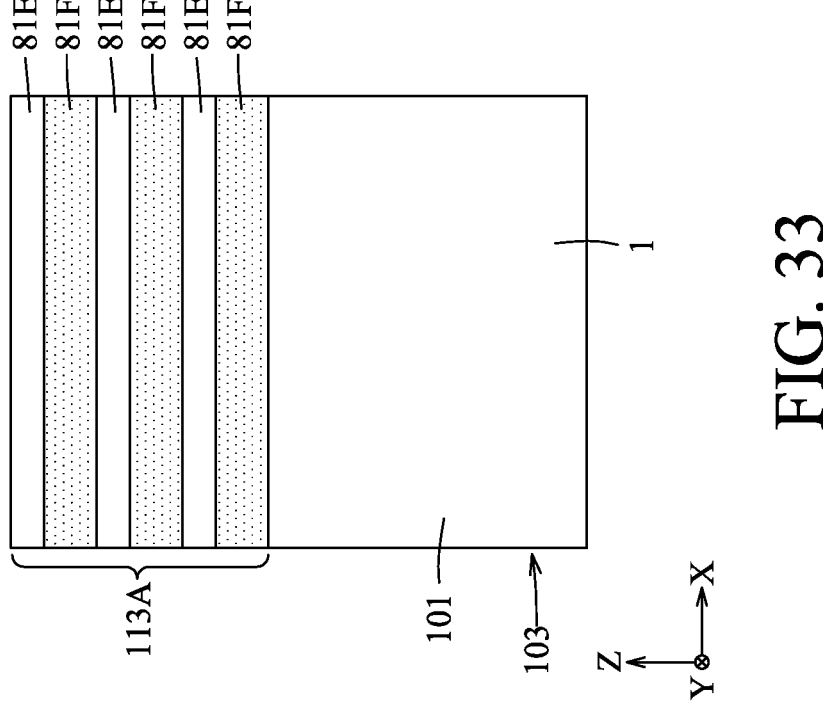

Referring to FIG. 27 and the examples illustrated in FIG. 32, the method 20 proceeds to step S22, where the first laminated structure 81 is patterned into a first stack portion 113A disposed on a first fin portion 102, and the second laminated structure 82 is patterned into a second stack portion 114A disposed on a second fin portion 103. The first stack portion 113A including a plurality of first channel films 81E which are patterned from the first channel layers 80E and a plurality of first sacrificial films 81F which are patterned from the first sacrificial layers 80F. The second stack portion 114A includes a lower channel film 82A which is patterned from the lower channel layer 80A, an upper channel film 82B which is patterned from the upper channel layer 80B, a preformed film 82C which is patterned from the preformed layer 80C, and a plurality of second sacrificial films 82D which are patterned from the second sacrificial layers 80D. In some embodiments, as shown in FIG. 32, the first and second fin portions 101, 102 respectively at the unipolar and CFET regions 1, 2 are spaced apart from each other in the Y direction and are formed at two different fin structures using the method 20. In some other embodiments not shown, the first and second fin portions 101, 102 respectively at the unipolar and CFET regions 1, 2 may be formed in two parts of a single fin structure using the method 20 and are displaced from each other in the X direction. FIGS. 33 and 34 are schematic cross-sectional view taken along lines B-B' and C-C' of FIG. 32, respectively.

Furthermore, step 22 may further include forming the isolation regions 180 (see FIG. 32) at two opposite sides of each of the first and second fin portions 101, 102.

Figure 35:
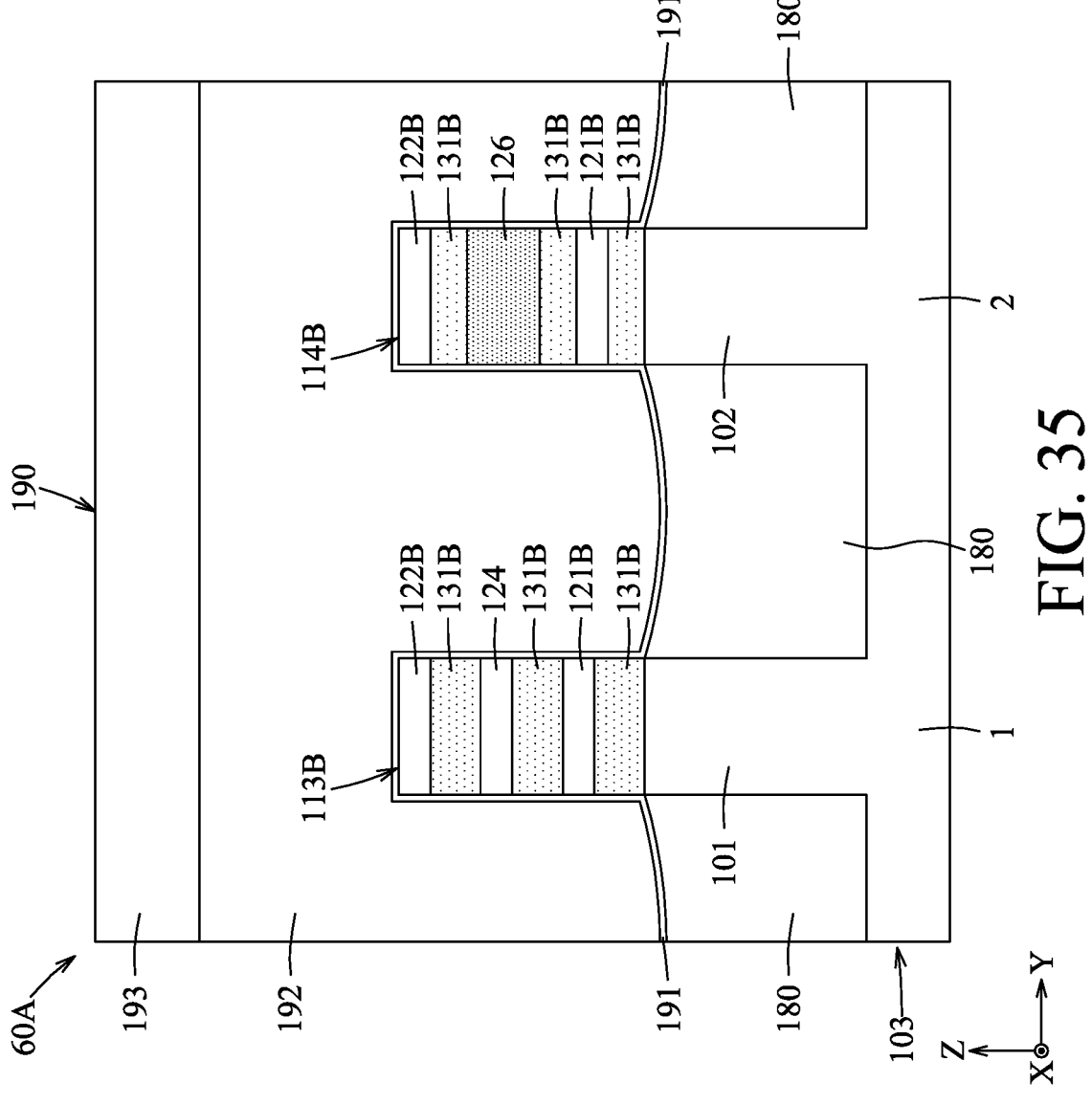
Figure 37:
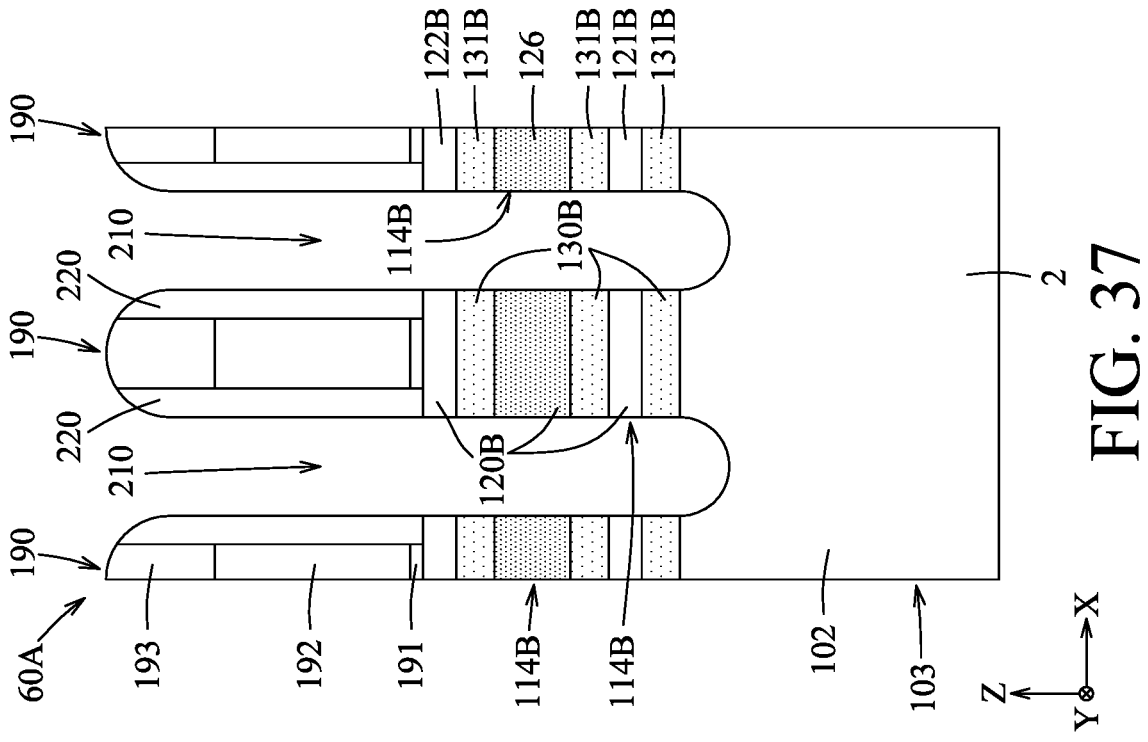
Figure 36:
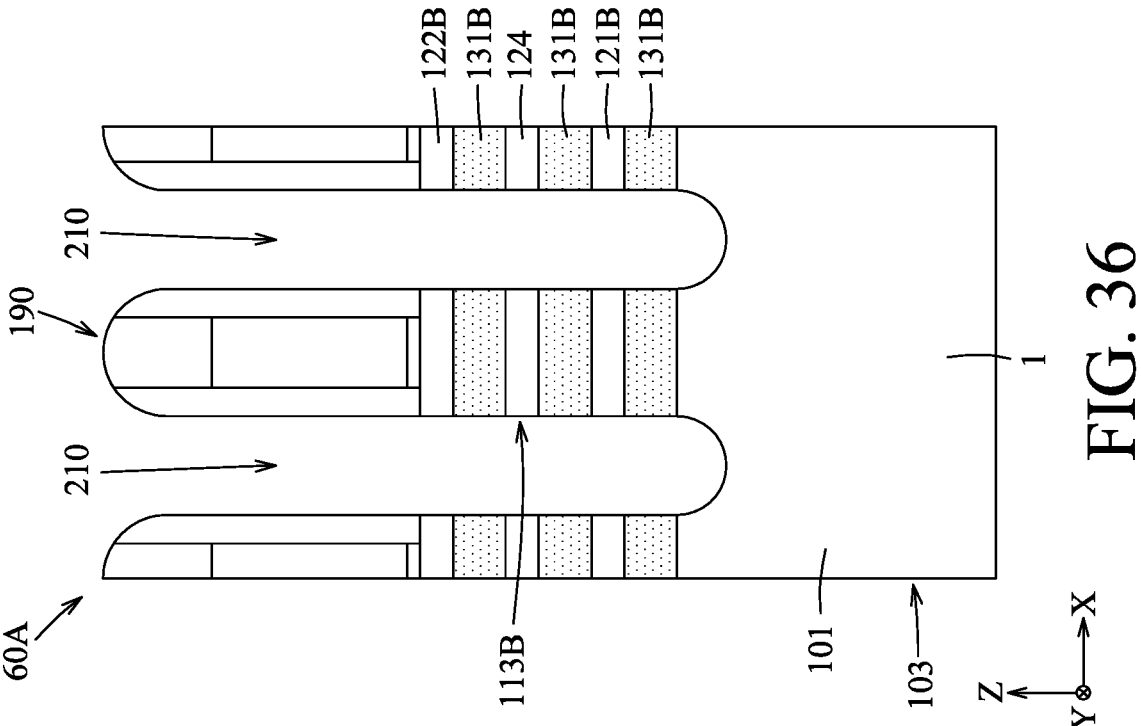

Referring to FIG. 27 and the examples illustrated in FIGS. 35 to 37, the method 20 proceeds to step S23, where a patterned structure 60A is formed. FIGS. 35 to 37 are views respectively subsequent to FIGS. 32 to 34 for illustrating the structure after step S23.

The patterned structure 60A, which is formed from the first stack portion 113A and the second stack portion 114A, has a structure similar to that of the patterned structure 60 shown in FIGS. 8 and 9, but has the differences as described in the following. In some embodiments, step S23 includes sub-steps (i) and (ii). In sub-step (i) of step S23, the dummy gate portions 190 (see FIGS. 35 to 37) are formed over the first and second stack portions 113A, 114A (see FIGS. 32 to 34), followed by forming the multiple pairs of the gate spacers 220. In sub-step (ii) of step S23, the first and second stack portions 113A, 114A (see FIGS. 32 to 34) are patterned to form the source/drain recesses 210 (see FIGS. 36 and 37) and are respectively formed into the first and second stack units 113B, 114B shown in FIGS. 35 to 37. Each pair of the source/drain recesses 210 are respectively disposed at the two opposite sides of the corresponding one of the first and second stack units 113B, 114B. In details, in sub-step (ii) of step S23, the first channel films 81E (see FIGS. 32 and 33) are patterned into first channel portions (i.e., the lower, middle and upper channel portions 121B, 124, 122B in the first stack unit 113B, see FIGS. 35 and 36); the first sacrificial films 81F (see FIGS. 32 and 33) are patterned into first sacrificial portions (i.e., the sacrificial portions 131B in the first stack unit 113B, see FIGS. 35 and 36); the lower channel film 82A, the preformed film 82C and the upper channel film 82B (see FIGS. 32 and 34) are respectively patterned into the lower channel portion 121B, the preformed portion 126, and the upper channel portion 122B in the second stack unit 114B (see FIGS. 35 and 37); and the second sacrificial films 82D (see FIGS. 32 and 34) are patterned into second sacrificial portions (i.e., the sacrificial portions 131B in the second stack unit 114B, see FIGS. 35 and 37).

Figure 38:
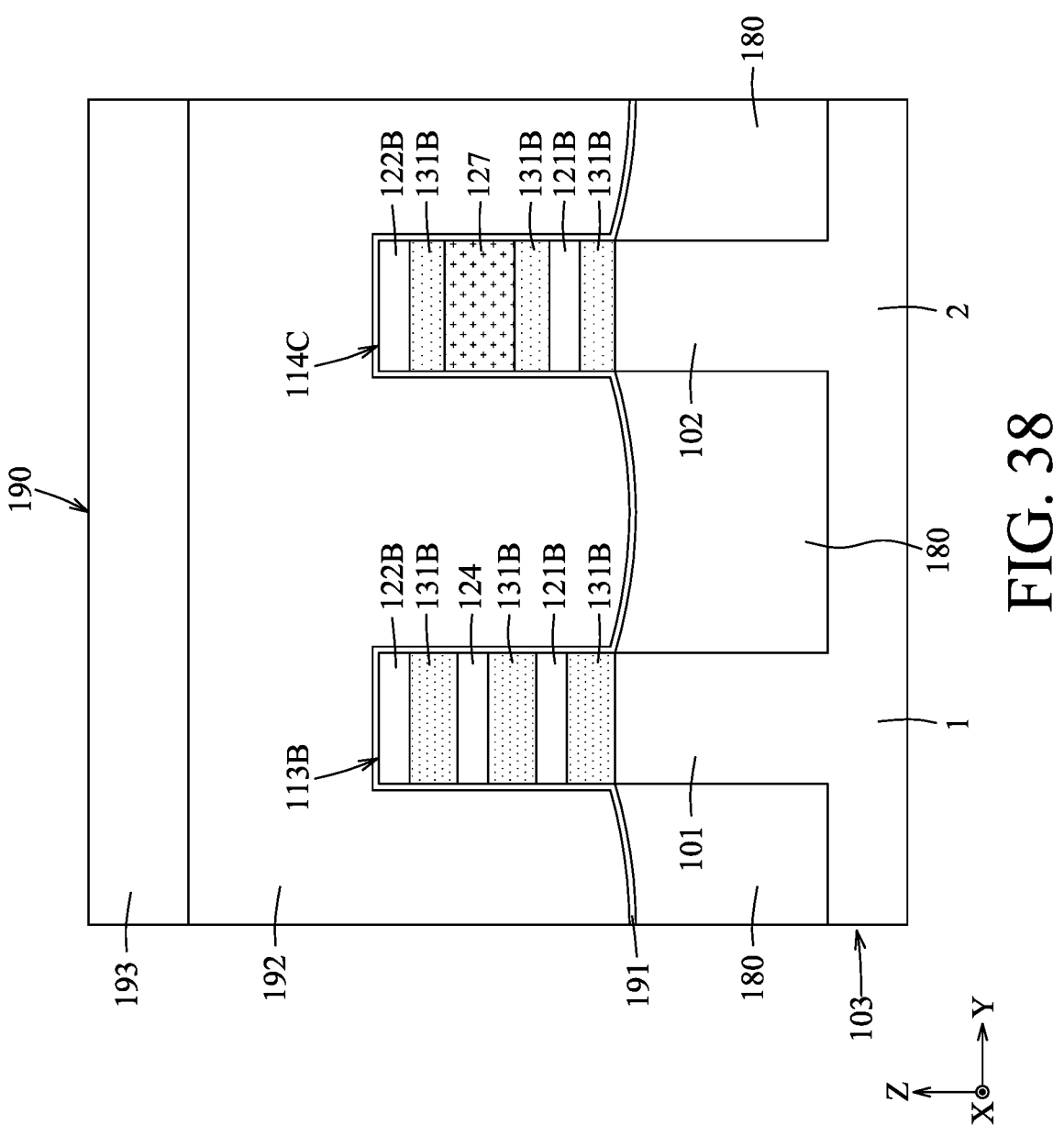
Figure 39:
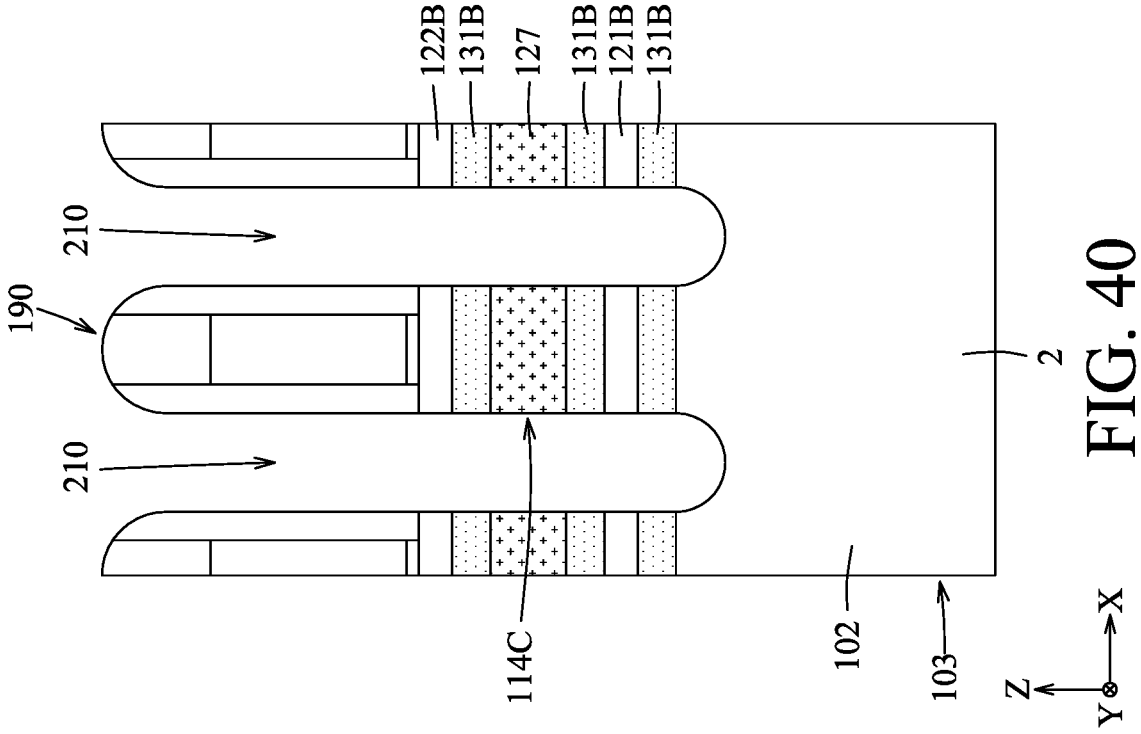
Figure 40:
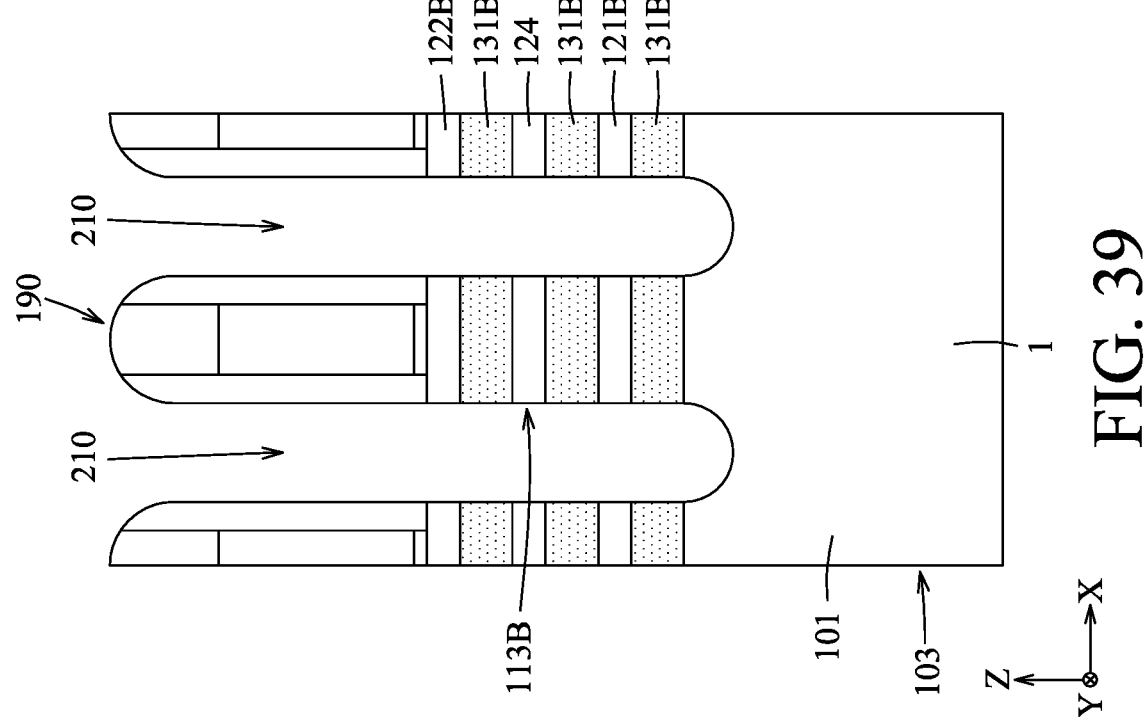

Referring to FIG. 27 and the examples illustrated in FIGS. 38 to 40, the method 20 proceeds to step S24, where the preformed portion 126 in the second stack unit 114B (see FIGS. 35 and 37) is replaced with a middle isolation portion 127 to obtain a second stack unit 114C. FIGS. 38 to 40 are views respectively subsequent to FIGS. 35 to 37 for illustrating the structures after step S24. Since the preformed portion 126 has a thickness greater than that of each of the lower and upper channel portions 121B, 122B, the middle isolation portion 127 has a thickness greater than that of each of the lower and upper channel portions 121B, 122B. In some embodiments, the preformed portion 126 is replaced in a manner similar to the process for replacing the preformed portion 123B in the second stack unit 112B (see FIG. 8) with the middle isolation portion 125 (see FIG. 13) and thus details thereof are omitted for the sake of brevity.

Figure 41:
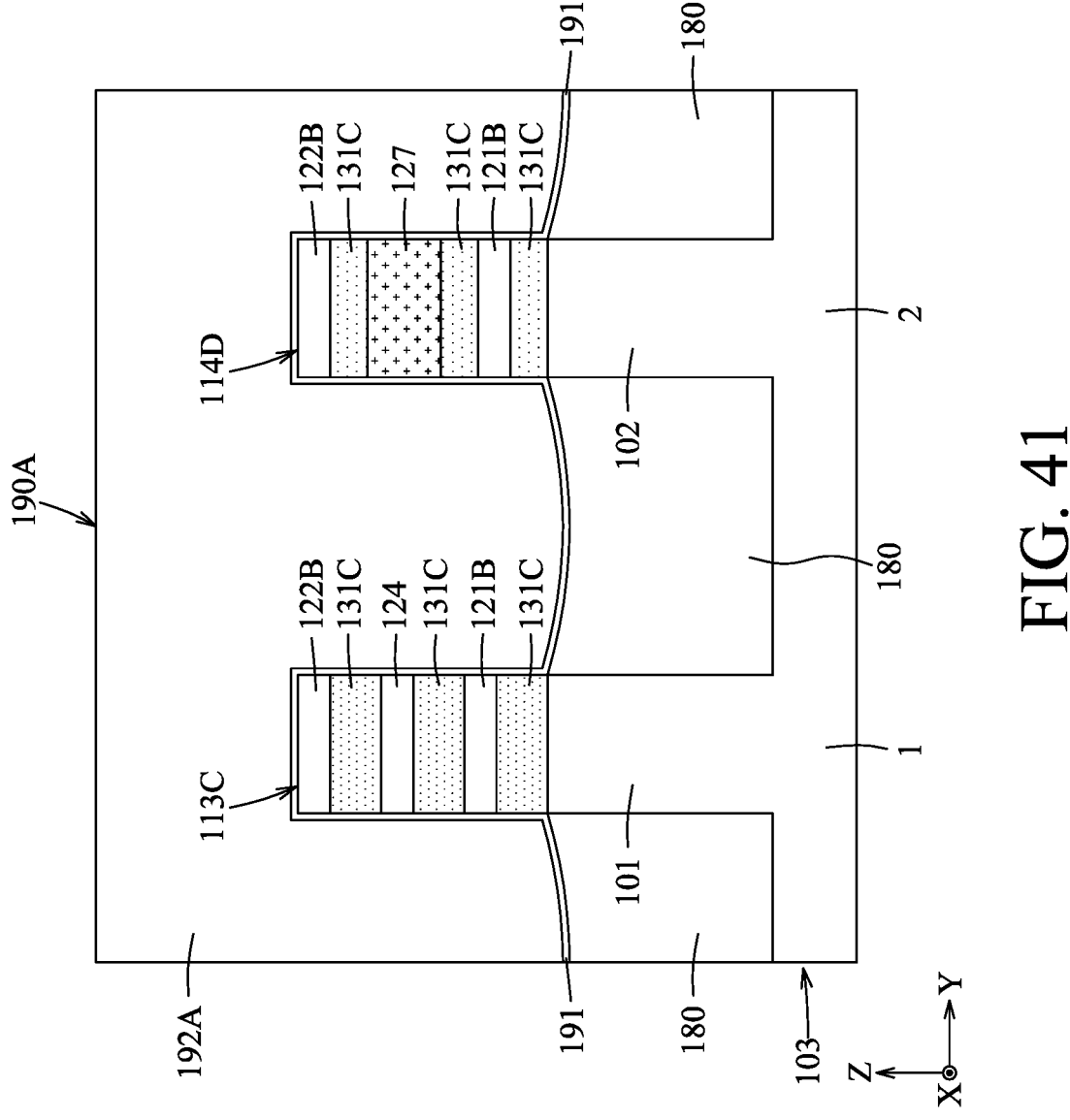
Figure 43:
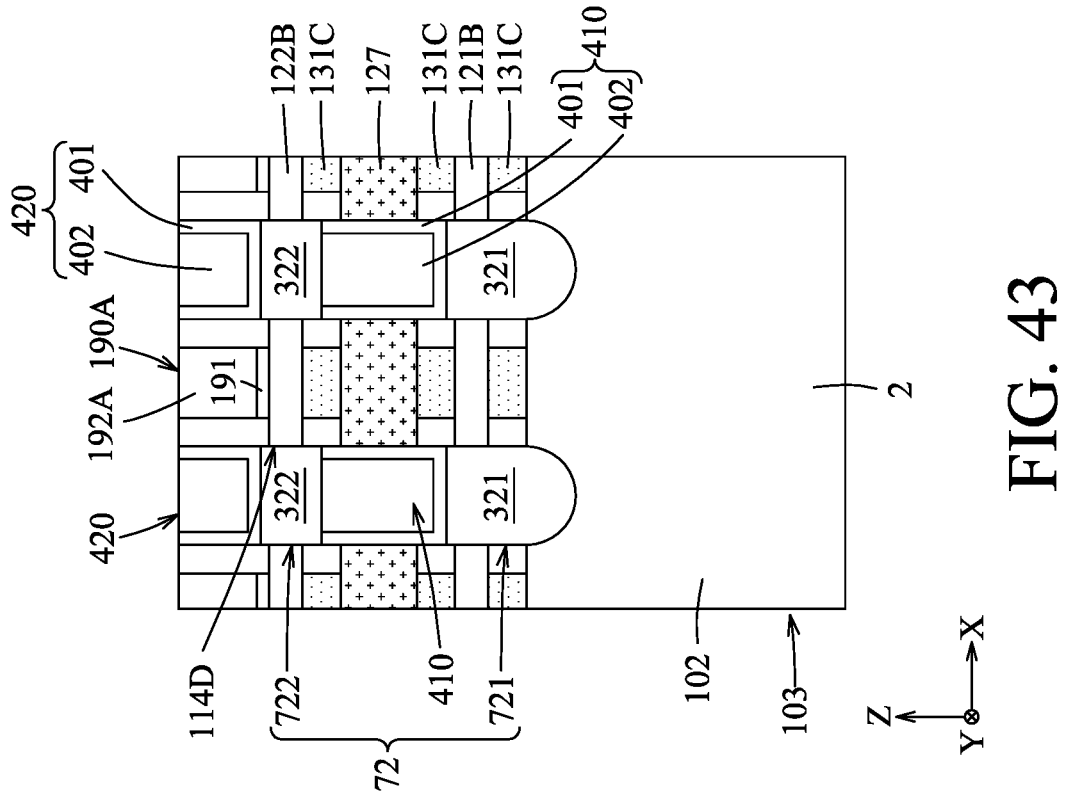
Figure 42:
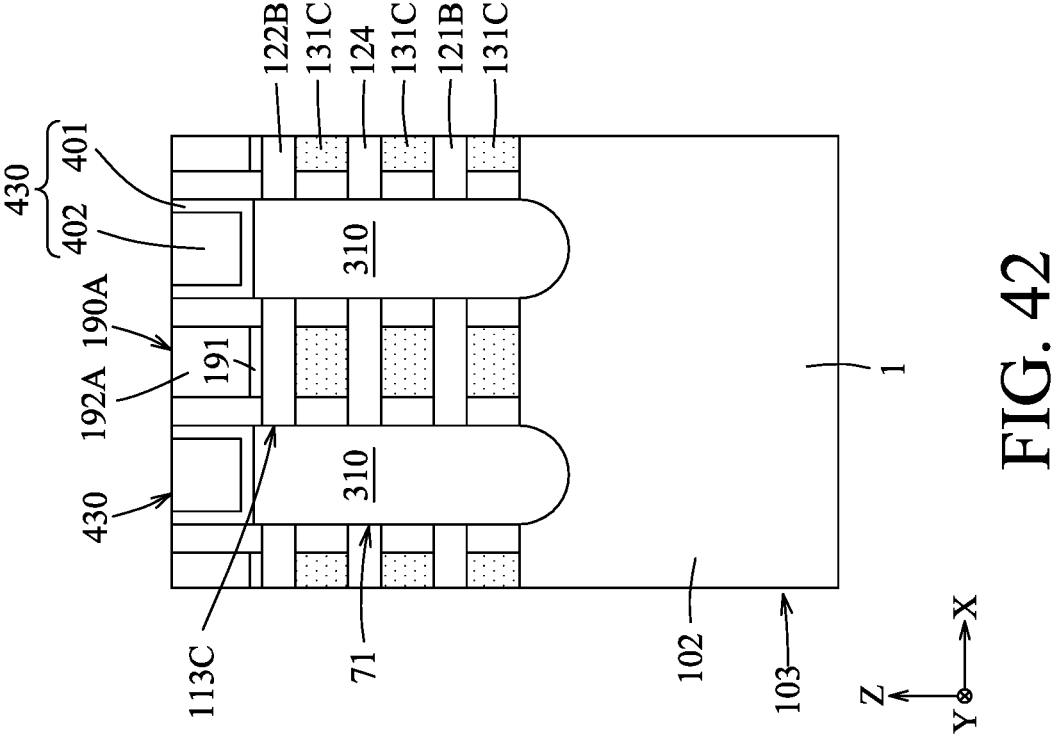

Referring to FIG. 27 and the examples illustrated in FIGS. 41 to 43, the method 20 proceeds to step S25, where the inner spacers 240, the first source/drain portions 310, and the lower and upper source/drain portions 321, 322 are formed. Since step S25 may be performed in a manner similar to step 14, thus details thereof are omitted for the sake of brevity. After formation of the inner spacers 240 is formed, the first and second stack units 113B, 114C (see FIGS. 38 to 40) are respectively formed into first and second stack units 113C, 114D (see FIGS. 41 to 43), and the first and second sacrificial portions 131B (respectively at the unipolar and CFET regions 1, 2, see FIGS. 38 to 40) are recessed and formed into first and second sacrificial portions 131C (see FIGS. 42 and 43).

Referring to FIG. 27 and the examples illustrated in FIGS. 44 to 46, the method 20 proceeds to step S26, where a replacement gate process is performed, thereby obtaining the semiconductor structure 80. FIGS. 44 to 46 are views respectively subsequent to FIGS. 41 to 43 for illustrating the structures after step S26.

The semiconductor structure 80 has a structure similar to that of the semiconductor structure 70 shown in FIGS. 24 to 26, but has the differences as described in the following.

In step S26, the remaining dummy gate portion 190A (see FIGS. 41 and 43) on the second stack unit 114D and the sacrificial portions 131C in the second stack unit 114D are removed to form a third cavity (not shown). The lower and upper channel portions 121B. 122B, and the middle isolation portion 127 remaining in the second stack unit 114D and exposed from the third cavity are together referred to as a second stack 12S (see FIGS. 44 and 46). Afterwards, the second gate dielectric 521 and the second gate electrode 522 are sequentially formed in the third cavity.

It is noted that, in some embodiments, as shown in FIGS. 44 and 46, the second gate electrode 522 may include a lower gate part 5221 and an upper gate part 5222 spaced apart from each other in the Z direction. The lower gate part 5221 is disposed around the lower channel portion 121B in the second stack 12S such that the lower channel portion 121B is separated from the lower gate part 5221 by the second gate dielectric 521. The upper gate part 5222 is disposed above the lower gate part 5221, and is disposed around the upper channel portion 122B in the second stack 12S such that the upper channel portion 122B is separated from the upper gate part 5222 by the second gate dielectric 521. In some embodiments, as shown in FIG. 56, the semiconductor structure 80 further includes two isolation features 440, each of which is formed between the lower and upper gate parts 5221, 5222 for isolation. In some embodiments, the isolation features 440 may be made of a low-k dielectric material (such as the examples described in the preceding paragraph). Each of the isolation features 440 may be configured as a single layer structure or a multi-layered structure. Other suitable materials and/or configurations for the isolation features 440 are within the contemplated scope of the present disclosure. It is noted that, the middle isolation portion 127, which is surrounded by a portion of the second gate dielectric 521, extends between the two isolation features 440, and thus the middle isolation portion 127, the portion of the second gate dielectric 521 and the isolation features 440 may together isolate the lower gate part 5221 from the upper gate part 5222. Since the middle isolation portion 127 has a relatively great thickness, the isolation features 440 are liable to be formed on the lower gate part 5221 and at two opposite sides of the middle isolation portion 127, using a suitable deposition processes (for example, but not limited to, CVD, or ALD), followed by a suitable etching back process.

In some embodiments, some steps in the method 20 may be modified, replaced, or eliminated without departure from the spirit and scope of the present disclosure. In some alternative embodiments, the semiconductor structure 80 may further include additional features, and/or some features present in the semiconductor structure 80 may be modified, replaced, or eliminated without departure from the spirit and scope of the present disclosure. For example, in some embodiments, the semiconductor structure 80 may further include the interfacial layers 524, the front-side contact features 531, the metal silicide features 534, and the front-side interconnect layers 540 as described above with reference to FIGS. 24 to 26, and details thereof are omitted for the sake of brevity.

In this disclosure, the semiconductor structure is provided to integrate two types of device (i.e., the first device unit which includes a non-stacked device, and the second device unit which has a CFET structure and which includes a stack of the lower and upper devices) on the same wafer. In addition to achievement of high integration density of the second device unit, it is worth noting that the non-stacked device has a number of channels which is not limited to be equal to a number of channel(s) in each of the lower and upper devices, and which can even be greater than the number of channel(s) in each of the lower and upper devices, such that the non-stacked device, which may be used as a power switch, may have an improved switching performance (e.g., switching frequency, etc.). Furthermore, the middle isolation portion for isolating the lower and upper devices in the second device unit can be formed with a thickness equal to or greater than that of the channel(s) in each of the lower device, the upper device and the first device unit. Therefore, the methods for making the semiconductor structure provided in this disclosure enable implementation of various circuit design.

In accordance with some embodiments of the present disclosure, a semiconductor structure includes a substrate, a first device unit, and a second device unit. The substrate includes a first region and a second region which is displaced from the first region. The first device unit is disposed on the first region, and includes a plurality of first channel portions spaced apart from each other, and two first source/drain portions spaced apart from each other such that each of the first channel portions extends between the first source/drain portions. The second device unit is disposed on the second region, and includes a lower device and an upper device. The lower device is disposed on the second region and includes at least one lower channel portion and two lower source/drain portions spaced apart from each other such that the at least one lower channel portion extends between the lower source/drain portions. The upper device is disposed above and spaced apart from the lower device, and includes at least one upper channel portion and two upper source/drain portions spaced apart from each other such that the at least one upper channel portion extends between the upper source/drain portions. A number of the first channel portions in the first device unit is greater than a number of the at least one lower channel portion in the lower device and greater than a number of the at least one upper channel portion in the upper device.

In accordance with some embodiments of the present disclosure, the second device unit further includes a middle isolation portion which is disposed between and spaced apart from the at least one lower channel portion and the at least one upper channel portion.

In accordance with some embodiments of the present disclosure, the middle isolation portion has a length in an X direction which is the same as that of each of the at least one lower channel portion and the at least one upper channel portion.

In accordance with some embodiments of the present disclosure, the middle isolation portion has a thickness in a Z direction transverse to the X direction which is the same as that of each of the first channel portions, and which is the same as that of each of the at least one lower channel portion and the at least one upper channel portion.

In accordance with some embodiments of the present disclosure, the middle isolation portion has a thickness in the Z direction which is greater than that of each of the first channel portions, and which is greater than that of each of the at least one lower channel portion and the at least one upper channel portion.

In accordance with some embodiments of the present disclosure, an uppermost one of the first channel portions has an upper surface which is flush with an upper surface of an uppermost one of the at least one upper channel portion.

In accordance with some embodiments of the present disclosure, the second device unit further includes two isolation features, each of which is disposed between one of the lower source/drain portions and a corresponding one of the upper source/drain portions.

In accordance with some embodiments of the present disclosure, the middle isolation portion extends between the two isolation features, such that the middle isolation portion and the isolation features together isolate the lower and upper devices.

In accordance with some embodiments of the present disclosure, the semiconductor structure further includes a first gate dielectric, a first gate electrode, a second gate dielectric, and a second gate electrode. The first gate dielectric is disposed around each of the first channel portions. The first gate electrode is disposed on the first gate dielectric such that each of the first channel portions is separated from the first gate electrode by the first gate dielectric. The second gate dielectric is disposed around each of the at least one lower channel portion, the at least one upper channel portion and the middle isolation portion. The second gate electrode is disposed on the second gate dielectric such that each of the at least one lower channel portion, the at least one upper channel portion, and the middle isolation portion is separated from the second gate electrode by the second gate dielectric.

In accordance with some embodiments of the present disclosure, the semiconductor structure further includes a first gate dielectric, a first gate electrode, a second gate dielectric, and a second gate electrode. The first gate dielectric is disposed around each of the first channel portions. The first gate electrode is disposed on the first gate dielectric such that each of the first channel portions is separated from the first gate electrode by the first gate dielectric. The second gate dielectric is disposed around each of the at least one lower channel portion, the at least one upper channel portion and the middle isolation portion. The second gate electrode includes a lower gate part and an upper gate part. The lower gate part is disposed around the at least one lower channel portion such that the at least one lower channel portion is separated from the lower gate part by the second gate dielectric. The upper gate part is disposed above and spaced apart from the lower gate part, and is disposed around the at least one upper channel portion such that the at least one upper channel portion is separated from the upper gate part by the second gate dielectric.

In accordance with some embodiments of the present disclosure, the semiconductor structure further includes an isolation feature disposed between the lower gate part and the upper gate part.

In accordance with some embodiments of the present disclosure, a method for manufacturing a semiconductor structure, includes: forming a first fin portion and a second fin portion on a semiconductor substrate, the first and second fin portions being displaced from each other; forming a first stack on the first fin portion, the first stack including at least one lower channel portion, at least one upper channel portion, and a middle channel portion which is formed between and spaced apart from the at least one lower channel portion and the at least one upper channel portion; forming a second stack on the second fin portion, the second stack including at least one lower channel portion, at least one upper channel portion, and a middle isolation portion which is formed between and spaced apart from the at least one lower channel portion and the at least one upper channel portion; forming two first source/drain portions on the first fin portion, the first source/drain portions being spaced apart from each other such that each of the at least one lower channel portion, the at least one upper channel portion and the middle channel portion in the first stack extends between the first source/drain portions; forming two lower source/drain portions on the second fin portion, the lower source/drain portions being spaced apart from each other such that the at least one lower channel portion in the second stack extends between the lower source/drain portions; and forming two upper source/drain portions which are respectively above and spaced apart from the lower source/drain portions such that the at least one upper channel portion in the second stack extends between the upper source/drain portions. A first sum of a number of the at least one lower channel portion, a number of the at least one upper channel portion and a number of the middle channel portion in the first stack is greater than a number of the at least one lower channel portion in the second stack and greater than a number of the at least one upper channel portion in the second stack.

In accordance with some embodiments of the present disclosure, formation of the first and second stacks includes: forming a first stack unit and a second stack unit respectively on the first fin portion and the second fin portion, each of the first and second stack units including a first set of portions which include the at least one lower channel portion, the at least one upper channel portion and a preformed portion that is disposed between and spaced apart from the at least one lower channel portion and the at least one upper channel portion, and a second set of portions which include at least three sacrificial portions, and which are disposed to alternate with the first set of portions, a bottommost one of the at least three sacrificial portions being disposed on a corresponding one of the first and second fin portions; replacing the preformed portion in the first stack unit with the middle channel portion; removing the at least three sacrificial portions in the first stack unit, thereby obtaining the first stack on the first fin portion; replacing the preformed portion in the second stack unit with the middle isolation portion; and removing the at least three sacrificial portions in the second stack unit, thereby obtaining the second stack on the second fin portion.

In accordance with some embodiments of the present disclosure, the at least one lower channel portion, the at least one upper channel portion and the middle channel portion are made of a first semiconductor material. The at least three sacrificial portions are made of a second semiconductor material. The preformed portion is made of a third semiconductor material. The first, second and third semiconductor materials have different chemical compositions from one another such that the first, second and third semiconductor materials have different etching selectivity ratios from one another.

In accordance with some embodiments of the present disclosure, formation of the first and second stack units includes: forming a laminated structure on a starting substrate, the laminated structure including a first set of layers which include at least one lower channel layer, at least one upper channel layer and a preformed layer that is disposed between and spaced apart from the at least one lower channel layer and the at least one upper channel layer, and a second set of layers which include at least three sacrificial layers, and which are disposed to alternate with the first set of layers, a bottommost one of the at least three sacrificial layers being disposed on the starting substrate; and performing a patterning process such that the starting substrate is patterned into the semiconductor substrate and the first and second fin portions which are formed on the semiconductor substrate, the at least one lower channel layer, the at least one upper channel layer and the preformed layer are respectively patterned into the at least one lower channel portion, the at least one upper channel portion and the preformed portion in each of the first and second stack units, and the at least three sacrificial layers are respectively patterned into the at least three sacrificial portions in each of the first and second stack units.

In accordance with some embodiments of the present disclosure, formation of the first and second stacks includes: forming a first laminated structure on a first region of a starting substrate, the first laminated structure including at least three first channel layers and at least three first sacrificial layers disposed to alternate with the at least three first channel layers, a bottommost one of the at least three first sacrificial layers being disposed on the first region of the starting substrate; forming a second laminated structure on a second region of the starting substrate, the first and second regions being displaced from each other, the second laminated structure including a first set of layers which include at least one lower channel layer, at least one upper channel layer and a preformed layer that is disposed between and spaced apart from the at least one lower channel layer and the at least one upper channel layer, and a second set of layers which include at least three second sacrificial layers, and which are disposed to alternate with the first set of layers, a bottommost one of the at least three second sacrificial layers being disposed on the second region of the starting substrate; performing a patterning process such that the starting substrate is patterned into the semiconductor substrate and the first and second fin portions, the at least three first channel layers are respectively patterned into the at least one lower channel portion, the at least one upper channel portion and the middle channel portion in the first stack, the at least three first sacrificial layers are respectively patterned into at least three first sacrificial portions, the at least one lower channel layer and the at least one upper channel layer are respectively patterned into the at least one lower channel portion and the at least one upper channel portion in the second stack, the preformed layer is patterned into a preformed portion, and the at least three second sacrificial layers are respectively patterned into at least three second sacrificial portions; replacing the preformed portion with the middle isolation portion; and removing the at least three first sacrificial portions and the at least three second sacrificial portions.

In accordance with some embodiments of the present disclosure, a method for manufacturing a semiconductor structure includes: forming a first fin portion and a second fin portion on a semiconductor substrate, the first and second fin portions being displaced from each other; forming a first stack on the first fin portion, the first stack including a plurality of first channel portions spaced apart from each other; forming a second stack on the second fin portion, the second stack including at least one lower channel portion, at least one upper channel portion and a middle isolation portion which is formed between and spaced apart from the at least one lower channel portion and the at least one upper channel portion; forming two first source/drain portions on the first fin portion, the first source/drain portions being spaced apart from each other such that each of the first channel portions extends between the first source/drain portions; forming two lower source/drain portions on the second fin portion, the lower source/drain portions being spaced apart from each other such that the at least one lower channel portion extends between the lower source/drain portions; forming two upper source/drain portions which are respectively above and spaced apart from the lower source/drain portions such that the at least one upper channel portion extends between the upper source/drain portions; and forming two isolation features each of which is formed between one of the lower source/drain portions and a corresponding one of the upper source/drain portions. A number of the first channel portions is greater than a number of the at least one lower channel portion and greater than a number of the at least one upper channel portion.

In accordance with some embodiments of the present disclosure, formation of the first and second stacks includes: forming a first laminated structure on a first region of a starting substrate, the first laminated structure including a plurality of first channel layers and a plurality of first sacrificial layer formed to alternate with the first channel layers, a bottommost one of the first sacrificial layers being formed on the first region of the starting substrate; forming a second laminated structure on a second region of the starting substrate, the second laminated structure including a first set of layers which include at least one lower channel layer, at least one upper channel layer and a preformed layer that is disposed between and spaced apart from the at least one lower channel layer and the at least one upper channel layer, and a second set of layers which include at least three second sacrificial layers and which are disposed to alternate with the first set of layers, a bottommost one of the at least three second sacrificial layers being disposed on the second region of the starting substrate; performing a patterning process, such that the starting substrate is patterned into the semiconductor substrate and the first and second fin portions, the first channel layers are respectively patterned into the first channel portions, the first sacrificial layers are respectively patterned into a plurality of first sacrificial portions, the at least one lower channel layer and the at least one upper channel layer are respectively patterned into the at least one lower channel portion and the at least one upper channel portion, the preformed layer is patterned into a preformed portion, and the at least three second sacrificial layers are respectively patterned into at least three second sacrificial portions; replacing the preformed portion with the middle isolation portion; and removing the first sacrificial portions and the at least three second sacrificial portions.

In accordance with some embodiments of the present disclosure, the preformed layer has a thickness greater than that of each of the first channel layers.

In accordance with some embodiments of the present disclosure, the first laminated structure is formed before or after forming the second laminated structure.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a first fin portion and a second fin portion on a semiconductor substrate, the first fin portion and the second fin portion being displaced from each other;

forming a first stack on the first fin portion, the first stack including at least one lower channel portion, at least one upper channel portion, and a middle channel portion which is formed between and spaced apart from the at least one lower channel portion and the at least one upper channel portion;

forming a second stack on the second fin portion, the second stack including at least one lower channel portion, at least one upper channel portion, and a middle isolation portion which is formed between and spaced apart from the at least one lower channel portion and the at least one upper channel portion;

forming two first source/drain portions on the first fin portion, the two first source/drain portions being spaced apart from each other such that each of the at least one lower channel portion, the at least one upper channel portion and the middle channel portion in the first stack extends between the two first source/drain portions;

forming two lower source/drain portions on the second fin portion, the two lower source/drain portions being spaced apart from each other such that the at least one lower channel portion in the second stack extends between the two lower source/drain portions; and forming two upper source/drain portions which are respectively above and spaced apart from the two lower source/drain portions such that the at least one upper channel portion in the second stack extends between the two upper source/drain portions, a first sum of a number of the at least one lower channel portion, a number of the at least one upper channel portion and a number of the middle channel portion in the first stack being greater than a number of the at least one lower channel portion in the second stack and greater than a number of the at least one upper channel portion in the second stack.

2. The method as claimed in claim 1, wherein formation of the first stack and the second stack includes:

forming a first stack unit and a second stack unit respectively on the first fin portion and the second fin portion, each of the first stack unit and the second stack unit including a first set of portions which include the at least one lower channel portion, the at least one upper channel portion and a preformed portion that is disposed between and spaced apart from the at least one lower channel portion and the at least one upper channel portion, and a second set of portions which include at least three sacrificial portions, and which are disposed to alternate with the first set of portions;

replacing the preformed portion in the first stack unit with the middle channel portion;

removing the at least three sacrificial portions in the first stack unit, thereby obtaining the first stack on the first fin portion;

replacing the preformed portion in the second stack unit with the middle isolation portion; and removing the at least three sacrificial portions in the second stack unit, thereby obtaining the second stack on the second fin portion.

3. The method as claimed in claim 2, wherein formation of the first stack unit and the second stack unit includes:

forming a laminated structure on a starting substrate, the laminated structure including a first set of layers which include at least one lower channel layer, at least one upper channel layer and a preformed layer that is disposed between and spaced apart from the at least one lower channel layer and the at least one upper channel layer, and a second set of layers which include at least three sacrificial layers, and which are disposed to alternate with the first set of layers; and performing a patterning process such that the starting substrate is patterned into the semiconductor substrate, the first fin portion and the second fin portion, the at least one lower channel layer, the at least one upper channel layer and the preformed layer are respectively patterned into the at least one lower channel portion, the at least one upper channel portion and the preformed portion in each of the first stack unit and the second stack unit, and the at least three sacrificial layers are respectively patterned into the at least three sacrificial portions in each of the first stack unit and the second stack unit.

4. A method for manufacturing a semiconductor structure, comprising:

forming a first fin portion and a second fin portion on a semiconductor substrate, the first fin portion and the second fin portion being displaced from each other;

forming a first stack on the first fin portion, the first stack including first channel portions spaced apart from each other;

forming a second stack on the second fin portion, the second stack including at least one lower channel portion, at least one upper channel portion and a middle isolation portion which is formed between and spaced apart from the at least one lower channel portion and the at least one upper channel portion;

forming two first source/drain portions on the first fin portion, the two first source/drain portions being spaced apart from each other such that each of the first channel portions extends between the two first source/drain portions;

forming two lower source/drain portions on the second fin portion, the two lower source/drain portions being spaced apart from each other such that the at least one lower channel portion extends between the two lower source/drain portions;

forming two upper source/drain portions which are respectively above and spaced apart from the two lower source/drain portions such that the at least one upper channel portion extends between the two upper source/drain portions; and forming two isolation structures each of which is formed between one of the two lower source/drain portions and a corresponding one of the two upper source/drain portions, a number of the first channel portions being greater than a number of the at least one lower channel portion and greater than a number of the at least one upper channel portion.

5. The method as claimed in claim 4, wherein formation of the first stack and the second stack includes:

forming a first laminated structure on a first region of a starting substrate, the first laminated structure including first channel layers and first sacrificial layers formed to alternate with the first channel layers;

forming a second laminated structure on a second region of the starting substrate, the second laminated structure including a first set of layers which include at least one lower channel layer, at least one upper channel layer and a preformed layer that is disposed between and spaced apart from the at least one lower channel layer and the at least one upper channel layer, and a second set of layers which include at least three second sacrificial layers and which are disposed to alternate with the first set of layers;

performing a patterning process to form two first source/drain recesses in the first lamination structure and two second source/drain recesses in the second lamination structure, such that the starting substrate is patterned into the semiconductor substrate, the first fin portion, and the second fin portion, the first channel layers are respectively patterned into the first channel portions, the first sacrificial layers are respectively patterned into first sacrificial portions, the at least one lower channel layer and the at least one upper channel layer are respectively patterned into the at least one lower channel portion and the at least one upper channel portion, the preformed layer is patterned into a preformed portion, and the at least three second sacrificial layers are respectively patterned into at least three second sacrificial portions;

replacing the preformed portion with the middle isolation portion; and removing the first sacrificial portions and the at least three second sacrificial portions.

6. The method as claimed in claim 5, wherein the preformed layer has a thickness greater than a thickness of each of the first channel layers.

7. The method as claimed in claim 5, wherein the two first source/drain portions are respectively formed in the two first source/drain recesses, each of the two lower source/drain portions is formed in a lower region of a corresponding one of the two second source/drain recesses, and each of the two upper source/drain portions is formed in an upper region of a corresponding one of the two second source/drain recesses.

8. The method as claimed in claim 5, wherein the first channel layers in the first lamination structure, and the at least one lower channel portion and the at least one upper channel portion in the second lamination structure are made of a first semiconductor material, the first sacrificial layers in the first lamination structure, and the at least three second sacrificial layers are made of a second semiconductor material, the preformed layer is made of a third semiconductor material, and the first semiconductor material, the second semiconductor material, and the third semiconductor material have chemical compositions different from one another.

9. The method as claimed in claim 8, wherein an atomic percentage of germanium in the third semiconductor material is greater than an atomic percentage of germanium in the second semiconductor material, and an atomic percentage of germanium in the second semiconductor material is greater than an atomic percentage of germanium in the first semiconductor material.

10. The method as claimed in claim 1, wherein the two first source/drain portions are spaced apart from each other along a first direction, and a length of the middle isolation portion in the first direction is the same as a length of each of the at least one lower channel portion and the at least one upper channel portion in the second stack in the first direction.

11. The method as claimed in claim 10, wherein a thickness of the middle isolation portion in a second direction normal to a top surface of the semiconductor substrate is greater than a thickness of each of the at least one lower channel portion and the at least one upper channel portion in the second stack in the second direction, the second direction being different from the first direction.

12. The method as claimed in claim 10, wherein a thickness of the middle isolation portion in a second direction normal to a top surface of the semiconductor substrate is greater than a thickness of each of the at least one lower channel portion, the at least one upper channel portion and the middle channel portion in the first stack in the second direction, the second direction being different from the first direction.

13. The method as claimed in claim 1, wherein an upper surface of an uppermost one of the at least one upper channel portion in the first stack is flush with an upper surface of an uppermost one of the at least one upper channel portion in the second stack.

14. A method for manufacturing a semiconductor structure, comprising:

forming a first fin portion and a second fin portion on a substrate;

forming an isolation region on the substrate, the first fin portion and the second fin portion being separated from each other by the isolation region;

forming a first stack on the first fin portion, the first stack including first channel portions and first sacrificial portions which are disposed to alternate with the first channel portions;

forming a second stack on the second fin portion, the second stack including a lower channel portion, an upper channel portion, a preformed portion which is disposed between the lower channel portion and the upper channel portion, and second sacrificial portions each of which is disposed between two adjacent ones of the lower channel portion, the upper channel portion, and the preformed portion;

removing the preformed portion in the second stack to form a gap between two corresponding adjacent ones of the second sacrificial portions;

forming a middle isolation portion in the gap;

forming two first source/drain portions on the first fin portion, the two first source/drain portions being spaced apart from each other such that each of the lower channel portion, the upper channel portion and the middle channel portion in the first stack extends between the two first source/drain portions;

forming two lower source/drain portions on the second fin portion, the two lower source/drain portions being spaced apart from each other such that the lower channel portion in the second stack extends between the two lower source/drain portions; and forming two upper source/drain portions which are respectively above and spaced apart from the two lower source/drain portions such that the upper channel portion in the second stack extends between the two upper source/drain portions.

15. The method as claimed in claim 14, further comprising:

after formation of the two lower source/drain portions and before formation of the two upper source/drain portions, forming two isolation structures respectively on the two lower source/drain portions.

16. The method as claimed in claim 15, further comprising:

before formation of the two upper source/drain portions, etching back the two isolation structures to respectively expose two side surfaces of the upper channel portion in the second stack, such that the two upper source/drain portions respectively interface the two side surfaces of the upper channel portion.

17. The method as claimed in claim 15, wherein the two isolation structures are located at two opposite sides of the middle isolation portion, and interface the middle isolation portion.

18. The method as claimed in claim 14, further comprising:

removing the first sacrificial portions in the first stack;

forming a first gate dielectric around the first channel portions in the first stack;

forming a first gate electrode on the first gate dielectric;

removing the second sacrificial portions in the second stack;

forming a second gate dielectric around the lower channel portion, the upper channel portion, and the middle isolation portion in the second stack; and forming a second gate electrode on the second gate dielectric.

19. The method as claimed in claim 18, wherein formation of the second gate electrode includes forming a lower gate part on a lower portion of the second gate dielectric, forming an isolation feature on the lower gate part, and forming an upper gate part on an upper portion of the second gate dielectric and the isolation feature, such that the upper gate part is separated from the lower gate part by the isolation feature.

20. The method as claimed in claim 19, wherein the isolation feature interfaces the second gate dielectric.

* * * * *